(12) United States Patent
Saito et al.

(10) Patent No.: US 7,602,636 B2
(45) Date of Patent: Oct. 13, 2009

(54) SPIN MOSFET

(75) Inventors: Yoshiaki Saito, Kawasaki (JP);
Hideyuki Sugiyama, Yokohama (JP);
Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/771,295

(22) Filed: Jun. 29, 2007

(65) Prior Publication Data
US 2008/0061332 A1 Mar. 13, 2008

(30) Foreign Application Priority Data
Sep. 8, 2006 (JP) ............................. 2006-244656

(51) Int. Cl.
*G11C 11/00* (2006.01)
(52) U.S. Cl. ...................... 365/158; 365/171; 365/173; 257/295
(58) Field of Classification Search ................ 365/159, 365/158, 171, 173; 257/295, 421
See application file for complete search history.

(56) References Cited

U.S. PATENT DOCUMENTS

| 6,256,223 | B1 | 7/2001 | Sun | |
| 7,200,037 | B2 * | 4/2007 | Saito et al. ................... | 365/158 |
| 2005/0282379 | A1 | 12/2005 | Saito et al. | |
| 2007/0115716 | A1 * | 5/2007 | Saito et al. ................... | 365/158 |
| 2007/0164336 | A1 * | 7/2007 | Saito et al. ................... | 257/295 |
| 2008/0061332 | A1 | 3/2008 | Saito et al. | |
| 2008/0239930 | A1 * | 10/2008 | Saito et al. ................... | 369/126 |

FOREIGN PATENT DOCUMENTS

| JP | 2004-207707 | 7/2004 |
| JP | 2006-32915 | 2/2006 |
| KR | 10-0619300 | 9/2006 |

OTHER PUBLICATIONS

U.S. Appl. No. 11/610,100, filed Dec. 13, 2006, Yoshiaki Saito et al.
Satoshi Sugahara et al., "A spin metal-oxide-semiconductor field-effect transistor using half-metallic-ferromagnet contacts for the source and drain", Applied Physics Letters, vol. 84, No. 13, Mar. 29, 2004, pp. 2307-2309.

(Continued)

*Primary Examiner*—Tuan T Nguyen
*Assistant Examiner*—Hien N Nguyen
(74) *Attorney, Agent, or Firm*—Oblon, Spivak, McClelland, Maier & Neustadt, P.C.

(57) ABSTRACT

A spin MOSFET includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer being a tunnel insulator and provided on the magnetization free layer, and a magnetization pinned layer provided on the first nonmagnetic layer, a magnetization direction of the magnetization free layer being changeable and a magnetization direction of the magnetization pinned layer being fixed; a gate insulating film provided at least on the semiconductor substrate between the first magnetic film and the second magnetic film; and a gate electrode formed on the gate insulating film.

58 Claims, 33 Drawing Sheets

OTHER PUBLICATIONS

U.S. Appl. No. 12/234,082, filed Sep. 19, 2008, Tsuchiaki, et al.
U.S. Appl. No. 12/197,710, filed Aug. 25, 2008, Saito, et al.
Satoshi Sugahara, "Spin Transistors for Integrated Spin-electronics," The Transactions of the Institute of Electronics, Information and Communication Engineers, vol. 88, No. 7, pp. 541-550, 2005.
Junsaku Nitta, "Semiconductor Spintronics," NTT Technical Journal, Japan, Nippon Telegraph and Telephone Corporation, pp. 66-69, Mar. 2005.
S. Sugahara, "Spin metal-oxide-semiconductor field-effect transistors (spin MOSFETs) for integrated spin electronics," IEE Proceedings - Circuits, Devices & Systems, vol. 152, No. 4, pp. 355-365, Aug. 2005.
D. Chiba et al, "Magnetization vector manipulation by electric fields," Nature, vol. 455, pp. 515-518, Sep. 25, 2008.

* cited by examiner

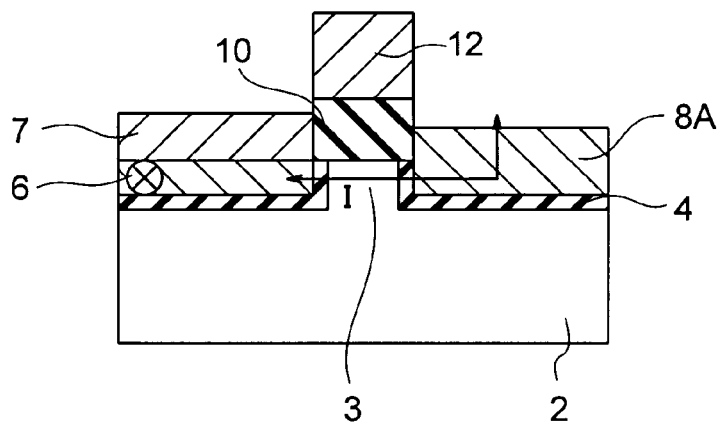
FIG. 19
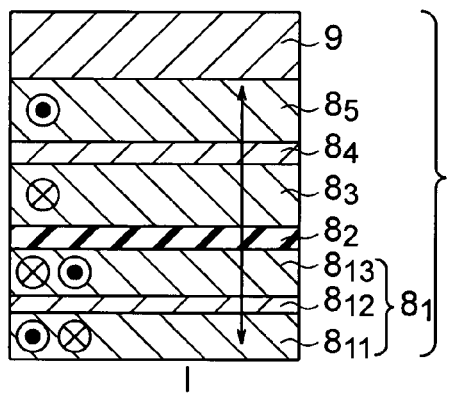 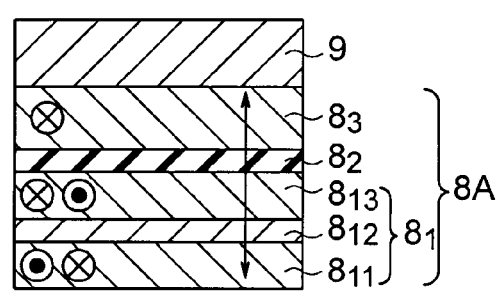
FIG. 20A          FIG. 20B
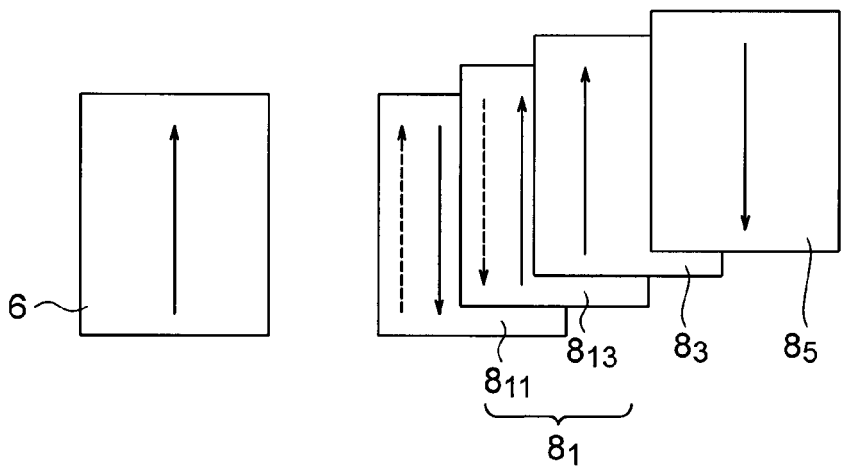
FIG. 21

AND(MOSFET32;AP STATE)

| A | B | $V_{fg}$ | $V_1$ | $V_{out}$ |
|---|---|---|---|---|
| 0 | 0 | 0 | 1 | 0 |
| 1 | 0 | 1/2 | ~1 | 0 |
| 0 | 1 | | ~1 | 0 |
| 1 | 1 | 1 | 0 | 1 |

FIG. 45

OR(MOSFET32;P STATE)

| A | B | $V_{fg}$ | $V_1$ | $V_{out}$ |
|---|---|---|---|---|
| 0 | 0 | 0 | 1 | 0 |
| 1 | 0 | 1/2 | ~0 | 1 |
| 0 | 1 | | ~0 | 1 |
| 1 | 1 | 1 | 0 | 1 |

FIG. 46 n-TYPE SPIN MOSFET p-TYPE SPIN MOSFET

SPIN MOSFET

CROSS-REFERENCE TO RELATED APPLICATION

This application is based upon and claims the benefit of priority from prior Japanese Patent Application No. 2006-244656 filed on Sep. 8, 2006 in Japan, the entire contents of which are incorporated herein by reference.

BACKGROUND OF THE INVENTION

1. Field of the Invention

The present invention relates to spin MOSFETs.

2. Related Art

In recent years, intensive studies are being made to develop devices such as spin MOSFETs having novel functions. One of those devices is a spin MOSFET that has the source-drain region formed with a magnetic material. Such a spin MOSFET is characterized in that the output characteristics can be controlled simply by reversing the spin moment direction of the magnetic material of the source-drain region. This feature can be utilized to form spin MOSFETs that have amplifying functions as well as reconfigurable functions, and to form a reconfigurable logic circuit with those spin MOSFETs.

To put such spin MOSFETs and a reconfigurable logic circuit having amplifying functions as well as reconfigurable functions into practical use, it is necessary to overcome the following two problems.

One of the two problems is to be eliminated by reducing the current when writing is performed and the spin moment direction of the magnetic material of the source-drain region is reversed, and the other one is to be eliminated by increasing the change in output characteristics observed when the spin moment direction is reversed.

To solve the first one of the problems, a writing method utilizing spin injection has been suggested (see the specification of U.S. Pat. No. 6,256,223, for example). A spin reversal can be performed by spin-injecting a spin-polarized current. However, in a case where this spin injecting technique is applied to a spin tunnel device, a problem of a defective device is caused by breakdown of the tunnel insulating film, for example. This reduces the reliability of the device. Also, to maintain reasonable scalability, which is an ultimate objective, a spin injection reversal should be performed at a low current density in a structure that is not affected by a heat fluctuation when the structure is made smaller.

Therefore, it is necessary to provide a spin memory that maintains a low current density so as not to cause breaking of the device at the time of writing by the spin injecting technique, exhibits high resistance to heat fluctuations, and performs a spin reversal at a low current density.

To solve the second problem, the use of a half-metal material for the magnetic material has been suggested (see APL 84 (2004) 2307, for example). Where such a half-metal material is employed, a sufficient output difference is not achieved, and a larger increase in the output difference is expected.

As described above, a spin MOSFET structure that performs a spin reversal at a low current density and achieves large output characteristics through the spin reversal has not been produced yet.

SUMMARY OF THE INVENTION

The present invention has been made in view of these circumstances, and an object thereof is to provide a spin MOSFET that performs a spin reversal at a low current density and achieves large output characteristics through the spin reversal.

A spin MOSFET according to a first aspect of the present invention includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer being a tunnel insulator and provided on the magnetization free layer, and a magnetization pinned layer provided on the first nonmagnetic layer, a magnetization direction of the magnetization free layer being changeable and a magnetization direction of the magnetization pinned layer being fixed; a gate insulating film provided at least on the semiconductor substrate between the first magnetic film and the second magnetic film; and a gate electrode formed on the gate insulating film.

A spin MOSFET according to a second aspect of the present invention includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer provided on the magnetization free layer, and a magnetization pinned layer provided on the first nonmagnetic layer, a magnetization direction of the magnetization free layer being changeable and a magnetization direction of the magnetization pinned layer being pinned and antiparallel to the magnetization direction of the first ferromagnetic layer; a gate insulating film provided at least on the semiconductor substrate between the first magnetic film and the second magnetic film; and a gate electrode formed on the gate insulating film, a gate voltage that causes a negative magnetoresistance effect being applied when writing is performed, a gate voltage that causes a positive magnetoresistance effect being applied when reading is performed.

A spin MOSFET according to a third aspect of the present invention includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer provided on the magnetization free layer, and a magnetization pinned layer provided on the first nonmagnetic layer, a magnetization direction of the magnetization free layer being changeable and a magnetization direction of the magnetization pinned layer being pinned and parallel to the magnetization direction of the first ferromagnetic layer; a gate insulating film provided at least on the semiconductor substrate between the first magnetic film and the second magnetic film; and a gate electrode formed on the gate insulating film, a gate voltage that causes a positive magnetoresistance effect being applied when writing is performed, a gate voltage that causes a negative magnetoresistance effect being applied when reading is performed.

A spin MOSFET according to a fourth aspect of the present invention includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer provided on the magnetization free layer, and a magnetization pinned layer provided on the first nonmagnetic layer, a magnetization direction of the magnetization free layer being changeable, the magnetization free layer including a stacked structure containing a second ferromagnetic layer, a second nonmagnetic layer, and a third ferromagnetic layer, the second and third ferromagnetic layers being antiferromagnetically coupled to each other, and a magnetization direction of the magnetization pinned layer being pinned and antiparallel to the magnetization direction of the first ferromagnetic layer; a gate insulating film provided at least on the semiconductor substrate between the first magnetic film and the second magnetic film; and a gate electrode formed on the gate insulating film, a gate voltage that causes a negative magnetoresistance effect being applied when writing is performed, a gate voltage that causes a negative magnetoresistance effect being applied when reading is performed.

A spin MOSFET according to a fifth aspect of the present invention includes: a semiconductor substrate; a first magnetic film formed on the semiconductor substrate and including a first ferromagnetic layer, a magnetization direction of the first ferromagnetic layer being pinned; a second magnetic film formed on the semiconductor substrate to separate from the first magnetic film and including a magnetization free layer, a first nonmagnetic layer provided on the magnetization free layer, and a magnetization pinned layer provided on the first nonmagnetic layer, a magnetization direction of the magnetization free layer being changeable, the magnetization free layer including a stacked structure containing a second ferromagnetic layer, a second nonmagnetic layer, and a third ferromagnetic layer, the second and third ferromagnetic layers being antiferromagnetically coupled to each other, and a magnetization direction of the magnetization pinned layer being pinned and parallel to the magnetization direction of the first ferromagnetic layer; a gate insulating film provided at least on the semiconductor substrate between the first magnetic film and the second magnetic film; and a gate electrode formed on the gate insulating film, a gate voltage that causes a positive magnetoresistance effect being applied when writing is performed, a gate voltage that causes a positive magnetoresistance effect being applied when reading is performed.

A spin MOSFET according to a sixth aspect of the present invention includes: a semiconductor substrate; a first magnetic film formed on the semiconductor substrate and including a first ferromagnetic layer containing a first half-metal ferromagnetic layer, and a second ferromagnetic layer that is provided on the first ferromagnetic layer and contains a CoFe layer, a magnetization direction of the first half-metal ferromagnetic layer being pinned; a first antiferromagnetic layer provided on the second ferromagnetic layer of the first magnetic film; a second magnetic film formed on the semiconductor substrate to separate from the first magnetic film and including a magnetization free layer containing a second half-metal ferromagnetic layer, a tunnel insulating layer provided on the magnetization free layer, a magnetization pinned layer provided on the tunnel insulating layer, a third ferromagnetic layer provided on the magnetization pinned layer and containing a CoFe layer, and a second antiferromagnetic layer provided on the third ferromagnetic layer, a magnetization direction of the second half-metal ferromagnetic layer being changeable, and a magnetization direction of the magnetization pinned layer being pinned; a gate insulating film provided at least on the semiconductor substrate between the first magnetic film and the second magnetic film; and a gate electrode formed on the gate insulating film.

BRIEF DESCRIPTION OF THE DRAWINGS

FIG. 19 is a cross-sectional view of a spin MOSFET in accordance with a ninth embodiment;

FIGS. 20A and 20B are cross-sectional views showing example structures of the second magnetic film of the spin MOSFET in accordance with the ninth embodiment;

FIG. 21 shows the magnetization directions of the ferromagnetic layers of the first and second magnetic films of the spin MOSFET in accordance with the ninth embodiment;

FIG. 45 shows a logical table that is used where the logic circuit of the eighteenth embodiment functions as an AND circuit;

FIG. 46 shows a logical table that is used where the logic circuit of the eighteenth embodiment functions as an OR circuit;

DETAILED DESCRIPTION OF THE INVENTION

First, before describing the embodiment of the present invention, the course of events for achieving the present invention will be described below.

Figure 1:
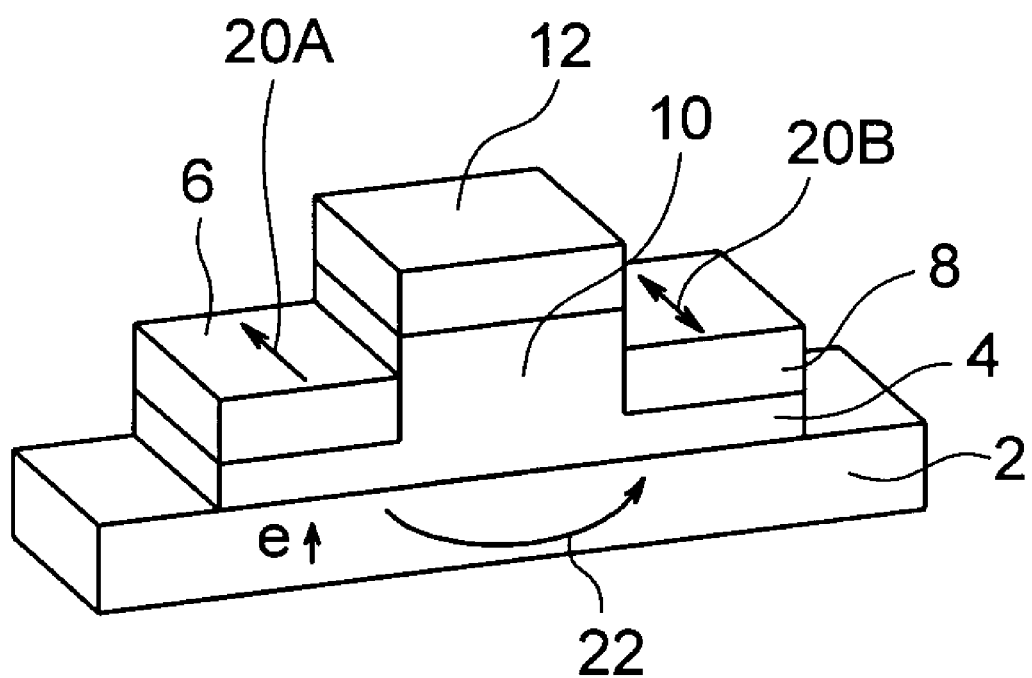
FIG. 1 is a perspective view of a spin MOSFET in accordance with an embodiment of the present invention.

The inventors produced a spin MOSFET shown in FIG. 1 as a test sample. In this spin MOSFET, a pair of tunnel insulating films 4 is formed on an n-type silicon substrate 2. The tunnel insulating films 4 are made of MgO and are separated from each other. A first magnetic film 6 including a CoFeB magnetic layer in which a magnetization direction 20A is pinned is formed on one of the tunnel insulating films 4. A second magnetic film 8 including a CoFeB magnetic layer (a magnetization free layer) in which a magnetization direction 20B is changeable is formed on the other one of the tunnel insulating films 4. A gate insulating film 10 made of MgO is formed on the portion of the silicon substrate 2 located between the pair of the tunnel insulating films 4, and a gate electrode 12 made of CoFeB is formed on the gate insulating film 10. In this spin MOSFET, one of the first magnetic film 6 and the second magnetic film 8 serves as the source, and the other one serves as the drain. When a gate voltage is applied to the gate electrode 12, a spin-polarized current 22 flows from the source to the drain.

Figures 2A, 2B, 2C:
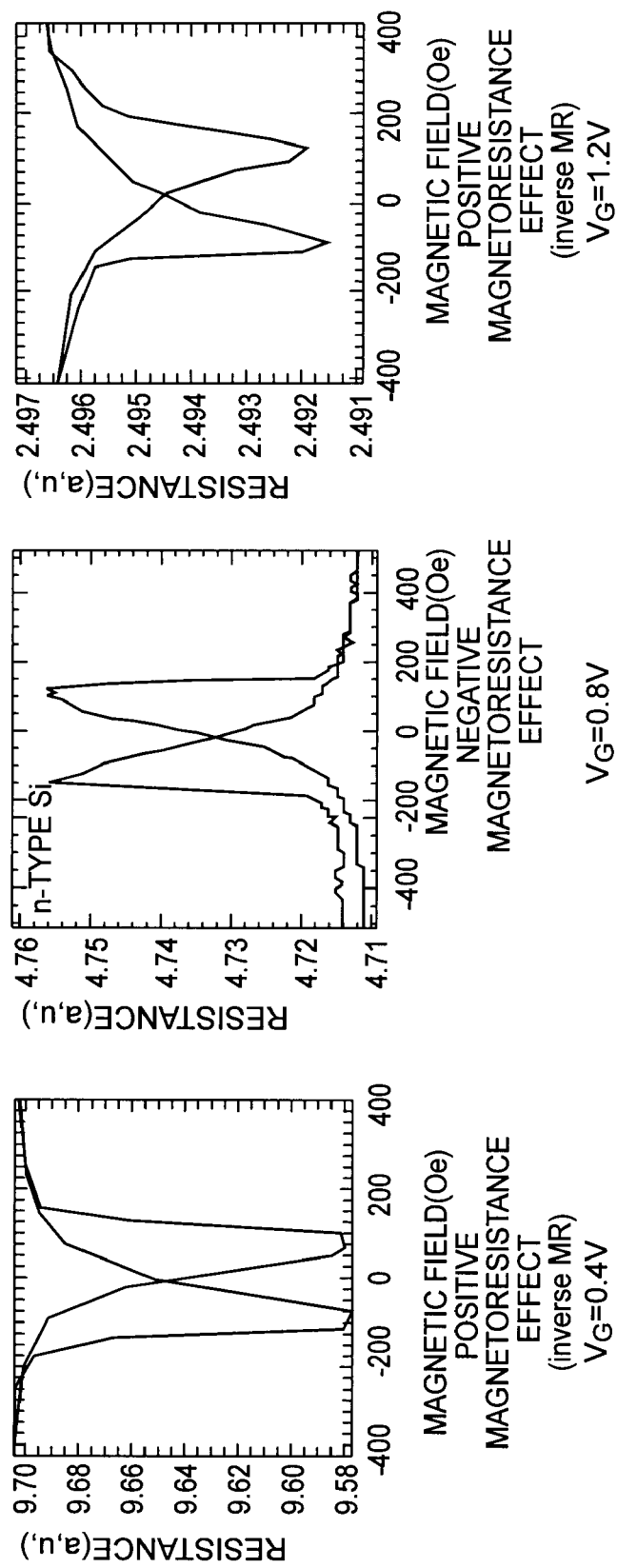
FIGS. 2A through 2C show the spin dependence conduction via the channel region when the gate voltage of the spin MOSFET shown in FIG. 1 is varied.

FIGS. 2A, 2B, and 2C show the results obtained when gate voltages of 0.4 V, 0.8 V, and 1.2 V were applied to the spin MOSFET as a test sample, and the ratio of the magnetoresistance change between the source and drain were measured. This measurement was carried out at room temperature, and the gate length L of the MOSFET was 25 μm. In each of FIGS.

2A, 2B, and 2C, the abscissa axis indicates the external magnetic field, and the ordinate axis indicates the resistance observed between the source and drain. When the gate voltage Vg of 0.4 V was applied to the spin MOSFET, a positive magnetoresistance effect was observed (FIG. 2A). When the gate voltage Vg of 0.8 V was applied to the spin MOSFET, a negative magnetoresistance effect was observed (FIG. 2B). When the gate voltage Vg of 1.2 V was applied to the spin MOSFET, a positive magnetoresistance effect was observed (FIG. 2C). Those results imply that the sign of the magnetoresistance change varies with the size of the gate voltage Vg. This phenomenon shows that the electron spins injected into a semiconductor are rotated due to a spin orbit interaction, but the rotation can be controlled by adjusting the gate voltage. Based on this finding, the inventors developed the spin MOSFETs of the following embodiments of the present invention. When a positive magnetoresistance effect is observed, the spin direction of spin-polarized electrons injected to a semiconductor (channel) from one of the source and drain is reversed 180 degrees while the electrons are passing through the semiconductor (channel), and the electrons then reach the other one of the source and drain. When a negative magnetoresistance effect is observed, the spin direction of spin-polarized electrons injected to the channel from one of the source and drain is not reversed, and the electrons reach the other one of the source and drain.

First Embodiment

Figure 3:
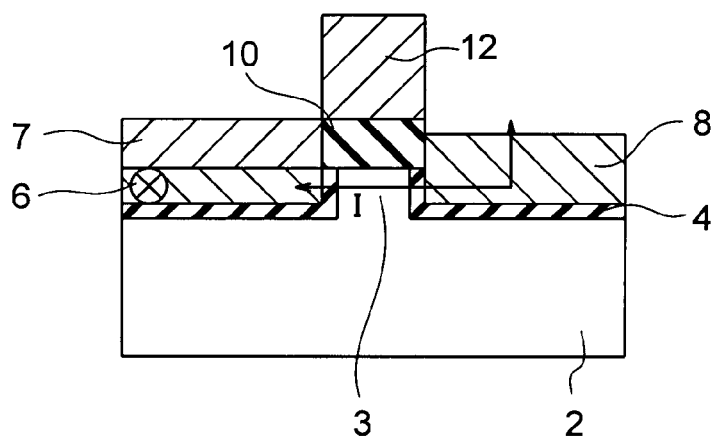
FIG. 3 is a cross-sectional view of a spin MOSFET in accordance with a first embodiment.

FIG. 3 is a cross-sectional view of a spin MOSFET in accordance with a first embodiment of the present invention. The spin MOSFET of this embodiment has a semiconductor substrate 2 made of silicon, for example, and a first magnetic film 6 and a second magnetic film 8 arranged at a distance from each other on the semiconductor substrate 2. The first magnetic film 6 in which a magnetization direction is pinned serves as a source or a drain. The second magnetic film 8 in which a magnetization direction is changeable serves as a source or a drain. A tunnel insulating film 4 is formed in the junction plane between the semiconductor substrate 2 and the first and second magnetic films 6 and 8. A gate insulating film 10 is formed on a region 3 (a channel region 3) of the semiconductor substrate 2 between the first and second magnetic films 6 and 8. A gate electrode 12 is formed on the gate insulating film 10. An antiferromagnetic layer 7 that pins the magnetization direction of the first magnetic film 6 is formed on the first magnetic film 6. In FIG. 3, I indicates the spin injection current.

Figure 4A:
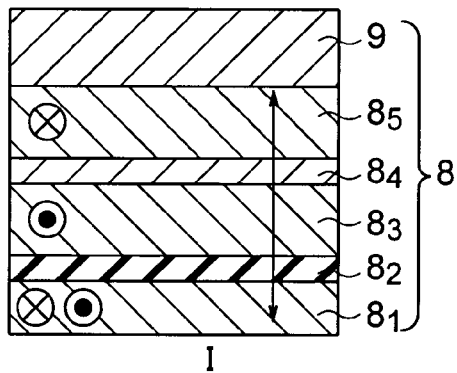
FIGS. 4A and 4B are cross-sectional views showing example structures of the second magnetic film of the spin MOSFET in accordance with the first embodiment.

In this embodiment, the first magnetic film 6 is formed with a single-layer ferromagnetic layer, and the second magnetic film 8 is formed with a stacked structure that has ferromagnetic layers and nonmagnetic layers alternately stacked. FIG. 4A shows the structure of a first specific example of the second magnetic film 8. The second magnetic film 8 of this first specific example has a ferromagnetic layer (a magnetization free layer) $8_1$ in which a magnetization direction is changeable, a nonmagnetic layer $8_2$, a ferromagnetic layer $8_3$ in which a magnetization direction is pinned, a nonmagnetic layer $8_4$, a ferromagnetic layer $8_5$ in which a magnetization direction is pinned, and an antiferromagnetic layer 9 that are stacked in this order. In this first specific example, the ferromagnetic layer $8_3$, the nonmagnetic layer $8_4$, and the ferromagnetic layer $8_5$ form a synthetic magnetization pinned layer. This magnetization pinned layer has the magnetization of which a direction is pinned by virtue of the antiferromagnetic layer 9. The ferromagnetic layer $8_3$ and the nonmagnetic layer $8_5$ are antiferromagnetically coupled to each other via the nonmagnetic layer $8_4$. In this case, the synthetic magnetization pinned layer is more firmly pinned, so that excellent device stability can be achieved. In a spin MOSFET having the first specific example structure as the second magnetic film 8, the antiferromagnetic layer 7 and the antiferromagnetic layer 9 may be made of the same material, and the magnetization directions of the ferromagnetic layer of the first magnetic film 6 and the ferromagnetic layers $8_3$ and $8_5$ of the second magnetic film 8 can be pinned simply through the annealing performed for pinning magnetization directions.

Figure 4B:
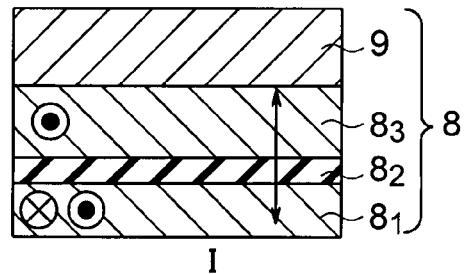

FIG. 4B shows the structure of a second specific example of the second magnetic film 8. The second magnetic film 8 of this second specific example has a ferromagnetic layer (a magnetization free layer) $8_1$ in which a magnetization direction is changeable, a nonmagnetic layer $8_2$, a ferromagnetic layer $8_3$ in which a magnetization direction is pinned, and an antiferromagnetic layer 9 that are stacked in this order. In a spin MOSFET having the second specific example structure as the second magnetic film 8, the antiferromagnetic layer 7 and the antiferromagnetic layer 9 need to be made of different materials from each other, and the magnetic field needs to be reversed 180 degrees through the annealing performed for pinning magnetization directions.

Figure 5:
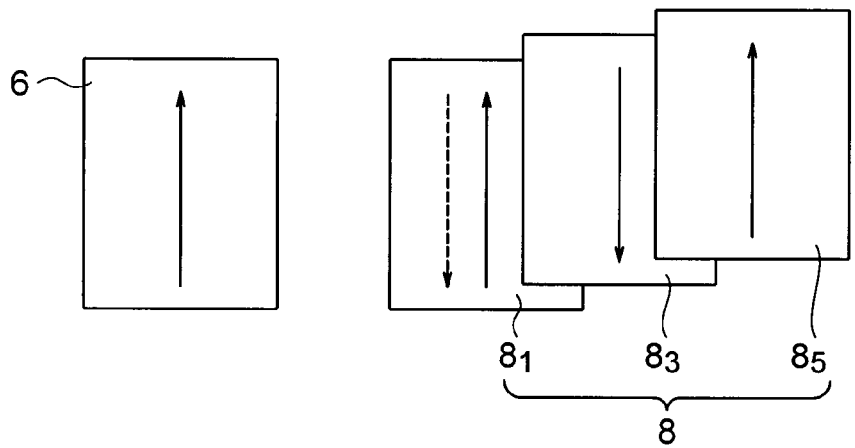
FIG. 5 shows the magnetization directions of the ferromagnetic layers of the first and second magnetic films of the spin MOSFET in accordance with the first embodiment.

FIG. 5 shows the magnetization (spin) directions of the ferromagnetic layer of the first magnetic layer 6 and the ferromagnetic layers $8_1$, $8_3$, and $8_5$ of the second magnetic film 8 in a case where the first specific example structure shown in FIG. 4A is employed as the second magnetic film 8. In this example, the magnetization direction of the first magnetic film 6 is opposite (antiparallel) to the magnetization directions of the ferromagnetic layers $8_3$ and $8_5$ of the magnetization pinned layer. In this specification, the magnetization direction of the magnetization pinned layer is the magnetization direction of the ferromagnetic layer closest to the magnetization free layer (the ferromagnetic layer $8_3$ in this example), and the magnetization direction of the first magnetic film 6 is the magnetization direction of the ferromagnetic layer in which electrons flow into the channel 3. However, in a case where the first magnetic film 6 is formed with two or more staked ferromagnetic layers constituting a multilayer structure, the magnetization direction of the first magnetic film 6 is the magnetization direction of the ferromagnetic layer that is the lowermost layer of the first magnetic film 6 and is closest to the semiconductor substrate 2 (for example, the ferromagnetic layer $6_1$ in the later described second embodiment).

In a spin MOSFET of this embodiment, a gate voltage that causes the negative magnetoresistance effect shown in FIG. 2B is used for writing. In other words, a gate voltage that does not cause a change in the spin direction of spin-polarized electrons when the electrons are passing through the channel 3 is used. In this embodiment, the magnetization direction of the ferromagnetic layer $8_3$ has the spin arrangement shown in FIG. 5, or the spin arrangement opposite (antiparallel) to the magnetization direction of the ferromagnetic layer serving as the magnetization pinned layer of the first magnetic film 6. Accordingly, in a case where the spin direction of the ferromagnetic layer $8_1$ serving as a magnetization free layer extends antiparallel to the spin direction of the first magnetic film 6, spin-polarized electrons are injected into the channel 3 from the first magnetic film 6, so that the spin direction of the spin-polarized electrons is not changed when the spin-polarized electrons are passing through the channel 3, and the spin-polarized electrons reach the ferromagnetic layer $8_1$. In this manner, the spin torque is applied onto the ferromagnetic layer $8_1$. Further, the electrons having passed through the ferromagnetic layer $8_1$ are reflected by the ferromagnetic layer $8_3$ and flow back into the ferromagnetic layer $8_1$. Accordingly, the spin torque is doubly applied onto the ferromagnetic layer $8_1$ serving as a magnetization free layer, and the inversion current density at the time of a magnetization reversal caused by the spin injection can be reduced. Meanwhile, in a case where the spin direction of the ferromagnetic layer $8_1$ serving as a magnetization free layer extends parallel to the spin direction of the first magnetic film 6, spin-polarized electrons are injected from the ferromagnetic layer $8_3$ into the channel 3 via the ferromagnetic layer $8_1$ serving as a magnetization free layer, so that the electrons spin-polarized by the ferromagnetic layer $8_3$ reach the ferromagnetic layer $8_1$ serving as a magnetization free layer, and the spin torque is applied onto the ferromagnetic layer $8_1$. Further, the electrons having passed through the ferromagnetic layer $8_1$ reach the ferromagnetic layer 6, without a change caused in the spin direction when the electrons are passing through the channel 3. The spin-polarized electrons are then reflected by the ferromagnetic layer 6. The reflected electrons then reach the ferromagnetic layer $8_1$, without a change caused in the spin direction when the electrons are passing through the channel 3. Accordingly, the spin torque is doubly applied onto the ferromagnetic layer $8_1$ serving as a magnetization free layer, and the inversion current density at the time of the magnetization reversal caused by the spin injection can be reduced. Thus, with the use of a gate voltage that causes a negative magnetoresistance effect at the time of writing, the spin torque is doubly applied to the ferromagnetic layer $8_1$ serving as a magnetization free layer, and the inversion current density at the time of the magnetization reversal caused by the spin injection can be reduced.

When reading is performed, a gate voltage that causes the positive magnetoresistance effect shown in FIG. 2A is used. In other words, a gate voltage that changes the spin direction of the electrons 180 degrees when the electrons are passing through the channel 3 is used. When reading is performed with the use of the gate voltage in the spin arrangement shown in FIG. 5, the spin direction of electrons passing through the channel 3 is rotated 180 degrees. Accordingly, in a case where the spin direction of the ferromagnetic layer $8_1$ serving as a magnetization free layer extends parallel to the spin direction of the first magnetic film 6, the resistance of the channel 3 is higher than in a case where the spin direction of the electrons passing through the channel 3 is not rotated 180 degrees (where a gate voltage that causes a negative magnetoresistance effect is used). Here, the magnetization direction of the ferromagnetic layer $8_1$ extends antiparallel to the magnetization direction of the ferromagnetic layer $8_3$. Accordingly, the resistance between the ferromagnetic layers $8_1$ and $8_3$ is higher than in a case where the magnetization direction of the ferromagnetic layer $8_1$ extends parallel to the magnetization direction of the ferromagnetic layer $8_3$.

Meanwhile, in a case where the spin direction of the ferromagnetic layer $8_1$ serving as a magnetization free layer extends antiparallel to the spin direction of the first magnetic film 6, the resistance of the channel 3 is lower than in a case where the spin direction of the electrons passing through the channel 3 is not rotated 180 degrees (where a gate voltage that causes a negative magnetoresistance effect is used). Here, the magnetization direction of the ferromagnetic layer $8_1$ extends parallel to the magnetization direction of the ferromagnetic layer $8_3$. Accordingly, the resistance between the ferromagnetic layers $8_1$ and $8_3$ is lower than in a case where the magnetization direction of the ferromagnetic layer $8_1$ extends antiparallel to the magnetization direction of the ferromagnetic layer $8_3$.

As described above, as a gate voltage that causes a positive magnetoresistance effect is used for reading in this embodiment, the difference between the resistance of the channel 3 and the total resistance between the ferromagnetic layers $8_1$ and $8_3$ in a case where the magnetization direction of the ferromagnetic layer $8_1$ serving as a magnetization free layer is changed is larger than in a case where a gate voltage that causes a negative magnetoresistance effect is used. The rate of magnetoresistance change of the multilayer structure is added to the rate of magnetoresistance change through the channel region 3. Accordingly, the reading output is greatly increased.

Since the gate voltages suitable for writing and reading vary with the kind of the substrate and the dope amount for the substrate, it is necessary to adjust the gate voltages when necessary. However, as long as the same type of substrate is used and the dope amount for the substrate is made constant, the gate voltages also become constant. In this embodiment, the tunnel insulating film 4 is provided between the semiconductor substrate 2 and the first and second magnetic films 6 and 8. Accordingly, diffusion of the semiconductor and the magnetic materials can be prevented, and a rate of magnetoresistance change through the channel region 3 can be observed at room temperature, as shown in FIGS. 2A, 2B, and 2C, even if materials having low resistance are used for the magnetic materials. Thus, better characteristics can be achieved.

As described above, this embodiment provides a spin MOSFET that performs a spin reversal at a low current density and achieves large output characteristics through the spin reversal.

In this embodiment, the magnetic materials for the ferromagnetic layers of the first and second magnetic films are not particularly limited. It is possible to employ thin films made of at least one material selected from the group consisting of Ni—Fe alloys, Co—Fe alloys, Co—Fe—Ni alloys, amorphous materials such as (Co, Fe)—(B), (Co, Fe, Ni)—(B), (Co, Fe, Ni)—(B)—(P, Al, Mo, Nb, Mn) based or Co—(Zr, Hf, Nb, Ta, Ti) based alloys, Huesler materials such as Co—Cr—Fe—Al based, Co—Cr—Fe—Si based, Co—Mn—Si based, and Co—Mn—Al based alloys, thin films made of half-metal materials such as $Fe_3Si$ based alloys produced through solid-phase diffusion of Fe and Si, or multilayer films formed with any of those thin films.

In a later described Schottky spin MOSFET not having the tunnel insulating film 4, the magnetic materials of the ferromagnetic layers should preferably have high resistance. Accordingly, the ferromagnetic layers should preferably be formed with thin films made of at least one material selected from the group consisting of amorphous materials such as (Co, Fe)—(B), (Co, Fe, Ni)—(B), (Co, Fe, Ni)—(B)—(P, Al, Mo, Nb, Mn) based or Co—(Zr, Hf, Nb, Ta, Ti) based alloys, and Heusler materials such as Co—Cr—Fe—Al based, Co—Cr—Fe—Si based, Co—Mn—Si based, and Co—Mn—Al based alloys, or half-metal materials such as $Fe_3Si$ based alloys produced through solid-phase diffusion of Fe and Si.

The magnetization pinned layer should preferably have unidirectional anisotropy, and the magnetization free layer should preferably have uniaxial anisotropy. The thickness of each of those layers should preferably be in the range of 0.1 nm to 100 nm. Furthermore, the film thickness of each of those ferromagnetic layers needs to be so large as not to have super paramagnetism, and should preferably be 0.4 nm or larger.

The magnetic characteristics of those magnetic materials can be adjusted by adding thereto a nonmagnetic element such as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium). Also, other physical properties such as crystallinity, mechanical properties, and chemical properties can be adjusted. Particularly, the ferromagnetic layer close to the tunnel insulating film should preferably be made of Co—Fe, Co—Fe—Ni, Fe-rich Ni—Fe, or the like, which has high MR (magnetoresistance). The ferromagnetic layers that are not in contact with the tunnel insulating film should preferably be made of Ni-rich Ni—Fe, Ni-rich Ni—Fe—Co, or the like. With this arrangement, the switching magnetic field can be reduced, while the high MR is maintained.

The material for the nonmagnetic layer $8_2$ may be made of a metal element such as Cu, Ag, or Au, or an alloy containing those metals, or an oxide such as AlOx or MgO. It is particularly preferable to use an oxide tunnel insulating film made of $Al_2O_3$ (aluminum oxide) or MgO (magnesium oxide). With this arrangement, the output at the time of reading becomes larger.

In a case where the nonmagnetic layer $8_2$ is formed with a tunnel insulating film, the insulating layer (or a dielectric layer) provided between the magnetization pinned layer 6 and the magnetization free layer $8_1$ may be formed with an insulator (a dielectric) such as $SiO_2$ (silicon oxide), AlN (aluminum nitride), $Bi_2O_3$ (bismuth oxide), $MgF_2$ (magnesium fluoride), $CaF_2$ (calcium fluoride), $SrTiO_2$ (strontium titanium oxide), $AlLaO_3$ (aluminum lanthanum oxide), or Al—N—O (aluminum oxynitride).

Those compounds may not necessarily be precise compositions in terms of stoichiometry, but may be devoid of oxygen, nitrogen, or fluorine, or may have oxygen, nitrogen or fluorine overages or shortages. Also, the thickness of this insulating layer (the dielectric layer) is preferably so small as to allow a tunnel current to flow, but should preferably be 10 nm or less in practice.

The nonmagnetic layer $8_4$ is preferably made of Ru, Rh, or Ir, or an alloy of those materials. With the use of those materials, the magnetization of the magnetization pinned layers $8_3$, $8_4$, and $8_5$ can be stably fixed.

More specifically, to fix the ferromagnetic layers in one direction, it is preferable to use a stacked film having a three-layer structure consisting of Co(Co—Fe)/Ru (ruthenium)/Co (Co—Fe), a stacked film having a three-layer structure consisting of Co(Co—Fe)/Ir (iridium)/Co(Co—Fe), a stacked film having a three-layer structure consisting of Co(Co—Fe)/Os (osmium)/Co(Co—Fe), a laminated film having a three-layer structure consisting of Co(Co—Fe)/Re (rhenium)/Co (Co—Fe), a stacked film having a three-layer structure consisting of an amorphous material layer such as a Co—Fe—B layer, a Ru (ruthenium) layer, and a Co—Fe layer, a stacked film having a three-layer structure consisting of an amorphous material layer such as a Co—Fe—B layer, an Ir (iridium) layer, and a Co—Fe layer, a stacked film having a three-layer structure consisting of an amorphous material layer such as a Co—Fe—B layer, an Os (osmium) layer, and a Co—Fe layer, or a stacked film having a three-layer structure consisting of an amorphous material layer such as a Co—Fe—B layer, a Re (rhenium) layer, and a Co—Fe layer. In a case where those stacked films are used for the magnetization pinned layer, it is desirable to provide an antiferromagnetic layer in contact with the stacked films. Such an antiferromagnetic layer may be formed with Fe—Mn, Pt—Mn, Pt—Cr—Mn, Ni—Mn, Ir—Mn, NiO, $Fe_2O_3$, or the like, as described above. With this structure, the magnetization of the magnetization pinned layer cannot be easily affected by a magnetic field induced by a current from the bit lines or the word lines, and is firmly secured. Also, the stray field from the magnetization pinned layers can be reduced (or adjusted), and the magnetization shift of the magnetization free layer can be controlled by changing the film thickness of the two ferromagnetic layers constituting the magnetization pinned layer. The film thickness of each of those ferromagnetic layers needs to be so large as not to cause super paramagnetism, and should preferably be 0.4 nm or larger. As for the nonmagnetic material, it is possible to employ Rh (rhodium), Ru (ruthenium), Os (osmium), Re (Rhenium), or Ir (iridium), or an alloy of those materials.

As for the magnetization free layer, the magnetic characteristics of the magnetic material can be adjusted by adding thereto a nonmagnetic element such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium).

Also, other physical properties such as crystallinity, mechanical properties, and chemical properties can be adjusted.

Also, the antiferromagnetic film may be formed with PtMn, Ir—Mn, FeMn, Pt—Cr—Mn, or Ni—Mn.

The tunnel insulating film 4 may be formed with an oxide such as $Al_2O_3$ (aluminum oxide) or MgO (magnesium oxide). Particularly, in a case where the tunnel insulating film 4 is formed with MgO, the magnetic layers 6 and $8_1$ to be formed on the tunnel insulating film 4 can be epitaxially grown, and excellent magnetic characteristics can be achieved.

The semiconductor substrate 2 may be a substrate formed with a semiconductor such as Si or Ge, or a compound semiconductor such as GaAs or ZnSe. It is also possible to employ a substrate that has a surface formed with a IV group semiconductor such as Si or Ge, or a III-V or II-VI group compound semiconductor such as GaAs or ZnSe.

Second Embodiment

Figure 6:
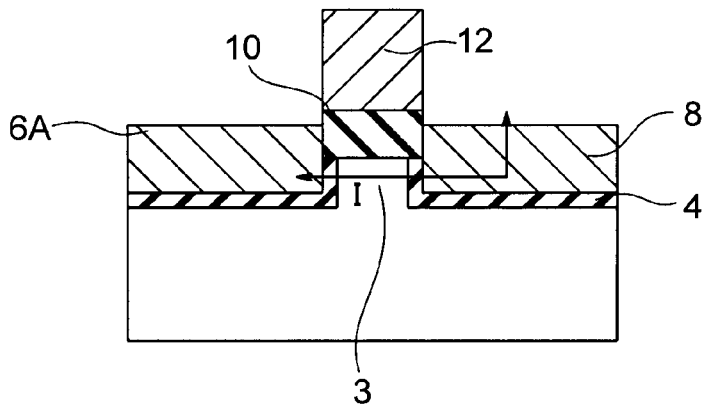
FIG. 6 is a cross-sectional view of a spin MOSFET in accordance with a second embodiment.

FIG. 6 is a cross-sectional view of a spin MOSFET in accordance with a second embodiment of the present invention.

Figure 7A:
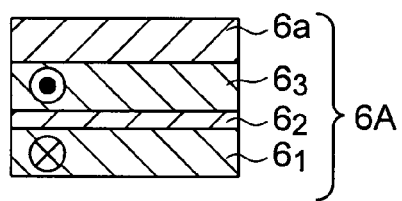
FIGS. 7A through 7D are cross-sectional views showing example structures of the first and second magnetic films of the spin MOSFET in accordance with the second embodiment.

The spin MOSFET of this embodiment is the same as the spin MOSFET of the first embodiment shown in FIG. 3, except that the antiferromagnetic layer 7 is removed, and the first magnetic film 6 as a single-layer ferromagnetic layer is replaced with a first magnetic film 6A that has a stacked structure formed with a synthetic magnetization pinned layer and an antiferromagnetic layer 6a. As shown in FIG. 7A, the magnetization pinned layer has a stacked structure formed with a ferromagnetic layer $6_1$, a nonmagnetic layer $6_2$, and a ferromagnetic layer $6_3$, and the antiferromagnetic layer 6a pins the magnetization direction of the magnetization pinned layer. The ferromagnetic layer $6_1$ and the ferromagnetic layer $6_3$ are antiferromagnetically coupled to each other via the nonmagnetic layer $6_2$.

Figure 7B:
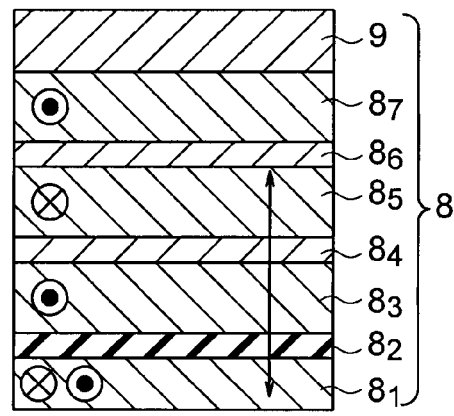

FIG. 7B shows a first specific example of the second magnetic film 8 of this embodiment. The second magnetic film 8 includes a ferromagnetic layer (a magnetization free layer) $8_1$ in which a magnetization direction is changeable, a nonmagnetic layer $8_2$, a ferromagnetic layer $8_3$ in which a magnetization direction is pinned, a nonmagnetic layer $8_4$, a ferromagnetic layer $8_5$ in which a magnetization direction is pinned, a nonmagnetic layer $8_6$, a ferromagnetic layer $8_7$ in which a magnetization direction is pinned, and an antiferromagnetic layer 9, which are stacked in this order. In this first specific example structure, the ferromagnetic layer $8_3$, the nonmagnetic layer $8_4$, the ferromagnetic layer $8_5$, the nonmagnetic layer $8_6$, and the ferromagnetic layer $8_7$ constitute a synthetic magnetization pinned layer, and the magnetization direction of the magnetization pinned layer is pinned by the antiferromagnetic layer 9. Also, the ferromagnetic layer $8_3$, the ferromagnetic layer $8_5$, and the ferromagnetic layer $8_7$ are antiferromagnetically coupled via the nonmagnetic layer $8_4$ and the nonmagnetic layer $8_6$. In this case, the synthetic magnetization pinned layer can be more firmly pinned, and excellent device stability can be achieved. In a spin MOSFET having the first specific example structure as the second magnetic film 8, the antiferromagnetic layer 6a and the antiferromagnetic layer 9 may be made of the same material, and the magnetization directions of the ferromagnetic layers $6_1$ and $6_3$ of the first magnetic film 6A and the ferromagnetic layers $8_3$, $8_5$, and $8_7$ of the second magnetic film 8 can be pinned simply by the annealing performed for pinning magnetization directions.

Figure 7C:
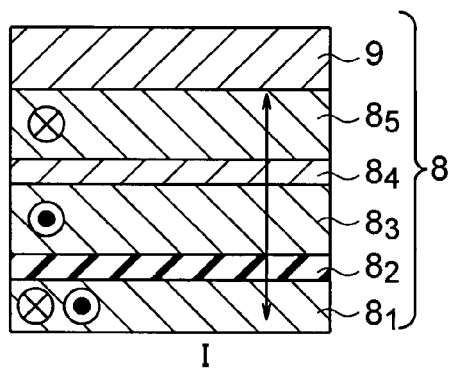

FIG. 7C shows a second specific example of the second magnetic film 8. The second magnetic film 8 of the second specific example includes a ferromagnetic layer (a magnetization free layer) $8_1$ in which a magnetization direction is changeable, a nonmagnetic layer $8_2$, a ferromagnetic layer $8_3$ in which a magnetization direction is pinned, a nonmagnetic layer $8_4$, a ferromagnetic layer $8_5$ in which a magnetization direction is pinned, and an antiferromagnetic layer 9, which are stacked in this order. In this second specific example structure, the ferromagnetic layer $8_3$, the nonmagnetic layer $8_4$, and the ferromagnetic layer $8_5$ constitute a synthetic magnetization pinned layer, and the magnetization direction of the magnetization pinned layer is pinned by the antiferromagnetic layer 9. Also, the ferromagnetic layer $8_3$ and the ferromagnetic layer $8_5$ are antiferromagnetically coupled via the nonmagnetic layer $8_4$. In this case, the synthetic magnetization pinned layer can be more firmly pinned, and excellent device stability can be achieved. In a spin MOSFET having the second specific example structure as the second magnetic film 8, the antiferromagnetic layer 6a and the antiferromagnetic layer 9 need be formed with different materials from each other, and it is necessary to reverse the magnetic field 180 degrees by the annealing performed for fixing magnetization directions.

Figure 7D:
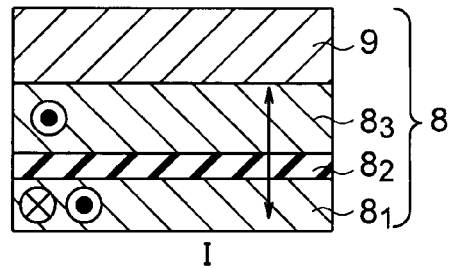

FIG. 7D shows a third specific example of the second magnetic film 8. The second magnetic film 8 of the third specific example includes a ferromagnetic layer (a magnetization free layer) $8_1$ in which a magnetization direction is changeable, a nonmagnetic layer $8_2$, a ferromagnetic layer $8_3$ in which a magnetization direction is pinned, and an antiferromagnetic layer 9, which are stacked in this order. In a spin MOSFET having the third specific example structure as the second magnetic film 8, the antiferromagnetic layer 6a and the antiferromagnetic layer 9 may be made of the same material, and the magnetization directions of the ferromagnetic layers $6_1$ and $6_3$ of the first magnetic film 6A and the ferromagnetic layer $8_3$ of the second magnetic film 8 can be pinned simply by the annealing performed for pinning magnetization directions.

Figure 8:
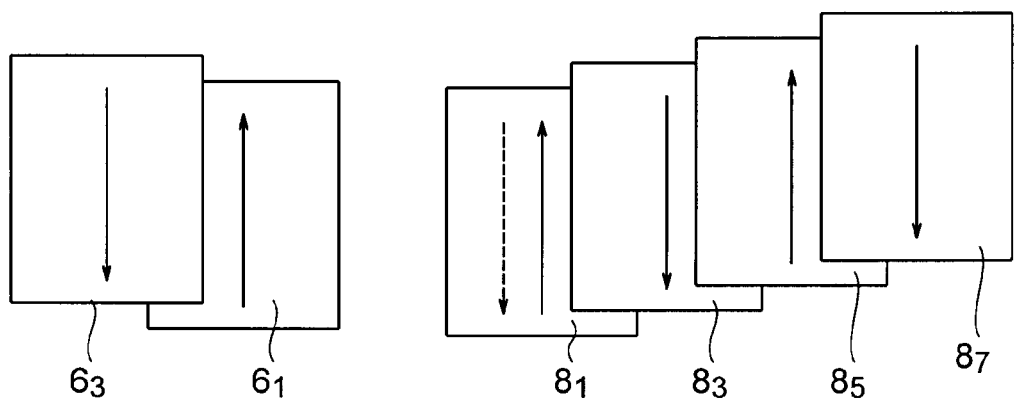
FIG. 8 shows the magnetization directions of the ferromagnetic layers of the first and second magnetic films of the spin MOSFET in accordance with the second embodiment.

FIG. 8 shows the magnetization directions of the ferromagnetic layers $6_1$ and $6_3$ of the first magnetic film 6A and the ferromagnetic layers $8_1$, $8_3$, $8_5$, and $8_7$ of the second magnetic film 8 in a case where the first specific example structure shown in FIG. 7B is employed as the second magnetic film 8.

In a spin MOSFET of this embodiment, a gate voltage that causes the negative magnetoresistance effect shown in FIG. 2B is used for writing. Here, the magnetization direction of the ferromagnetic layer $8_3$ has the spin arrangement shown in FIG. 8, or the spin arrangement opposite (antiparallel) to the magnetization direction of the ferromagnetic layer $6_1$ of the first magnetic film 6A. In this manner, the spin torque is doubly applied onto the ferromagnetic layer $8_1$ serving as a magnetization free layer, and the inversion current density at the time of the magnetization reversal caused by the spin injection can be reduced.

When reading is performed, a gate voltage that causes the positive magnetoresistance effect shown in FIG. 2A is used. When reading is performed with the use of the gate voltage in the spin arrangement shown in FIG. 8, the rate of magnetoresistance change of the multilayer structure is added to the rate of magnetoresistance change through the channel region 3. Accordingly, the reading output is greatly increased.

Since the gate voltages suitable for writing and reading vary with the kind of the substrate and the dope amount for the substrate, it is necessary to adjust the gate voltages when necessary. However, as long as the same type of substrate is used and the dope amount for the substrate is made constant, the gate voltages also become constant. In this embodiment, the tunnel insulating film 4 is provided between the semiconductor substrate 2 and the first and second magnetic films 6A and 8. Accordingly, diffusion of the semiconductor and the magnetic materials can be prevented, and a rate of magnetoresistance change through the channel region 3 can be observed at room temperature, as shown in FIGS. 2A, 2B, and 2C, even if materials having low resistance are used for the magnetic materials. Thus, better characteristics can be achieved.

As described above, this embodiment provides a spin MOSFET that performs a spin reversal at a low current density and achieves large output characteristics through the spin reversal.

In this embodiment, the nonmagnetic layer $8_2$ may be made of the same material as the nonmagnetic layer $8_2$ of the first embodiment, which is Cu, Ag, Au, AlOx, MgO, or the like. The nonmagnetic layers $6_2$, $8_4$, and $8_6$ may be made of the same material as the nonmagnetic layer $8_4$ of the first embodiment, which is Ru, Rh, Ir, or the like.

Also, the ferromagnetic layers of the first and second magnetic films 6A and 8 may be made of the same materials as the first and second magnetic films 6 and 8 of the first embodiment.

Third Embodiment

Figure 9:
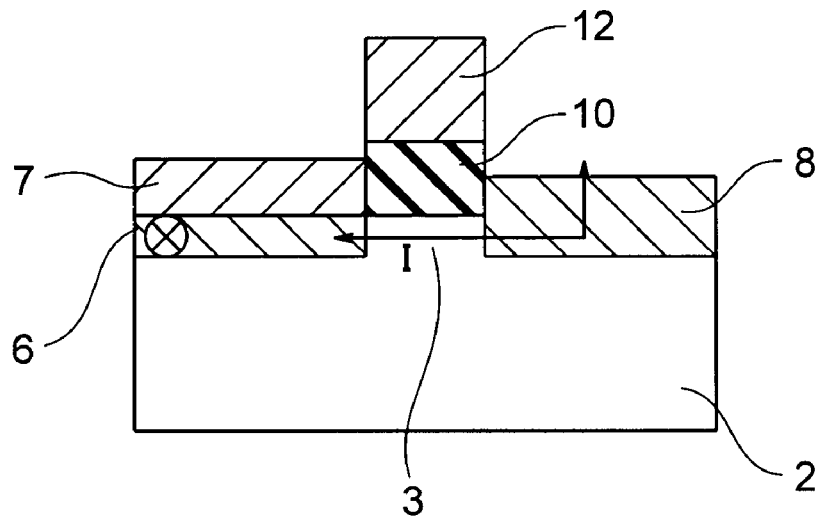
FIG. 9 is a cross-sectional view of a spin MOSFET in accordance with a third embodiment.

FIG. 9 is a cross-sectional view of a spin MOSFET in accordance with a third embodiment of the present invention. The spin MOSFET of this embodiment is a Schottky spin MOSFET, and is the same as the spin MOSFET of the first embodiment shown in FIG. 3, except that the tunnel insulating film 4 is removed from the structure.

Accordingly, a specific example structure of the second magnetic film 8 of this embodiment has the multilayer structure shown in FIG. 4A or 4B, like the second magnetic film 8 of the first embodiment. In a case where the second magnetic film 8 has the multilayer structure shown in FIG. 4A, the ferromagnetic layer of the first magnetic film 6 and the ferromagnetic layers $8_1$, $8_3$, and $8_5$ of the second magnetic film 8 have the magnetic directions shown in FIG. 5, as in the first embodiment.

As in the first embodiment, a gate voltage that causes the negative magnetoresistance effect shown in FIG. 2B is used for writing. In this manner, the inversion current density at the time of the magnetization reversal caused by spin injection can be reduced.

As in the first embodiment, when reading is performed, a gate voltage that causes the positive magnetoresistance effect shown in FIG. 2A is used. The rate of magnetoresistance change of the multilayer structure is added to the rate of magnetoresistance change through the channel region 3. Accordingly, the reading output is greatly increased.

Like the first embodiment, this embodiment also provides a spin MOSFET that performs a spin reversal at a low current density and achieves large output characteristics through the spin reversal.

Fourth Embodiment

Figure 10:
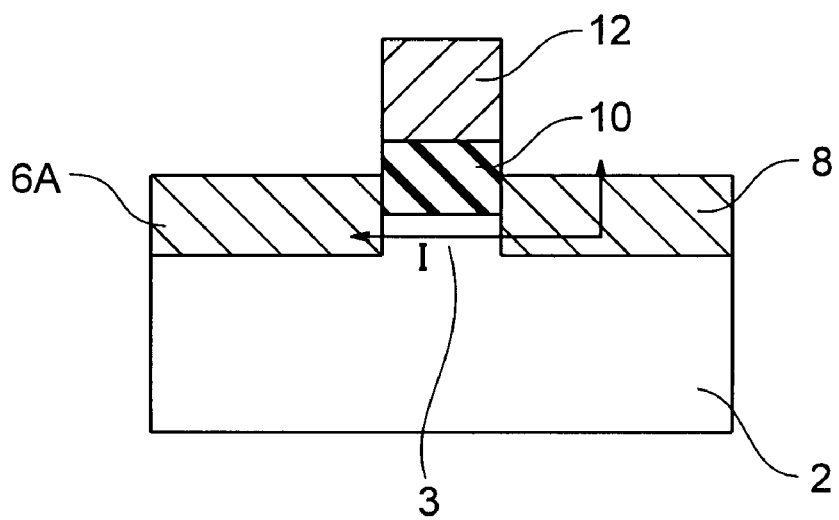
FIG. 10 is a cross-sectional view of a spin MOSFET in accordance with a fourth embodiment.

FIG. 10 is a cross-sectional view of a spin MOSFET in accordance with a fourth embodiment of the present invention. The spin MOSFET of this embodiment is a Schottky spin MOSFET, and is the same as the spin MOSFET of the second embodiment shown in FIG. 6, except that the tunnel insulating film 4 is removed from the structure.

Accordingly, as in the second embodiment, a specific example structure of the first magnetic film 6A of this embodiment has the multilayer structure shown in FIG. 7A, and a specific example structure of the second magnetic film 8 of this embodiment have the multilayer structure shown in FIG. 7B, 7C or 7D. In a case where the first magnetic film 6A has the multilayer structure shown in FIG. 7A, and the second magnetic film 8 has the multilayer structure shown in FIG. 7B, the ferromagnetic layers $6_1$ and $6_3$ of the first magnetic film 6A and the ferromagnetic layers $8_1$, $8_3$, $8_5$, and $8_7$ of the second magnetic film 8 have the magnetic directions shown in FIG. 8, as in the second embodiment.

As in the second embodiment, a gate voltage that causes the negative magnetoresistance effect shown in FIG. 2B is used for writing. In this manner, the inversion current density at the time of the magnetization reversal caused by spin injection can be reduced.

As in the second embodiment, when reading is performed, a gate voltage that causes the positive magnetoresistance effect shown in FIG. 2A is used. The rate of magnetoresistance change of the multilayer structure is added to the rate of magnetoresistance change through the channel region 3. Accordingly, the reading output is greatly increased.

Like the second embodiment, this embodiment also provides a spin MOSFET that performs a spin reversal at a low current density and achieves large output characteristics through the spin reversal.

Fifth Embodiment

Figure 11:
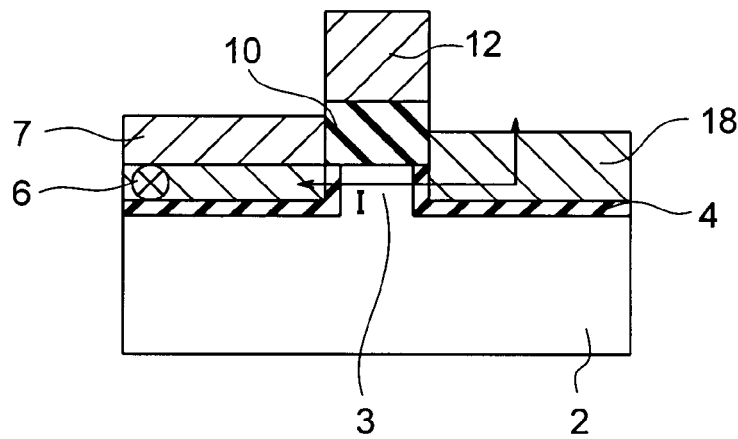
FIG. 11 is a cross-sectional view of a spin MOSFET in accordance with a fifth embodiment.
Figure 12A:
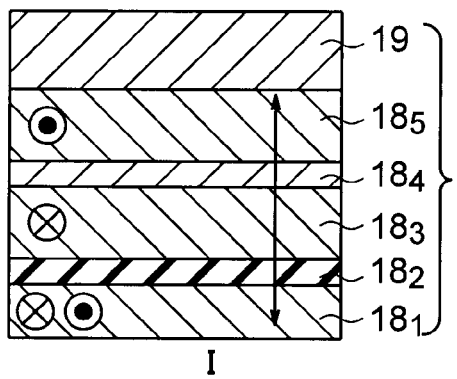
FIGS. 12A and 12B are cross-sectional views showing example structures of the second magnetic film of the spin MOSFET in accordance with the fifth embodiment.

FIG. 11 is a cross-sectional view of a spin MOSFET in accordance with a fifth embodiment of the present invention. The spin MOSFET of this embodiment is the same as the spin MOSFET of the first embodiment shown in FIG. 3, except that the second magnetic film 8 is replaced with a second magnetic film 18 having a stacked structure formed with ferromagnetic layers and nonmagnetic layers alternately stacked. As shown in FIG. 12A, a first specific example of the second magnetic film 18 includes a ferromagnetic layer (a magnetization free layer) $18_1$ in which a magnetization direction is changeable, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, and an antiferromagnetic layer 19, which are stacked in this order. In this first specific example structure, the ferromagnetic layer $18_3$, the nonmagnetic layer $18_4$, and the ferromagnetic layer $18_5$ constitute a synthetic magnetization pinned layer, and the magnetization direction of the magnetization pinned layer is pinned by the antiferromagnetic layer 19. Also, the ferromagnetic layer $18_3$ and the ferromagnetic layer $18_5$ are antiferromagnetically coupled via the nonmagnetic layer $18_4$. In this case, the synthetic magnetization pinned layer can be more firmly pinned, and excellent device stability can be achieved. In a spin MOSFET having the first specific example structure as the second magnetic film 18, the antiferromagnetic layer 7 and the antiferromagnetic layer 19 need be formed with different materials from each other, and it is necessary to reverse the magnetic field 180 degrees by the annealing performed for fixing magnetization directions.

Figure 12B:
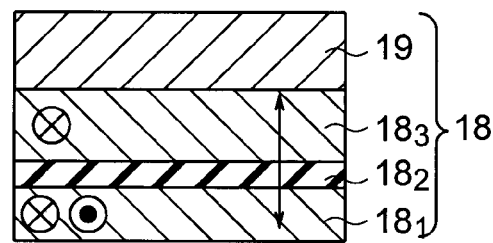

FIG. 12B shows a second specific example of the second magnetic film 18. The second magnetic film 18 of the second specific example includes a ferromagnetic layer (a magnetization free layer) $18_1$ in which a magnetization direction is changeable, a nonmagnetic layer $18_2$, a ferromagnetic layer $18_3$ in which a magnetization direction is pinned, and an antiferromagnetic layer 19, which are stacked in this order. In a spin MOSFET having the second specific example structure as the second magnetic film 18, the antiferromagnetic layer 7 and the antiferromagnetic layer 19 may be made of the same material, and the magnetization directions of the ferromagnetic layer of the first magnetic film 6 and the ferromagnetic layer $18_3$ of the second magnetic film 18 can be pinned simply by the annealing performed for fixing magnetization directions.

Figure 13:
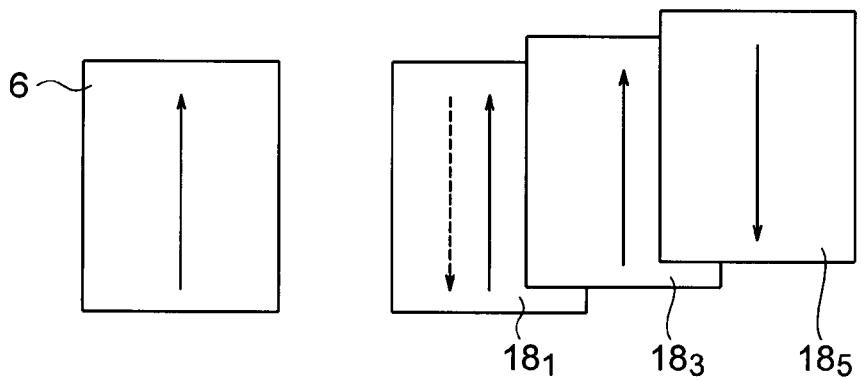
FIG. 13 shows the magnetization directions of the ferromagnetic layers of the first and second magnetic films of the spin MOSFET in accordance with the fifth embodiment.

FIG. 13 shows the magnetization directions of the ferromagnetic layer of the first magnetic film 6 and the ferromagnetic layers $18_1$, $18_3$, and $18_5$ of the second magnetic film 18 in a case where the first specific example structure shown in FIG. 12A is employed as the second magnetic film 18.

In a spin MOSFET of this embodiment, a gate voltage that causes the positive magnetoresistance effect shown in FIG. 2A is used for writing. In other words, a gate voltage that changes the spin direction of the electrons 180 degrees when the electrons are passing through the channel 3 is used. In this embodiment, the magnetization direction of the ferromagnetic layer $18_3$ has the spin arrangement shown in FIG. 13, or the spin arrangement same as (parallel to) the magnetization direction of the ferromagnetic layer serving as the magnetization pinned layer of the first magnetic film 6. Accordingly, in a case where the spin direction of the ferromagnetic layer $18_1$ serving as a magnetization free layer extends parallel to the spin direction of the first magnetic film 6, spin-polarized electrons are injected into the channel 3 from the first magnetic film 6, so that the spin direction of the spin-polarized electrons is rotated 180 degrees when the spin-polarized electrons are passing through the channel 3, and the spin-polarized electrons reach the ferromagnetic layer $18_1$. In this manner, the spin torque is applied onto the ferromagnetic layer $18_1$. Further, the electrons having passed through the ferromagnetic layer $18_1$ are reflected by the ferromagnetic layer $18_3$ and flow back into the ferromagnetic layer $18_1$. Accordingly, the spin torque is doubly applied onto the ferromagnetic layer $18_1$ serving as a magnetization free layer, and the inversion current density at the time of the magnetization reversal caused by the spin injection can be reduced. Meanwhile, in a case where the spin direction of the ferromagnetic layer $18_1$ serving as a magnetization free layer extends antiparallel to the spin direction of the first magnetic film 6, spin-polarized electrons are injected from the ferromagnetic layer $18_3$ into the channel 3 via the ferromagnetic layer $18_1$ serving as a magnetization free layer, so that the electrons spin-polarized by the ferromagnetic layer $18_3$ reach the ferromagnetic layer $18_1$ serving as a magnetization free layer, and the spin torque is applied onto the ferromagnetic layer $18_1$. Further, the spin direction of the electrons having passed through the ferromagnetic layer $18_1$ is rotated 180 degrees when the electrons are passing through the channel 3. The electrons then reach the ferromagnetic layer 6, and are reflected by the ferromagnetic layer 6. The spin direction of the reflected electrons is rotated 180 degrees when the reflected electrons are passing through the channel 3. The electrons then reach the ferromagnetic layer $18_1$. Accordingly, the spin torque is doubly applied onto the ferromagnetic layer $18_1$ serving as a magnetization free layer, and the inversion current density at the time of the magnetization reversal caused by the spin injection can be reduced. Thus, with the use of a gate voltage that causes a positive magnetoresistance effect at the time of writing, the spin torque is doubly applied to the ferromagnetic layer $18_1$ serving as a magnetization free layer, and the inversion current density at the time of the magnetization reversal caused by the spin injection can be reduced.

When reading is performed, a gate voltage that causes the negative magnetoresistance effect shown in FIG. 2B is used. In other words, a gate voltage that does not cause a change in the spin direction of spin-polarized electrons when the electrons are passing through the channel 3 is used. When reading is performed with the use of the gate voltage in the spin arrangement shown in FIG. 13, the spin direction of electrons passing through the channel 3 is not changed. Accordingly, in a case where the spin direction of the ferromagnetic layer $18_1$ serving as a magnetization free layer extends parallel to the spin direction of the first magnetic film 6, the resistance of the channel 3 is lower than in a case where the spin direction of the electrons passing through the channel 3 is rotated 180 degrees (where a gate voltage that causes a positive magnetoresistance effect is used). Here, the magnetization direction of the ferromagnetic layer $18_1$ extends parallel to the magnetization direction of the ferromagnetic layer $18_3$. Accordingly, the resistance between the ferromagnetic layers $18_1$ and $18_3$ is lower than in a case where the magnetization direction of the ferromagnetic layer $18_1$ extends antiparallel to the magnetization direction of the ferromagnetic layer $18_3$.

Meanwhile, in a case where the spin direction of the ferromagnetic layer $18_1$ serving as a magnetization free layer extends antiparallel to the spin direction of the first magnetic film 6, the resistance of the channel 3 is higher than in a case where the spin direction of the electrons passing through the channel 3 is rotated 180 degrees (where a gate voltage that causes a positive magnetoresistance effect is used). Here, the magnetization direction of the ferromagnetic layer $18_1$ extends antiparallel to the magnetization direction of the ferromagnetic layer $18_3$. Accordingly, the resistance between the ferromagnetic layers $18_1$ and $18_3$ is higher than in a case where the magnetization direction of the ferromagnetic layer $18_1$ extends parallel to the magnetization direction of the ferromagnetic layer $18_3$.

As described above, as a gate voltage that causes a negative magnetoresistance effect is used for reading in this embodiment, the difference between the resistance of the channel 3 and the total resistance between the ferromagnetic layers $18_1$ and $18_3$ in a case where the magnetization direction of the ferromagnetic layer $18_1$ serving as a magnetization free layer is changed is larger than in a case where a gate voltage that causes a positive magnetoresistance effect is used. The rate of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $18_2$ may be made of the same material as the nonmagnetic layer $8_2$ of the first embodiment, which is Cu, Ag, Au, AlOx, MgO, or the like. The nonmagnetic layer $18_4$ may be made of the same material as the nonmagnetic layer $8_4$ of the first embodiment, which is Ru, Rh, Ir, or the like.

Also, the ferromagnetic layers of the first and second magnetic films 6 and 18 may be made of the same materials as the first and second magnetic films 6 and 8 of the first embodiment.

Sixth Embodiment

Figure 14:
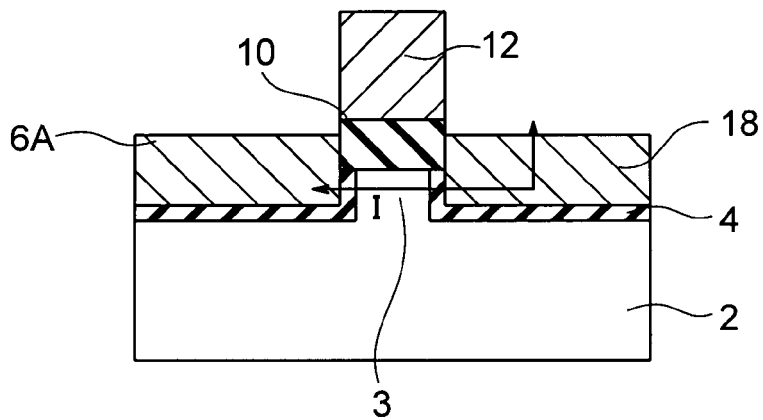
FIG. 14 is a cross-sectional view of a spin MOSFET in accordance with a sixth embodiment.

FIG. 14 is a cross-sectional view of a spin MOSFET in accordance with a sixth embodiment of the present invention. The spin MOSFET of this embodiment is the same as the spin MOSFET of the second embodiment shown in FIG. 6, except that the second magnetic film 8 is replaced with a second magnetic film 18 having a stacked structure formed with ferromagnetic layer and nonmagnetic layers alternately stacked.

Figure 15A:
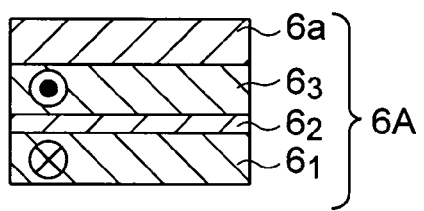
FIGS. 15A through 15D are cross-sectional views showing example structures of the first and second magnetic films of the spin MOSFET in accordance with the sixth embodiment.

The first magnetic film 6A of this embodiment has a stacked structure of a synthetic magnetization pinned layer and an antiferromagnetic layer 6a. As shown in FIG. 15A, the magnetization pinned layer has a stacked structure formed with a ferromagnetic layer $6_1$, a nonmagnetic layer $6_2$, and a ferromagnetic layer $6_3$, and the antiferromagnetic layer 6a pins the magnetization direction of the magnetization pinned layer. The ferromagnetic layer $6_1$ and the ferromagnetic layer $6_3$ are antiferromagnetically coupled to each other via the nonmagnetic layer $6_2$.

Figure 15B:
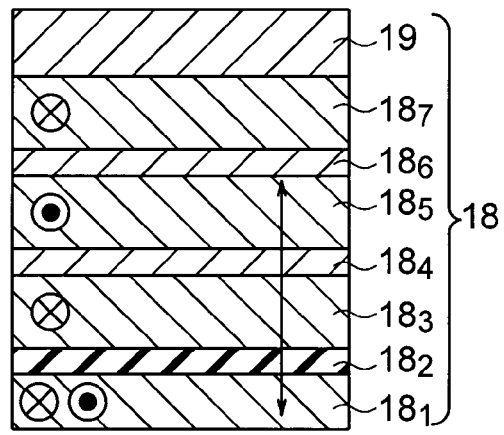

FIG. 15B shows a first specific example of the second magnetic film 18 of this embodiment. The second magnetic film 18 includes a ferromagnetic layer (a magnetization free layer) $18_1$ in which a magnetization direction is changeable, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, a nonmagnetic layer $18_6$, a ferromagnetic layer $18_7$ in which a magnetization direction is pinned, and an antiferromagnetic layer 19, which are stacked in this order. In this first specific example structure, the ferromagnetic layer $18_3$, the nonmagnetic layer $18_4$, the ferromagnetic layer $18_5$, the nonmagnetic layer $18_6$, and the ferromagnetic layer $18_7$ constitute a synthetic magnetization pinned layer, and the magnetization direction of the magnetization pinned layer is pinned by the antiferromagnetic layer 19. Also, the ferromagnetic layer $18_3$, the ferromagnetic layer $18_5$, and the ferromagnetic layer $18_7$ are antiferromagnetically coupled via the nonmagnetic layer $18_4$ and the nonmagnetic layer $18_6$. In this case, the synthetic magnetization pinned layer can be more firmly pinned, and excellent device stability can be achieved. In a spin MOSFET having the first specific example structure as the second magnetic film 18, the antiferromagnetic layer 6a and the antiferromagnetic layer 19 need to be made of different materials from each other, and it is necessary to reverse the magnetic field 180 degrees by the annealing performed for fixing magnetization directions.

Figure 15C:
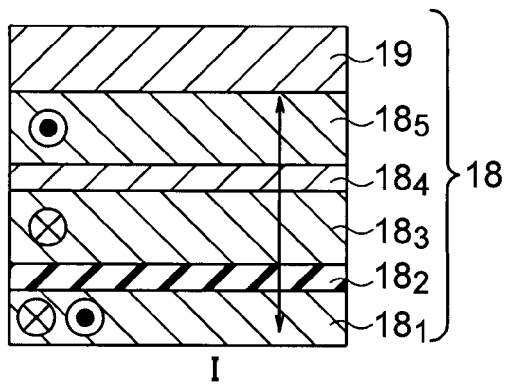

FIG. 15C shows a second specific example of the second magnetic film 18. The second magnetic film 18 of the second specific example includes a ferromagnetic layer (a magnetization free layer) $18_1$ in which a magnetization direction is changeable, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, and an antiferromagnetic layer 19, which are stacked in this order. In this second specific example structure, the ferromagnetic layer $18_3$, the nonmagnetic layer $18_4$, and the ferromagnetic layer $18_5$ constitute a synthetic magnetization pinned layer, and the magnetization direction of the magnetization pinned layer is pinned by the antiferromagnetic layer 19. Also, the ferromagnetic layer $18_3$ and the ferromagnetic layer $18_5$ are antiferromagnetically coupled via the nonmagnetic layer $18_4$. In this case, the synthetic magnetization pinned layer can be more firmly pinned, and excellent device stability can be achieved. In a spin MOSFET having the second specific example structure as the second magnetic film 18, the antiferromagnetic layer 6a and the antiferromagnetic layer 19 may be made of the same material, and the magnetization directions of the ferromagnetic layers $6_1$, and $6_3$ of the first magnetic film 6A and the ferromagnetic layers $18_3$ and $18_5$ of the second magnetic film 18 can be pinned simply by the annealing performed for pinning magnetization directions.

Figure 15D:
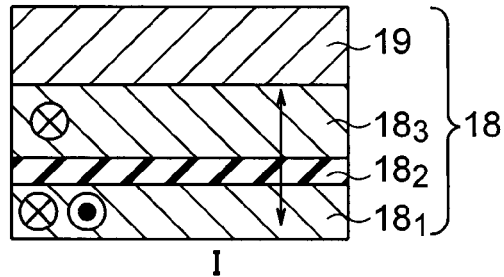

FIG. 15D shows a third specific example of the second magnetic film 18. The second magnetic film 18 of the third specific example includes a ferromagnetic layer (a magnetization free layer) $18_1$ in which a magnetization direction is changeable, a nonmagnetic layer $18_2$, a ferromagnetic layer $18_3$ in which a magnetization direction is pinned, and an antiferromagnetic layer 19, which are stacked in this order. In a spin MOSFET having the third specific example structure as the second magnetic film 18, the antiferromagnetic layer 6a and the antiferromagnetic layer 19 need to be made of different materials from each other, and it is necessary to reverse the magnetic field 180 degrees by the annealing performed for fixing magnetization directions.

Figure 16:
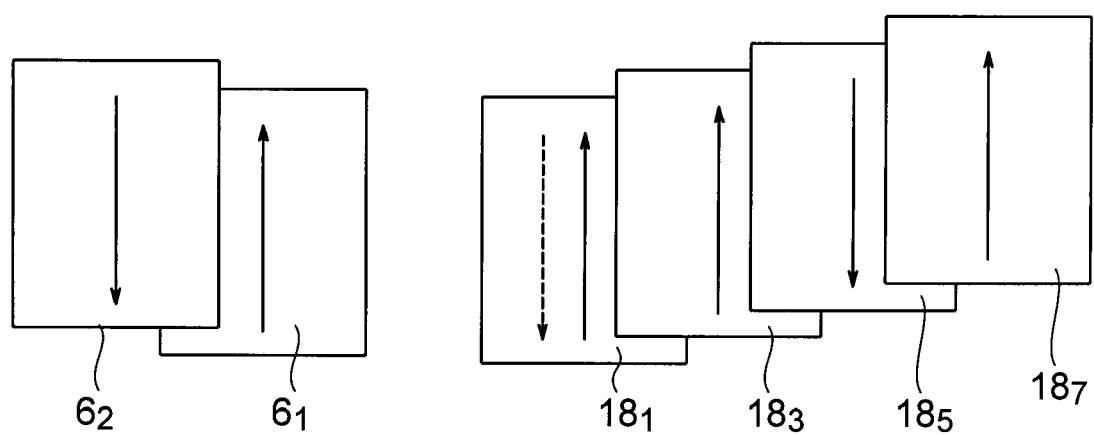
FIG. 16 shows the magnetization directions of the ferromagnetic layers of the first and second magnetic films of the spin MOSFET in accordance with the sixth embodiment.

FIG. 16 shows the magnetization directions of the ferromagnetic layers $6_1$ and $6_3$ of the first magnetic film 6A and the ferromagnetic layers $18_1$, $18_3$, $18_5$, and $18_7$ of the second magnetic film 18 in a case where the first specific example structure shown in FIG. 15B is employed as the second magnetic film 18.

In a spin MOSFET of this embodiment, a gate voltage that causes the positive magnetoresistance effect shown in FIG. 2A is used for writing. Here, the magnetization direction of the ferromagnetic layer $18_3$ has the spin arrangement shown in FIG. 16, or the spin arrangement same as (parallel to) the magnetization direction of the ferromagnetic layer $6_1$ of the first magnetic film 6A. In this manner, the spin torque is doubly applied onto the ferromagnetic layer $18_1$ serving as a magnetization free layer, and the inversion current density at the time of the magnetization reversal caused by the spin injection can be reduced.

When reading is performed, a gate voltage that causes the negative magnetoresistance effect shown in FIG. 2B is used. When reading is performed with the use of the gate voltage in the spin arrangement shown in FIG. 16, the rate of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $18_2$ may be made of the same material as the nonmagnetic layer $8_2$ of the first embodiment, which is Cu, Ag, Au, AlOx, MgO, or the like. The nonmagnetic layers $6_2$, $18_4$, and $18_6$ may be made of the same material as the nonmagnetic layer $8_4$ of the first embodiment, which is Ru, Rh, Ir, or the like.

Also, the ferromagnetic layers of the first and second magnetic films 6A and 18 may be made of the same materials as the first and second magnetic films 6 and 8 of the first embodiment.

Seventh Embodiment

Figure 17:
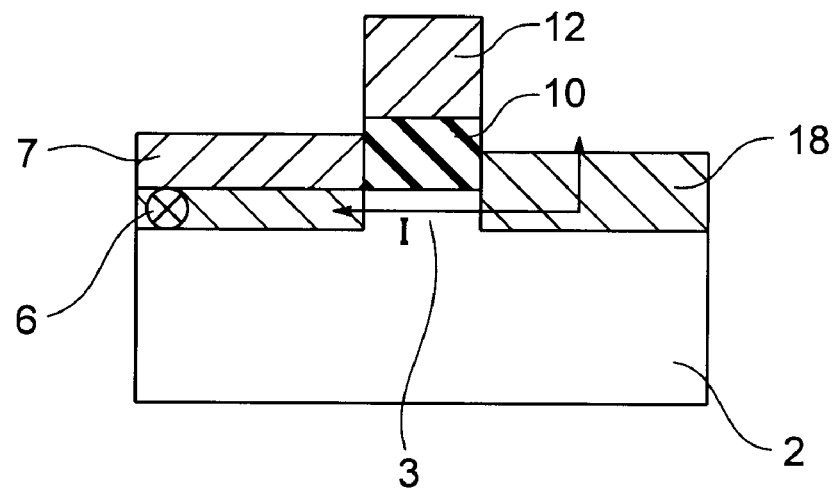
FIG. 17 is a cross-sectional view of a spin MOSFET in accordance with a seventh embodiment.

FIG. 17 is a cross-sectional view of a spin MOSFET in accordance with a seventh embodiment of the present invention. The spin MOSFET of this embodiment is a Schottky spin MOSFET, and is the same as the spin MOSFET of the fifth embodiment shown in FIG. 11, except that the tunnel insulating film 4 is removed from the structure.

Accordingly, a specific example structure of the second magnetic film 18 of this embodiment has the multilayer structure shown in FIG. 12A or 12B, like the second magnetic film 18 of the fifth embodiment. In a case where the second magnetic film 18 has the multilayer structure shown in FIG. 12A, the ferromagnetic layer of the first magnetic film 6 and the ferromagnetic layers $18_1$, $18_3$, and $18_5$ of the second magnetic film 18 have the magnetic directions shown in FIG. 13, as in the fifth embodiment.

As in the fifth embodiment, a gate voltage that causes the positive magnetoresistance effect shown in FIG. 2A is used for writing. In this manner, the inversion current density at the time of the magnetization reversal caused by spin injection can be reduced.

As in the fifth embodiment, when reading is performed, a gate voltage that causes the negative magnetoresistance effect shown in FIG. 2B is used. The rate of magnetoresistance change of the multilayer structure is added to the rate of magnetoresistance change through the channel region 3. Accordingly, the reading output is greatly increased.

Like the fifth embodiment, this embodiment also provides a spin MOSFET that performs a spin reversal at a low current density and achieves large output characteristics through the spin reversal.

Eighth Embodiment

Figure 18:
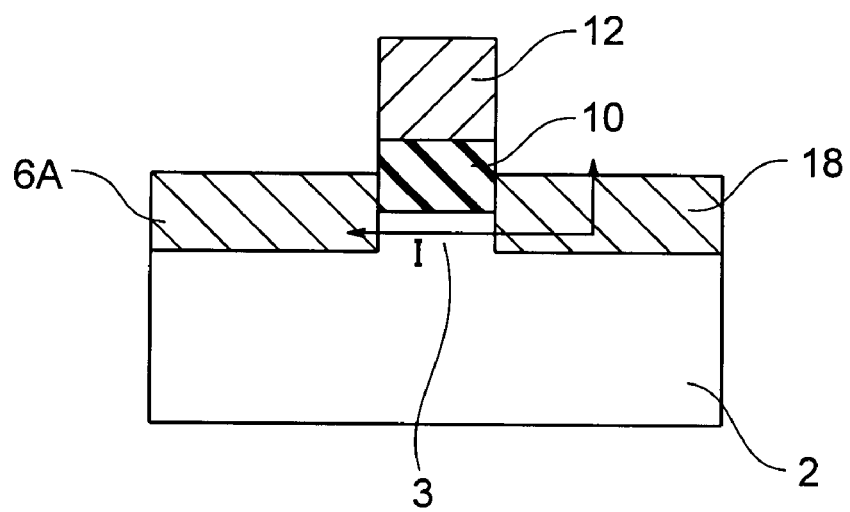
FIG. 18 is a cross-sectional view of a spin MOSFET in accordance with an eighth embodiment.

FIG. 18 is a cross-sectional view of a spin MOSFET in accordance with an eighth embodiment of the present invention. The spin MOSFET of this embodiment is a Schottky spin MOSFET, and is the same as the spin MOSFET of the sixth embodiment shown in FIG. 14, except that the tunnel insulating film 4 is removed from the structure.

Accordingly, as in the sixth embodiment, a specific example structure of the first magnetic film 6A of this embodiment has the multilayer structure shown in FIG. 15A, and a specific example structure of the second magnetic film 18 of this embodiment have the multilayer structure shown in FIG. 15B, 15C or 15D. In a case where the first magnetic film 6A has the multilayer structure shown in FIG. 15A, and the second magnetic film 18 has the multilayer structure shown in FIG. 15B, the ferromagnetic layers $6_1$ and $6_3$ of the first magnetic film 6A and the ferromagnetic layers $18_1$, $18_3$, $18_5$, and $18_7$ of the second magnetic film 18 have the magnetic directions shown in FIG. 16, as in the sixth embodiment.

As in the sixth embodiment, a gate voltage that causes the positive magnetoresistance effect shown in FIG. 2A is used for writing. In this manner, the inversion current density at the time of the magnetization reversal caused by spin injection can be reduced.

As in the sixth embodiment, when reading is performed, a gate voltage that causes the negative magnetoresistance effect shown in FIG. 2B is used. The rate of magnetoresistance change of the multilayer structure is added to the rate of magnetoresistance change through the channel region 3. Accordingly, the reading output is greatly increased.

Like the sixth embodiment, this embodiment also provides a spin MOSFET that performs a spin reversal at a low current density and achieves large output characteristics through the spin reversal.

Ninth Embodiment

FIG. 19 is a cross-sectional view of a spin MOSFET in accordance with a ninth embodiment of the present invention. The spin MOSFET of this embodiment is the same as the spin MOSFET of the first embodiment shown in FIGS. 3 through 5, except that the second magnetic film 8 is replaced with a second magnetic film 8A. FIG. 20A shows a first specific example of the second magnetic film 8A. This first specific example of the second magnetic film 8A includes a synthetic magnetization pinned layer and an antiferromagnetic layer 9. The magnetization pinned layer has a stacked structure formed with a magnetization free layer $8_1$ consisting of a ferromagnetic layer $8_{11}$, a nonmagnetic layer $8_{12}$, and a ferromagnetic layer $8_{13}$, a nonmagnetic layer $8_2$, a ferromagnetic layer $8_3$, a nonmagnetic layer $8_4$, and a ferromagnetic layer $8_5$. The antiferromagnetic layer 9 pins the magnetization direction of the magnetization pinned layer. In the magnetization pinned layer of the second magnetic film 8A, the ferromagnetic layer $8_3$ and the ferromagnetic layer $8_5$ are antiferromagnetically coupled via the nonmagnetic layer $8_4$. In this case, the synthetic magnetization pinned layer can be more firmly fixed, and excellent device stability can be achieved. In a spin MOSFET having the first specific example structure as the second magnetic film 8A, the antiferromagnetic layer 7 and the antiferromagnetic layer 9 need be formed with different materials from each other, and it is necessary to reverse the magnetic field 180 degrees by the annealing performed for fixing magnetization directions.

FIG. 20B shows a second specific example of the second magnetic film 8A. The second magnetic film 8A of the second specific example includes a magnetization free layer $8_1$ consisting of a ferromagnetic layer $8_{11}$, a nonmagnetic layer $8_{12}$, and a ferromagnetic layer $8_{13}$, a nonmagnetic layer $8_2$, a ferromagnetic layer $8_3$ in which a magnetization direction is pinned, and an antiferromagnetic layer 9, which are stacked in this order. In a spin MOSFET having the second specific example structure as the second magnetic film 8A, the antiferromagnetic layer 7 and the antiferromagnetic layer 9 may be made of the same material, and the magnetization directions of the ferromagnetic layer of the first magnetic film 6 and the ferromagnetic layer $18_3$ of the second magnetic film 8A can be pinned simply by the annealing performed for pinning magnetization directions.

FIG. 21 shows the magnetization directions of the ferromagnetic layer of the first magnetic film 6 and the ferromagnetic layers $8_1$, $8_3$, and $8_5$ of the second magnetic film 8A in a case where the first specific example structure shown in FIG. 20B is employed as the second magnetic film 8A.

In a spin MOSFET of this embodiment, the magnetization direction of the ferromagnetic layer of the first magnetic film 6 extends parallel to the magnetization direction of the ferromagnetic layer $8_3$, and the ferromagnetic layer $8_1$ serving as a magnetization free layer has a synthetic structure formed with the ferromagnetic layer $8_{11}$, the nonmagnetic layer $8_{12}$, and the ferromagnetic layer $8_{13}$. Therefore, a gate voltage that causes the positive magnetoresistance effect shown in FIG. 2A is used for writing and reading. In other words, a gate voltage that changes the spin direction of the electrons 180 degrees when the electrons are passing through the channel 3 is used.

In this embodiment, the magnetization direction of the ferromagnetic layer $8_3$ has the spin arrangement shown in FIG. 21, or the spin arrangement same as (parallel to) the magnetization direction of the ferromagnetic layer serving as the magnetization pinned layer of the first magnetic film 6. Accordingly, in a case where the spin direction of the ferromagnetic layer $8_{11}$ serving as a magnetization free layer extends parallel to the spin direction of the first magnetic film 6, spin-polarized electrons are injected into the channel 3 from the first magnetic film 6, so that the spin direction of the spin-polarized electrons is rotated 180 degrees when the spin-polarized electrons are passing through the channel 3, and the spin-polarized electrons reach the ferromagnetic layer $8_{11}$. In this manner, the spin torque is applied onto the ferromagnetic layer $8_{11}$. Further, the electrons pass through the ferromagnetic layers $8_{11}$ and $8_{13}$, and reach the ferromagnetic layer $8_3$. The electrons are then reflected by the ferromagnetic layer $8_3$, and flow back into the ferromagnetic layer $8_{11}$ through the ferromagnetic layer $8_{13}$. In this manner, the spin torque is again applied onto the ferromagnetic layer $8_{11}$. Accordingly, the spin torque is doubly applied onto the magnetization free layer, and the inversion current density at the time of the magnetization reversal caused by the spin injection can be reduced.

Meanwhile, in a case where the spin direction of the ferromagnetic layer $8_{11}$ serving as a magnetization free layer extends antiparallel to the spin direction of the first magnetic film 6, spin-polarized electrons are injected into the magnetization free layer from the ferromagnetic layer $8_3$, so that the spin-polarized electrons reach the ferromagnetic layer $8_{11}$ through the ferromagnetic layer $8_{13}$, and the spin torque is applied onto the ferromagnetic layer $8_{11}$. Further, the spin direction of the electrons having reached the ferromagnetic layer $8_{11}$ is rotated 180 degrees when the electrons are passing through the channel 3. The electrons then reach the ferromagnetic layer 6, and are reflected by the ferromagnetic layer 6. The spin direction of the reflected electrons is rotated 180 degrees when the reflected electrons are passing through the channel 3. The electrons then reach the ferromagnetic layer $8_{11}$. Accordingly, the spin torque is doubly applied onto the magnetization free layer, and the inversion current density at the time of the magnetization reversal caused by the spin injection can be reduced. Thus, with the use of a gate voltage that causes a positive magnetoresistance effect at the time of writing, the spin torque is doubly applied to the magnetization free layer, and the inversion current density at the time of the magnetization reversal caused by the spin injection can be reduced.

When reading is performed in the spin arrangement shown in FIG. 21, the spin direction of electrons passing through the channel 3 is changed 180 degrees. Accordingly, in a case where the spin direction of the ferromagnetic layer $8_{11}$ serving as a magnetization free layer extends parallel to the spin direction of the first magnetic film 6, the resistance of the channel 3 is higher than in a case where the spin direction of the electrons passing through the channel 3 is not changed (where a gate voltage that causes a negative magnetoresistance effect is used). Here, the magnetization direction of the ferromagnetic layer $8_{13}$ extends antiparallel to the magnetization direction of the ferromagnetic layer $8_3$. Accordingly, the resistance between the ferromagnetic layers $8_{13}$ and $8_3$ is higher than in a case where the magnetization direction of the ferromagnetic layer $8_{13}$ extends parallel to the magnetization direction of the ferromagnetic layer $8_3$.

Meanwhile, in a case where the spin direction of the ferromagnetic layer $8_{11}$ serving as a magnetization free layer extends antiparallel to the spin direction of the first magnetic film 6, the resistance of the channel 3 is lower than in a case where the spin direction of the electrons passing through the channel 3 is not changed (where a gate voltage that causes a negative magnetoresistance effect is used). Here, the magnetization direction of the ferromagnetic layer $8_{13}$ extends parallel to the magnetization direction of the ferromagnetic layer $8_3$. Accordingly, the resistance between the ferromagnetic layers $8_{13}$ and $8_3$ is lower than in a case where the magnetization direction of the ferromagnetic layer $8_{13}$ extends antiparallel to the magnetization direction of the ferromagnetic layer $8_3$.

As described above, as a gate voltage that causes a positive magnetoresistance effect is used for reading in this embodiment, the difference between the resistance of the channel 3 and the total resistance between the ferromagnetic layers $8_{13}$ and $8_3$ in a case where the magnetization direction of the magnetization free layer is changed is larger than in a case where a gate voltage that causes a negative magnetoresistance effect is used. The rate of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $8_2$ may be made of the same material as the nonmagnetic layer $8_2$ of the first embodiment, which is Cu, Ag, Au, AlOx, MgO, or the like. The nonmagnetic layers $8_{12}$ and $8_4$ may be made of the same material as the nonmagnetic layer $8_4$ of the first embodiment, which is Ru, Rh, Ir, or the like.

Also, the ferromagnetic layers of the first and second magnetic films 6 and 8A may be made of the same materials as the first and second magnetic films 6 and 8 of the first embodiment.

In this embodiment, the magnetization free layer has a stacked structure formed with ferromagnetic layers each provided between nonmagnetic layers, and the ferromagnetic layers are antiferromagnetically bonded. However, those ferromagnetic layers may be ferromagnetically bonded. In such a case, gate voltages that exhibit the same magnetoresistance effects as in a case where the magnetization free layer is a single-layer ferromagnetic layer are used for reading and writing. This also applies to the following embodiments.

Tenth Embodiment

Figure 22:
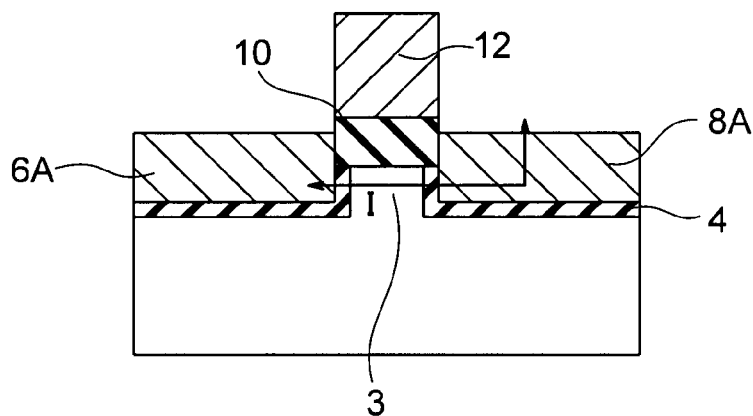
FIG. 22 is a cross-sectional view of a spin MOSFET in accordance with a tenth embodiment.

FIG. 22 is a cross-sectional view of a spin MOSFET in accordance with a tenth embodiment of the present invention. The spin MOSFET of this embodiment is the same as the spin MOSFET of the second embodiment shown in FIG. 6, except that the second magnetic film 8 is replaced with a second magnetic film 8A. In the second magnetic film 8A, the ferromagnetic layer serving as the magnetization free layer of the second magnetic film 8 of the second embodiment is replaced with a synthetic magnetization free layer.

Figure 23A:
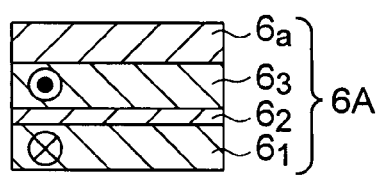
FIGS. 23A through 23D are cross-sectional views showing example structures of the first and second magnetic films of the spin MOSFET in accordance with the tenth embodiment.

FIG. 23A shows a specific example structure of the first magnetic film 6A of this embodiment. The first magnetic film 6A of this specific example has a stacked structure formed with a synthetic magnetization pinned layer and an antiferromagnetic layer 6a. The magnetization pinned layer has a stacked structure formed with a ferromagnetic layer $6_1$, a nonmagnetic layer $6_2$, and a ferromagnetic layer $6_3$. The ferromagnetic layer 6a pins the magnetization direction of the magnetization pinned layer. The ferromagnetic layer $6_1$ and the ferromagnetic layer $6_3$ are antiferromagnetically coupled to each other via the nonmagnetic layer $6_2$.

Figure 23B:
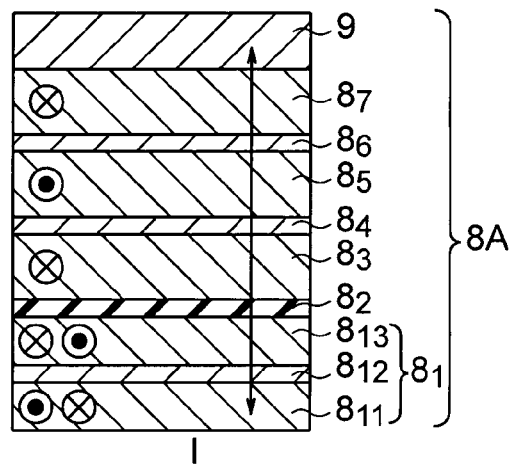

FIG. 23B shows a first specific example of the second magnetic film 8A of this embodiment. The second magnetic film 8A includes a magnetization free layer $8_1$, in which a magnetization direction is changeable, that is formed with a ferromagnetic layer $8_{11}$, a nonmagnetic layer $8_{12}$, and a ferromagnetic layer $8_{13}$, a nonmagnetic layer $8_2$, a ferromagnetic layer $8_3$ in which a magnetization direction is pinned, a nonmagnetic layer $8_4$, a ferromagnetic layer $8_5$ in which a magnetization direction is pinned, a nonmagnetic layer $8_6$, a ferromagnetic layer $8_7$ in which a magnetization direction is pinned, and an antiferromagnetic layer 9, which are stacked in this order. In this first specific example structure, the ferromagnetic layer $8_{11}$ and the ferromagnetic layer $8_{13}$ are antiferromagnetically coupled via the nonmagnetic layer $8_{12}$.

Also, the ferromagnetic layer $8_3$, the nonmagnetic layer $8_4$, the ferromagnetic layer $8_5$, the nonmagnetic layer $8_6$, and the ferromagnetic layer $8_7$ constitute a synthetic magnetization pinned layer, and the magnetization direction of the magnetization pinned layer is pinned by the antiferromagnetic layer 9. The ferromagnetic layer $8_3$, the ferromagnetic layer $8_5$, and the ferromagnetic layer $8_7$ are antiferromagnetically coupled via the nonmagnetic layer $8_4$ and the nonmagnetic layer $8_6$. In this case, the synthetic magnetization pinned layer can be more firmly pinned, and excellent device stability can be achieved. In a spin MOSFET having the first specific example structure as the second magnetic film 8A, the antiferromagnetic layer 6a and the antiferromagnetic layer 9 need to be made of different materials from each other, and it is necessary to reverse the magnetic field 180 degrees by the annealing performed for pinning magnetization directions.

Figure 23C:
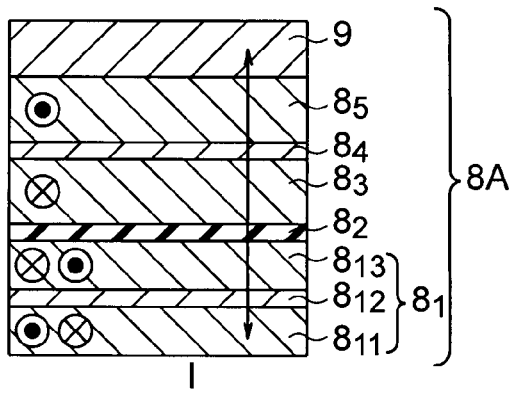

FIG. 23C shows a second specific example of the second magnetic film 8A. The second magnetic film 8A of the second specific example includes a magnetization free layer $8_1$, in which a magnetization direction is changeable, that is formed with a ferromagnetic layer $8_{11}$, a nonmagnetic layer $8_{12}$, and a ferromagnetic layer $8_{13}$, a nonmagnetic layer $8_2$, a ferromagnetic layer $8_3$ in which a magnetization direction is pinned, a nonmagnetic layer $8_4$, a ferromagnetic layer $8_5$ in which a magnetization direction is pinned, and an antiferromagnetic layer 9, which are stacked in this order. In this second specific example structure, the ferromagnetic layer $8_3$, the nonmagnetic layer $8_4$, and the ferromagnetic layer $8_5$ constitute a synthetic magnetization pinned layer, and the magnetization direction of the magnetization pinned layer is pinned by the antiferromagnetic layer 9. Also, the ferromagnetic layer $8_3$ and the ferromagnetic layer $8_5$ are antiferromagnetically coupled via the nonmagnetic layer $8_4$. In this case, the synthetic magnetization pinned layer can be more firmly pinned, and excellent device stability can be achieved. In a spin MOSFET having the second specific example structure as the second magnetic film 8A, the antiferromagnetic layer 6a and the antiferromagnetic layer 9 may be made of the same material, and the magnetization directions of the ferromagnetic layers $6_1$ and $6_3$ of the first magnetic film 6A and the ferromagnetic layers $8_3$ and $8_5$ of the second magnetic film 8A can be pinned simply by the annealing performed for pinning magnetization directions.

Figure 23D:
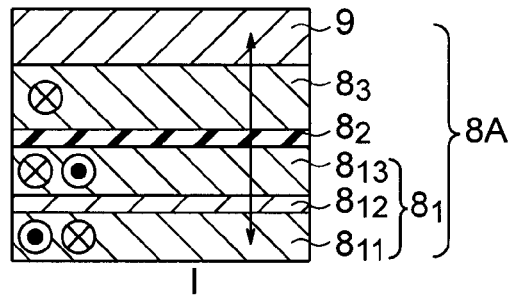

FIG. 23D shows a third specific example of the second magnetic film 8A. The second magnetic film 8A of the third specific example includes a magnetization free layer $8_1$, in which a magnetization direction is changeable, that is formed with a ferromagnetic layer $8_{11}$, a nonmagnetic layer $8_{12}$, and a ferromagnetic layer $8_{13}$, a nonmagnetic layer $8_2$, a ferromagnetic layer $8_3$ in which a magnetization direction is pinned, and an antiferromagnetic layer 9, which are stacked in this order. In a spin MOSFET having the third specific example structure as the second magnetic film 8A, the antiferromagnetic layer 6a and the antiferromagnetic layer 9 need to be made of different materials from each other, and it is necessary to reverse the magnetic field 180 degrees by the annealing performed for fixing magnetization directions.

Figure 24:
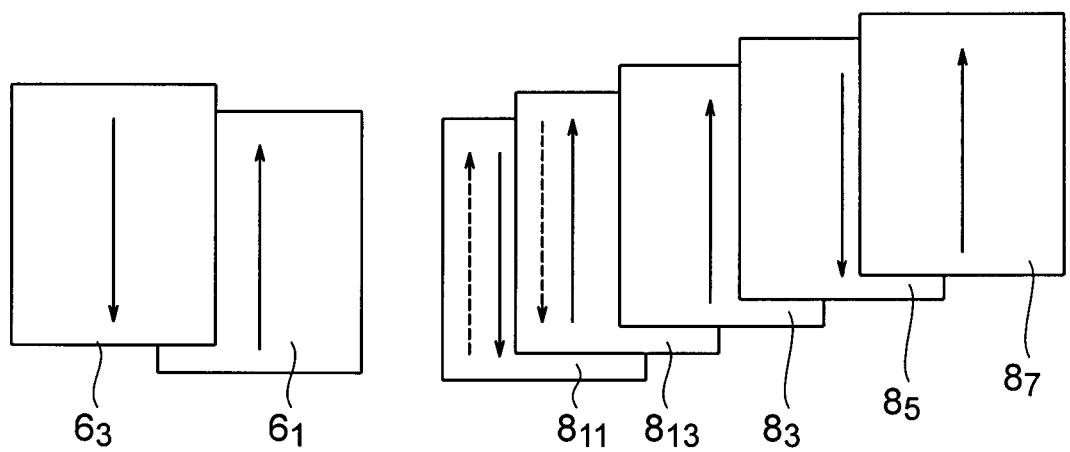
FIG. 24 shows the magnetization directions of the ferromagnetic layers of the first and second magnetic films of the spin MOSFET in accordance with the tenth embodiment.

FIG. 24 shows the magnetization directions of the ferromagnetic layers $6_1$ and $6_3$ of the first magnetic film 6A and the ferromagnetic layers $8_1$, $8_3$, $8_5$, and $8_7$ of the second magnetic film 8A in a case where the first specific example structure shown in FIG. 23B is employed as the second magnetic film 8A.

In a spin MOSFET of this embodiment, the magnetization direction of the ferromagnetic layer $6_1$ extends parallel to the magnetization direction of the ferromagnetic layer $8_3$, and the magnetization free layer has a synthetic structure. Therefore, a gate voltage that causes the positive magnetoresistance effect shown in FIG. 2A is used for writing, as in the ninth embodiment. In this manner, the spin torque is doubly applied onto the magnetization free layer at the time of writing, and the inversion current density at the time of the magnetization reversal caused by the spin injection can be reduced.

When reading is performed, a gate voltage that causes the positive magnetoresistance effect shown in FIG. 2A is used, as in the ninth embodiment. In this manner, the ratio of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $8_2$ may be made of the same material as the nonmagnetic layer $8_2$ of the first embodiment, which is Cu, Ag, Au, AlOx, MgO, or the like. The nonmagnetic layers $6_2$, $8_{12}$, and $8_4$ may be made of the same material as the nonmagnetic layer $8_4$ of the first embodiment, which is Ru, Rh, Ir, or the like.

Also, the ferromagnetic layers of the first and second magnetic films 6A and 8A may be made of the same materials as the first and second magnetic films 6 and 8 of the first embodiment.

Eleventh Embodiment

Figure 25:
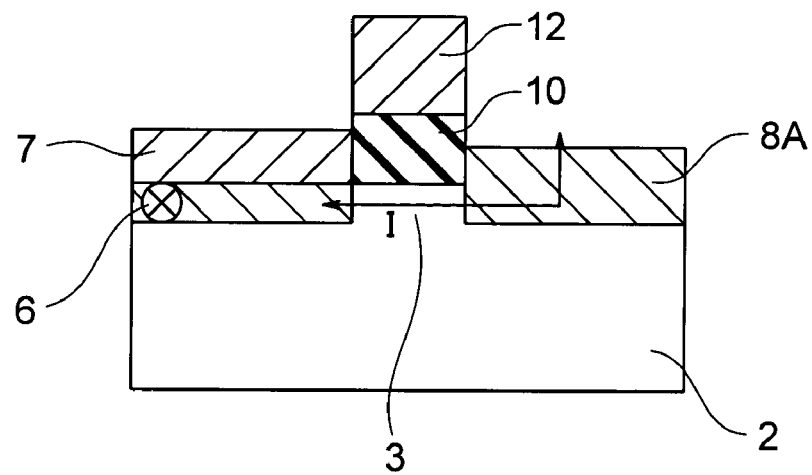
FIG. 25 is a cross-sectional view of a spin MOSFET in accordance with an eleventh embodiment.

FIG. 25 is a cross-sectional view of a spin MOSFET in accordance with an eleventh embodiment of the present invention. The spin MOSFET of this embodiment is a Schottky spin MOSFET, and is the same as the spin MOSFET of the ninth embodiment shown in FIG. 19, except that the tunnel insulating film 4 is removed from the structure.

Accordingly, a specific example structure of the second magnetic film 8A of this embodiment has the multilayer structure which has a synthetic magnetization free layer $8_1$ shown in FIG. 20A or 20B, like the second magnetic film 8A of the ninth embodiment. In a case where the second magnetic film 8A has the multilayer structure shown in FIG. 20A, the ferromagnetic layer of the first magnetic film 6 and the ferromagnetic layers $8_3$ and $8_5$ of the second magnetic film 8A have the magnetic directions shown in FIG. 21, as in the ninth embodiment.

As in the ninth embodiment, a gate voltage that causes the positive magnetoresistance effect shown in FIG. 2A is used for writing. In this manner, the inversion current density at the time of the magnetization reversal caused by spin injection can be reduced.

As in the ninth embodiment, when reading is performed, a gate voltage that causes the positive magnetoresistance effect shown in FIG. 2A is used. In this manner, the rate of magnetoresistance change of the multilayer structure is added to the rate of magnetoresistance change through the channel region 3. Accordingly, the reading output is greatly increased.

Like the first embodiment, this embodiment also provides a spin MOSFET that performs a spin reversal at a low current density and achieves large output characteristics through the spin reversal.

Twelfth Embodiment

Figure 26:
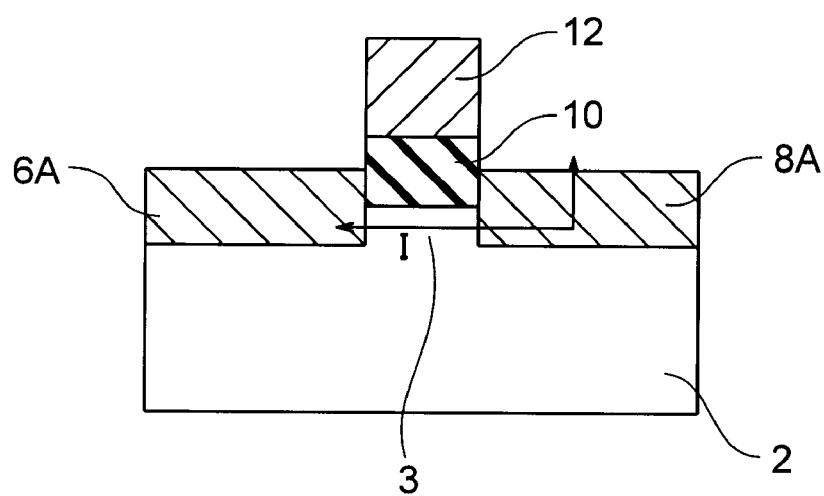
FIG. 26 is a cross-sectional view of a spin MOSFET in accordance with a twelfth embodiment.

FIG. 26 is a cross-sectional view of a spin MOSFET in accordance with a twelfth embodiment of the present invention. The spin MOSFET of this embodiment is a Schottky spin MOSFET, and is the same as the spin MOSFET of the tenth embodiment shown in FIG. 22, except that the tunnel insulating film 4 is removed from the structure.

Accordingly, as in the tenth embodiment, a specific example structure of the first magnetic film 6A of this embodiment has the multilayer structure shown in FIG. 23A, and a specific example structure of the second magnetic film 8A of this embodiment has the multilayer structure shown in FIG. 23B, 23C or 23D. In a case where the first magnetic film 6A has the multilayer structure shown in FIG. 23A, and the second magnetic film 8A has the multilayer structure shown in FIG. 23B, the ferromagnetic layers $6_1$ and $6_3$ of the first magnetic film 6A and the ferromagnetic layers $8_1$, $8_3$, $8_5$, and $8_7$ of the second magnetic film 8A have the magnetic directions shown in FIG. 24, as in the tenth embodiment.

As in the tenth embodiment, a gate voltage that causes the positive magnetoresistance effect shown in FIG. 2A is used for writing. In this manner, the inversion current density at the time of the magnetization reversal caused by spin injection can be reduced.

As in the second embodiment, when reading is performed, a gate voltage that causes the positive magnetoresistance effect shown in FIG. 2A is used. In this manner, the rate of magnetoresistance change of the multilayer structure is added to the rate of magnetoresistance change through the channel region 3. Accordingly, the reading output is greatly increased.

Like the tenth embodiment, this embodiment also provides a spin MOSFET that performs a spin reversal at a low current density and achieves large output characteristics through the spin reversal.

Thirteenth Embodiment

Figure 27:
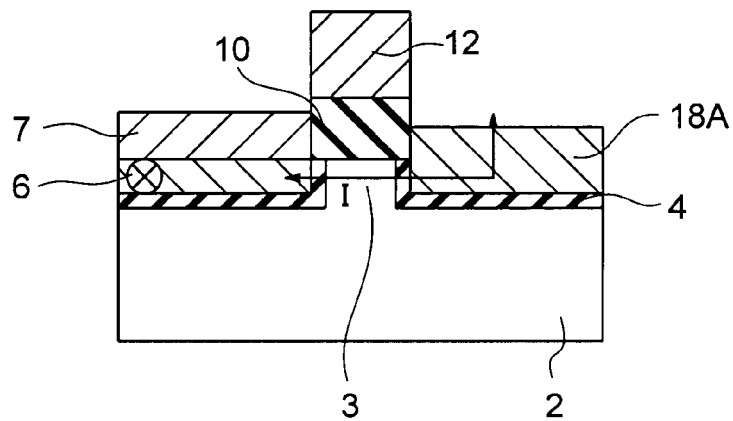
FIG. 27 is a cross-sectional view of a spin MOSFET in accordance with a thirteenth embodiment.

FIG. 27 is a cross-sectional view of a spin MOSFET in accordance with a thirteenth embodiment of the present invention. The spin MOSFET of this embodiment is the same as the spin MOSFET of the fifth embodiment shown in FIG. 11, except that the second magnetic film 18 is replaced with a second magnetic film 18A. In the second magnetic film 18A, the magnetization free layer $18_1$ formed with a single-layer ferromagnetic layer is replaced with a synthetic magnetization free layer $18_1$.

Figure 28A:
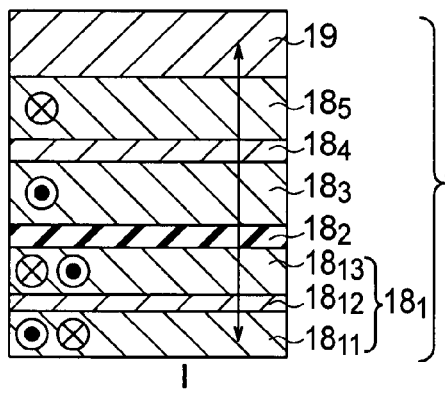
FIGS. 28A and 28B are cross-sectional views showing example structures of the second magnetic film of the spin MOSFET in accordance with the thirteenth embodiment.

As shown in FIG. 28A, a first specific example of the second magnetic film 18A includes a magnetization free layer $18_1$, in which a magnetization direction is changeable, that is formed with a ferromagnetic layer $18_{11}$, a nonmagnetic layer $18_{12}$, and a ferromagnetic layer $18_{13}$, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, and an antiferromagnetic layer 19, which are stacked in this order. In this first specific example structure, the ferromagnetic layer $18_{11}$, the nonmagnetic layer $18_{12}$, and the ferromagnetic layer $18_{13}$ constitute the synthetic magnetization free layer $18_1$. Also, the ferromagnetic layer $18_{11}$ and the ferromagnetic layer $18_{13}$ are antiferromagnetically coupled via the nonmagnetic layer $18_{12}$.

The ferromagnetic layer $18_3$, the nonmagnetic layer $18_4$, and the ferromagnetic layer $18_5$ constitute a synthetic magnetization pinned layer, and the magnetization direction of the magnetization pinned layer is pinned by the antiferromagnetic layer 19. Also, the ferromagnetic layer $18_3$ and the ferromagnetic layer $18_5$ are antiferromagnetically coupled via the nonmagnetic layer $18_4$. In this case, the synthetic magnetization pinned layer can be more firmly pinned, and excellent device stability can be achieved. In a spin MOSFET having the first specific example structure as the second magnetic film 18A, the antiferromagnetic layer 7 and the antiferromagnetic layer 19 may be made of the same material, and the magnetization directions of the ferromagnetic layer of the first magnetic film 6 and the ferromagnetic layer $18_3$ of the second magnetic film 18A can be fixed simply by the annealing performed for fixing magnetization directions.

Figure 28B:
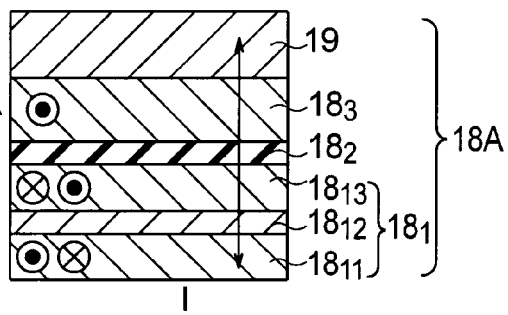

FIG. 28B shows a second specific example of the second magnetic film 18A. The second magnetic film 18A of the second specific example includes a ferromagnetic layer (a magnetization free layer) $18_1$ in which a magnetization direction is changeable, a nonmagnetic layer $18_2$, a ferromagnetic layer $18_3$ in which a magnetization direction is pinned, and an antiferromagnetic layer 19, which are stacked in this order. In a spin MOSFET having the second specific example structure as the second magnetic film 18A, the antiferromagnetic layer 7 and the antiferromagnetic layer 19 need be formed with different materials from each other, and it is necessary to reverse the magnetic field 180 degrees by the annealing performed for fixing magnetization directions.

Figure 29:
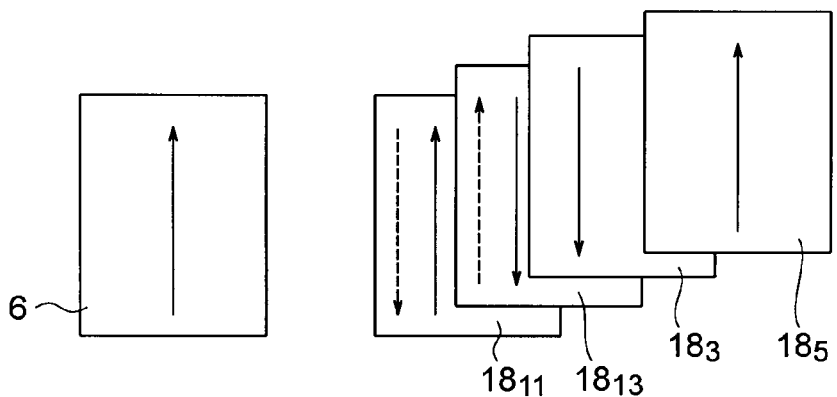
FIG. 29 shows the magnetization directions of the ferromagnetic layers of the first and second magnetic films of the spin MOSFET in accordance with the thirteenth embodiment.

FIG. 29 shows the magnetization directions of the ferromagnetic layer of the first magnetic film 6 and the ferromagnetic layers $18_1$, $18_3$, and $18_5$ of the second magnetic film 18A in a case where the first specific example structure shown in FIG. 28A is employed as the second magnetic film 18A.

In a spin MOSFET of this embodiment, the magnetization direction of the ferromagnetic layer of the first magnetic film 6 extends antiparallel to the magnetization direction of the ferromagnetic layer $18_3$, and the ferromagnetic layer $18_1$ serving as a magnetization free layer has a synthetic structure formed with the ferromagnetic layer $18_{11}$, the nonmagnetic layer $18_{12}$, and the ferromagnetic layer $18_{13}$. Therefore, a gate voltage that causes the negative magnetoresistance effect shown in FIG. 2B is used for writing and reading. In other words, a gate voltage that does not change the spin direction of spin-polarized electrons when the electrons are passing through the channel 3 is used.

In this embodiment, the magnetization direction of the ferromagnetic layer $18_3$ has the spin arrangement shown in FIG. 29, or the spin arrangement opposite (antiparallel) to the magnetization direction of the ferromagnetic layer serving as the magnetization pinned layer of the first magnetic film 6. Accordingly, in a case where the spin direction of the ferromagnetic layer $18_{11}$ serving as a magnetization free layer extends parallel to the spin direction of the first magnetic film 6, spin-polarized electrons are injected into the channel 3 from the first magnetic film 6, so that the spin direction of the spin-polarized electrons is not changed, and the spin-polarized electrons reach the ferromagnetic layer $18_{13}$ through the ferromagnetic layer $18_{11}$. In this manner, the spin torque is applied onto the ferromagnetic layer $18_{13}$. Further, the electrons having passed through the ferromagnetic layer $18_{13}$ and reached the ferromagnetic layer $18_3$ are reflected by the ferromagnetic layer $18_3$ and flow back into the ferromagnetic layer $18_{13}$. As a result, the spin torque is again applied onto the ferromagnetic layer $18_{13}$. Accordingly, the spin torque is doubly applied onto the magnetization free layer, and the inversion current density at the time of the magnetization reversal caused by the spin injection can be reduced.

Meanwhile, in a case where the spin direction of the ferromagnetic layer $18_{11}$ serving as a magnetization free layer extends antiparallel to the spin direction of the first magnetic film 6, spin-polarized electrons are injected from the ferromagnetic layer $18_3$ into the magnetization free layer, so that the spin-polarized electrons reach the ferromagnetic layer $18_{13}$, and the spin torque is applied onto the ferromagnetic layer $18_{13}$. Further, the electrons having reached the ferromagnetic layer $18_{13}$ then reach the ferromagnetic layer 6 through the ferromagnetic layer $18_{11}$, and the channel 3, and are reflected by the ferromagnetic layer 6. The reflected electrons pass through the channel 3 and the ferromagnetic layer $18_{11}$, and then reach the ferromagnetic layer $18_{13}$. Accordingly, the spin torque is doubly applied onto the magnetization free layer, and the inversion current density at the time of the magnetization reversal caused by the spin injection can be reduced. Thus, with the use of a gate voltage that causes a negative magnetoresistance effect at the time of writing, the spin torque is doubly applied to the magnetization free layer, and the inversion current density at the time of the magnetization reversal caused by the spin injection can be reduced.

When reading is performed in the spin arrangement shown in FIG. 21, the spin direction of electrons passing through the channel 3 is not changed. Accordingly, in a case where the spin direction of the ferromagnetic layer $18_{11}$ serving as a magnetization free layer extends parallel to the spin direction of the first magnetic film 6, the resistance of the channel 3 is lower than in a case where the spin direction of the electrons passing through the channel 3 is changed (where a gate voltage that causes a positive magnetoresistance effect is used). Here, the magnetization direction of the ferromagnetic layer $18_{13}$ extends parallel to the magnetization direction of the ferromagnetic layer $18_3$. Accordingly, the resistance between the ferromagnetic layers $18_{13}$ and $18_3$ is lower than in a case where the magnetization direction of the ferromagnetic layer $18_{13}$ extends antiparallel to the magnetization direction of the ferromagnetic layer $18_3$.

Meanwhile, in a case where the spin direction of the ferromagnetic layer $18_{11}$ serving as a magnetization free layer extends antiparallel to the spin direction of the first magnetic film 6, the resistance of the channel 3 is higher than in a case where the spin direction of the electrons passing through the channel 3 is rotated 180 degrees (where a gate voltage that causes a positive magnetoresistance effect is used). Here, the magnetization direction of the ferromagnetic layer $18_{13}$ extends antiparallel to the magnetization direction of the ferromagnetic layer $18_3$. Accordingly, the resistance between the ferromagnetic layers $18_{13}$ and $18_3$ is higher than in a case where the magnetization direction of the ferromagnetic layer $18_{13}$ extends parallel to the magnetization direction of the ferromagnetic layer $18_3$.

As described above, as a gate voltage that causes a negative magnetoresistance effect is used for reading in this embodiment, the difference between the resistance of the channel 3 and the total resistance between the ferromagnetic layers $18_{13}$ and $18_3$ in a case where the magnetization direction of the magnetization free layer is changed is larger than in a case where a gate voltage that causes a positive magnetoresistance effect is used. The rate of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $18_2$ may be made of the same material as the nonmagnetic layer $8_2$ of the first embodiment, which is Cu, Ag, Au, AlOx, MgO, or the like. The nonmagnetic layer $18_4$ may be made of the same material as the nonmagnetic layer $8_4$ of the first embodiment, which is Ru, Rh, Ir, or the like.

Also, the ferromagnetic layers of the first and second magnetic films 6 and 18A may be made of the same materials as the first and second magnetic films 6 and 18A of the first embodiment.

Fourteenth Embodiment

Figure 30:
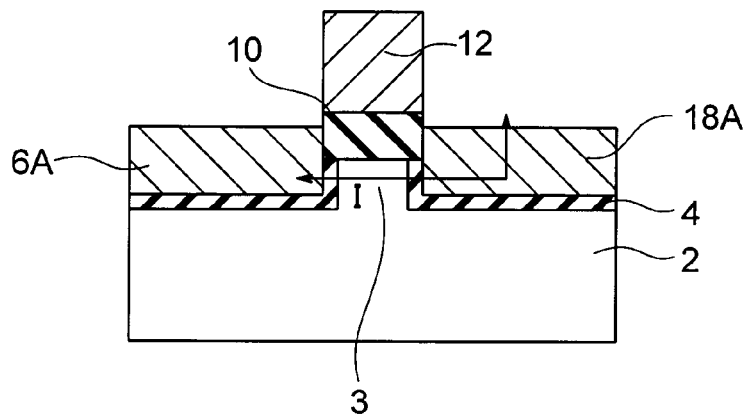
FIG. 30 is a cross-sectional view of a spin MOSFET in accordance with a fourteenth embodiment.

FIG. 30 is a cross-sectional view of a spin MOSFET in accordance with a fourteenth embodiment of the present invention. The spin MOSFET of this embodiment is the same as the spin MOSFET of the sixth embodiment shown in FIG. 14, except that the second magnetic film 18 is replaced with a second magnetic film 18A. In this second magnetic film 18A, the magnetization free layer $18_1$ formed with a single ferromagnetic layer 18 is replaced with a synthetic magnetization free layer $18_1$.

Figure 31A:
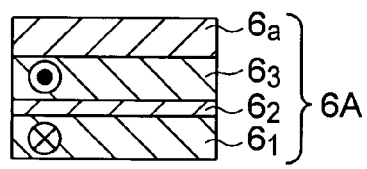
FIGS. 31A through 31D are cross-sectional views showing example structures of the first and second magnetic films of the spin MOSFET in accordance with the fourteenth embodiment.

The first magnetic film 6A of this embodiment has a stacked structure of a synthetic magnetization pinned layer and an antiferromagnetic layer 6a. As shown in FIG. 31A, the magnetization pinned layer has a stacked structure formed with a ferromagnetic layer $6_1$, a nonmagnetic layer $6_2$, and a ferromagnetic layer $6_3$, and the antiferromagnetic layer 6a pins the magnetization direction of the magnetization pinned layer. The ferromagnetic layer $6_1$ and the ferromagnetic layer $6_3$ are antiferromagnetically coupled to each other via the nonmagnetic layer $6_2$.

Figure 31B:
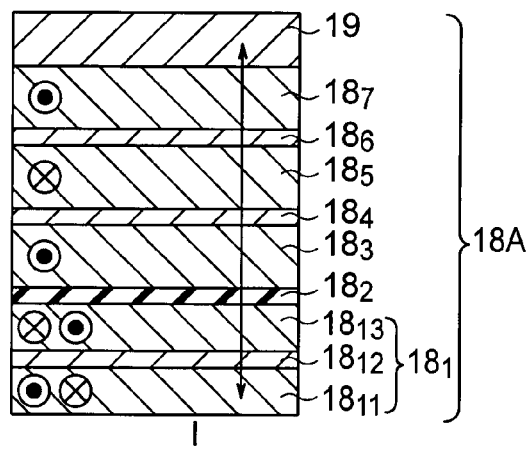

FIG. 31B shows a first specific example of the second magnetic film 18A of this embodiment. The second magnetic film 18A includes a magnetization free layer $18_1$, in which a magnetization direction is changeable, that is formed with a ferromagnetic layer $18_{11}$, a nonmagnetic layer $18_{12}$, and a ferromagnetic layer $18_{13}$, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, a nonmagnetic layer $18_6$, a ferromagnetic layer $18_7$ in which a magnetization direction is pinned, and an antiferromagnetic layer 19, which are stacked in this order.

In this first specific example structure, the ferromagnetic layer $18_{11}$, the nonmagnetic layer $18_{12}$, and the ferromagnetic layer $18_{13}$ constitute the magnetization free layer $8_1$. The ferromagnetic layer $18_{11}$ and the ferromagnetic layer $18_{13}$ are antiferromagnetically coupled via the nonmagnetic layer $18_{12}$.

Also, the ferromagnetic layer $18_3$, the nonmagnetic layer $18_4$, the ferromagnetic layer $18_5$, the nonmagnetic layer $18_6$, and the ferromagnetic layer $18_7$ constitute a synthetic magnetization pinned layer, and the magnetization direction of the magnetization pinned layer is pinned by the antiferromagnetic layer 19. Also, the ferromagnetic layer $18_3$, the ferromagnetic layer $18_5$, and the ferromagnetic layer $18_7$ are antiferromagnetically coupled via the nonmagnetic layer $18_4$ and the nonmagnetic layer $18_6$. In this case, the synthetic magnetization pinned layer can be more firmly pinned, and excellent device stability can be achieved. In a spin MOSFET having the first specific example structure as the second magnetic film 18A, the antiferromagnetic layer 6a and the antiferromagnetic layer 19 may be made of the same material. The magnetization directions of the ferromagnetic layers $6_1$ and $6_3$ of the first magnetic film 6A and the ferromagnetic layers $18_3$, $18_5$, and $18_7$ of the second magnetic film 18A can be pinned simply by the annealing performed for pinning magnetization directions.

Figure 31C:
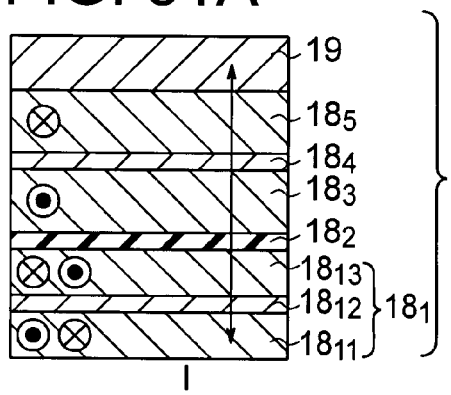

FIG. 31C shows a second specific example of the second magnetic film 18A. The second magnetic film 18A of the second specific example includes a magnetization free layer $18_1$, in which a magnetization direction is changeable, that is formed with a ferromagnetic layer $18_{11}$, a nonmagnetic layer $18_{12}$, and a ferromagnetic layer $18_{13}$, a nonmagnetic layer $18_2$, a ferromagnetic layer $18_3$ in which a magnetization direction is pinned, a nonmagnetic layer $18_4$, a ferromagnetic layer $18_5$ in which a magnetization direction is pinned, and an antiferromagnetic layer 19, which are stacked in this order. In this second specific example structure, the ferromagnetic layer $18_3$, the nonmagnetic layer $18_4$, and the ferromagnetic layer $18_5$ constitute a synthetic magnetization pinned layer, and the magnetization direction of the magnetization pinned layer is pinned by the antiferromagnetic layer 19. Also, the ferromagnetic layer $18_3$ and the ferromagnetic layer $18_5$ are antiferromagnetically coupled via the nonmagnetic layer $18_4$. In this case, the synthetic magnetization pinned layer can be more firmly pinned, and excellent device stability can be achieved. In a spin MOSFET having the second specific example structure as the second magnetic film 18A, the antiferromagnetic layer 6a and the antiferromagnetic layer 19 need to be made of different materials from each other, and it is necessary to reverse the magnetic field 180 degrees by the annealing performed for pinning magnetization directions.

Figure 31D:
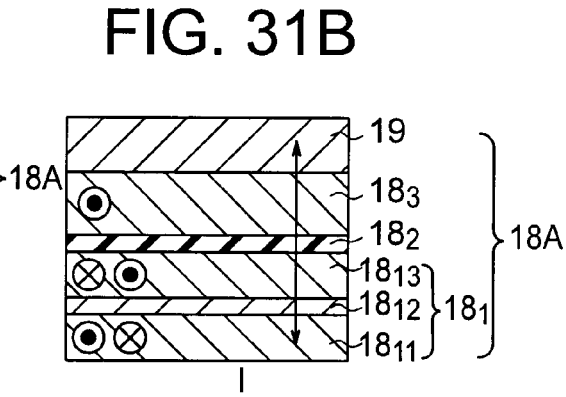

FIG. 31D shows a third specific example of the second magnetic film 18A. The second magnetic film 18A of the third specific example includes a magnetization free layer $18_1$, in which a magnetization direction is changeable, that is formed with a ferromagnetic layer $18_{11}$, a nonmagnetic layer $18_{12}$, and a ferromagnetic layer $18_{13}$, a nonmagnetic layer $18_2$, a ferromagnetic layer $18_3$ in which a magnetization direction is pinned, and an antiferromagnetic layer 19, which are stacked in this order. In a spin MOSFET having the third specific example structure as the second magnetic film 18A, the antiferromagnetic layer 6a and the antiferromagnetic layer 19 may be made of the same material, and the magnetization directions of the ferromagnetic layers $6_1$ and $6_3$ of the first magnetic film 6A and the ferromagnetic layer $18_3$ of the second magnetic film 18A can be pinned simply by the annealing performed for pinning magnetization directions.

Figure 32:
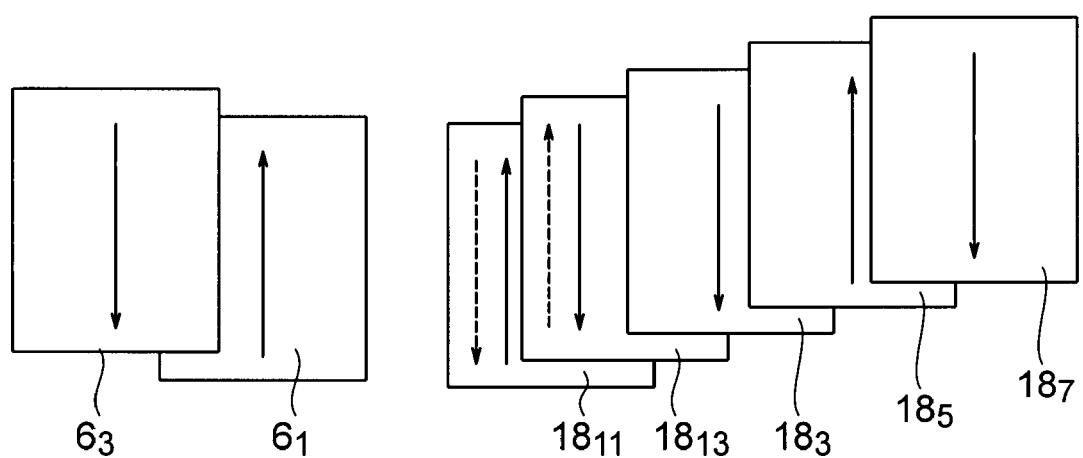
FIG. 32 shows the magnetization directions of the ferromagnetic layers of the first and second magnetic films of the spin MOSFET in accordance with the fourteenth embodiment.

FIG. 32 shows the magnetization directions of the ferromagnetic layers $6_1$ and $6_3$ of the first magnetic film 6A and the ferromagnetic layers $18_{11}$, $18_{12}$, $18_3$, $18_5$, and $18_7$ of the second magnetic film 18A in a case where the first specific example structure shown in FIG. 31B is employed as the second magnetic film 18A.

In a spin MOSFET of this embodiment, a gate voltage that causes the negative magnetoresistance effect shown in FIG. 2B is used for writing, as in the thirteenth embodiment. In this manner, the spin torque is doubly applied onto the magnetization free layer $18_1$, and the inversion current density at the time of the magnetization reversal caused by the spin injection can be reduced.

When reading is performed, a gate voltage that causes the negative magnetoresistance effect shown in FIG. 2B is used, as in the thirteenth embodiment. In this manner, the ratio of magnetoresistance change of the multilayer structure is added to the rate of magnetoresistance change through the channel region 3. Accordingly, the reading output is greatly increased.

As described above, this embodiment provides a spin MOSFET that performs a spin reversal at a low current density and achieves large output characteristics through the spin reversal.

In this embodiment, the nonmagnetic layer $18_2$ may be made of the same material as the nonmagnetic layer $8_2$ of the first embodiment, which is Cu, Ag, Au, AlOx, MgO, or the like. The nonmagnetic layers $6_2$, $8_4$, and $8_6$ may be made of the same material as the nonmagnetic layer $8_4$ of the first embodiment, which is Ru, Rh, Ir, or the like.

Also, the ferromagnetic layers of the first and second magnetic films 6A and 18A may be made of the same materials as the first and second magnetic films 6 and 8 of the first embodiment.

Fifteenth Embodiment

Figure 33:
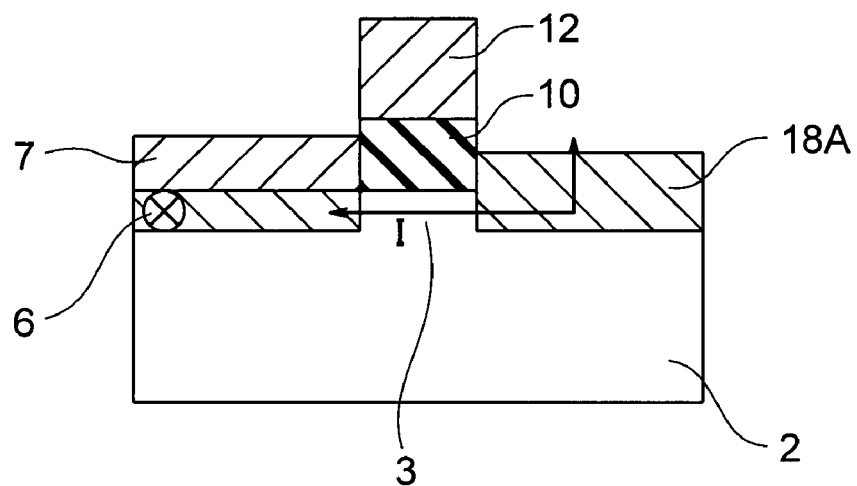
FIG. 33 is a cross-sectional view of a spin MOSFET in accordance with a fifteenth embodiment.

FIG. 33 is a cross-sectional view of a spin MOSFET in accordance with a fifteenth embodiment of the present invention. The spin MOSFET of this embodiment is a Schottky spin MOSFET, and is the same as the spin MOSFET of the thirteenth embodiment shown in FIG. 27, except that the tunnel insulating film 4 is removed from the structure.

Accordingly, a specific example structure of the second magnetic film 18A of this embodiment has the multilayer structure shown in FIG. 28A or 28B, like the second magnetic film 18A of the thirteenth embodiment. In a case where the second magnetic film 18A has the multilayer structure shown in FIG. 28A, the ferromagnetic layer 6 of the first magnetic film 6 and the ferromagnetic layers $18_{11}$, $18_{13}$, $18_3$, and $18_5$ of the second magnetic film 18A have the magnetic directions shown in FIG. 29, as in the thirteenth embodiment.

As in the thirteenth embodiment, a gate voltage that causes the negative magnetoresistance effect shown in FIG. 2B is used for writing. In this manner, the inversion current density at the time of the magnetization reversal caused by spin injection can be reduced.

As in the thirteenth embodiment, when reading is performed, a gate voltage that causes the negative magnetoresistance effect shown in FIG. 2B is used. In this manner, the rate of magnetoresistance change of the multilayer structure is added to the ratio of magnetoresistance change through the channel region 3. Accordingly, the reading output is greatly increased.

Like the thirteenth embodiment, this embodiment also provides a spin MOSFET that performs a spin reversal at a low current density and achieves large output characteristics through the spin reversal.

Sixteenth Embodiment

Figure 34:
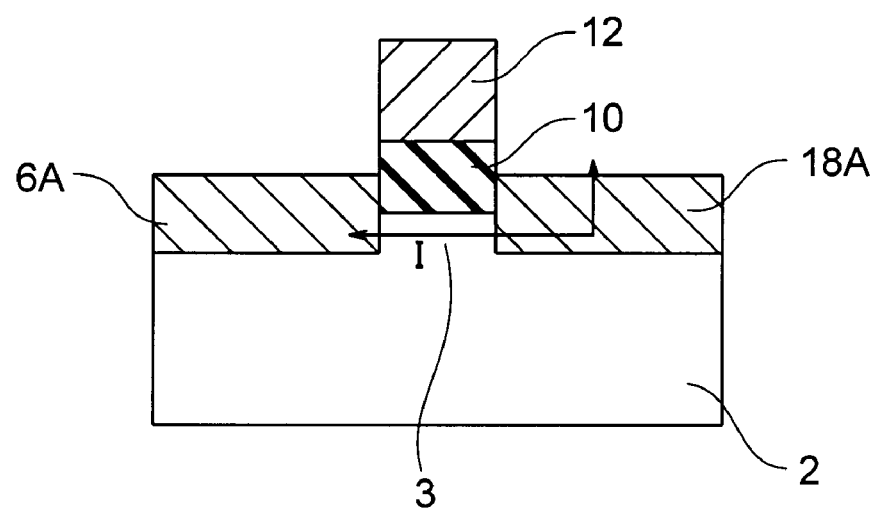
FIG. 34 is a cross-sectional view of a spin MOSFET in accordance with a sixteenth embodiment.

FIG. 34 is a cross-sectional view of a spin MOSFET in accordance with a sixteenth embodiment of the present invention. The spin MOSFET of this embodiment is a Schottky spin MOSFET, and is the same as the spin MOSFET of the fourteenth embodiment shown in FIG. 30, except that the tunnel insulating film 4 is removed from the structure.

Accordingly, as in the fourteenth embodiment, a specific example structure of the first magnetic film 6A of this embodiment has the multilayer structure shown in FIG. 31A, and a specific example structure of the second magnetic film 18A of this embodiment have the multilayer structure shown in FIG. 31B, 31C or 31D. In a case where the first magnetic film 6A has the multilayer structure shown in FIG. 31A, and the second magnetic film 18 has the multilayer structure shown in FIG. 31B, the ferromagnetic layers $6_1$ and $6_3$ of the first magnetic film 6A and the ferromagnetic layers $18_{11}$, $18_{13}$, $18_3$, $18_5$, and $18_7$ of the second magnetic film 18A have the magnetic directions shown in FIG. 32, as in the fourteenth embodiment.

As in the fourteenth embodiment, a gate voltage that causes the negative magnetoresistance effect shown in FIG. 2B is used for writing. In this manner, the inversion current density at the time of the magnetization reversal caused by spin injection can be reduced.

As in the fourteenth embodiment, when reading is performed, a gate voltage that causes the negative magnetoresistance effect shown in FIG. 2B is used. In this manner, the rate of magnetoresistance change of the multilayer structure is added to the rate of magnetoresistance change through the channel region 3. Accordingly, the reading output is greatly increased.

Like the fourteenth embodiment, this embodiment also provides a spin MOSFET that performs a spin reversal at a low current density and achieves large output characteristics through the spin reversal.

Seventeenth Embodiment

Figure 35:
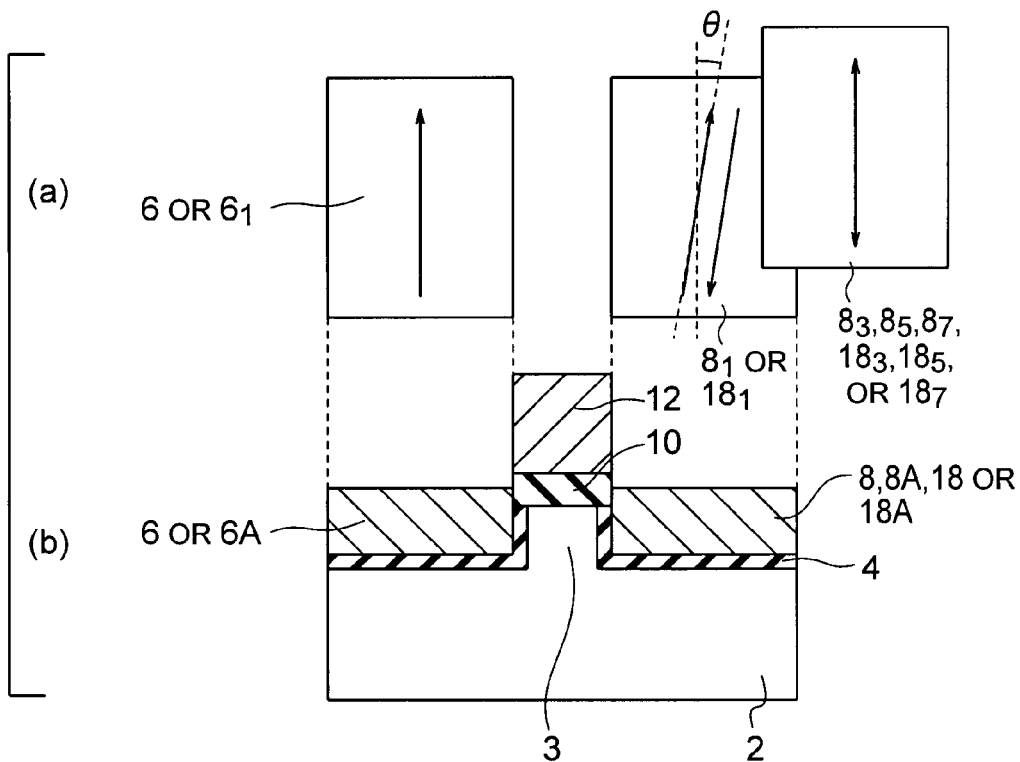
FIGS. 35(*a*) and 35(*b*) show a spin MOSFET in accordance with a seventeenth embodiment.

FIGS. 35($a$) and 35($b$) illustrate a spin MOSFET in accordance with a seventeenth embodiment of the present invention. FIG. 35($a$) shows the magnetization directions of the ferromagnetic layer 6 or $6_1$ on the semiconductor substrate side of the first magnetic film 6 or 6A, and the magnetization free layer $8_1$ or $18_1$ and a magnetization pinned layer of the second magnetic film 8, 8A, 18, or 18A. FIG. 35($b$) is a cross-sectional view of the spin MOSFET of this embodiment.

The spin MOSFET of this embodiment has the same structure as any of the first, second, fifth, sixth, ninth, tenth, thirteenth, and fourteenth embodiments, except that the magnetization direction of the magnetization free layer $8_1$ or $18_1$ of the second magnetic film 8, 8A, 18, or 18A is inclined at a θ degree angle in the range of a 0 degree angle to a 45 degree angle with respect to the magnetization direction of the ferromagnetic layer 6 or $6_1$ of the first magnetic film 6 or 6A on the side of the semiconductor substrate 2. In this structure, the magnetization direction of the magnetization free layer $8_1$ or $18_1$ of the second magnetic film 8, 8A, 18, or 18A is inclined at a θ degree angle also with respect to the magnetization direction of the magnetization pinned layers of the second magnetic film 8, 8A, 18, or 18A.

As the magnetization direction of the magnetization free layer $8_1$ or $18_1$ of the second magnetic film 8, 8A, 18, or 18A is inclined at a θ degree angle in the range of a 0 degree angle to a 45 degree angle with respect to the magnetization direction of the ferromagnetic layer 6 or $6_1$ of the first magnetic film 6 or 6A on the side of the semiconductor substrate 2, the inversion current density at the time of a magnetization reversal caused by a spin injection can be reduced.

This embodiment of course also provides a spin MOSFET that performs a spin reversal at a low current density and achieves large output characteristics through the spin reversal.

The magnetization (magnetic moment) direction of the magnetization free layer $8_1$ or $18_1$ may be inclined by a technique that utilizes separately-prepared wirings to induce a current magnetic field, a technique that utilizes a self-magnetic field induced by the wirings for allowing a reading wiring current to flow, or a technique of inclining the field direction toward a desired direction at a temperature equal to or lower than the blocking temperature at which the magnetic moment of the magnetization pinned layer is fixed at the time of field annealing performed to fix the spin moment of the magnetization pinned layer.

Figure 36:
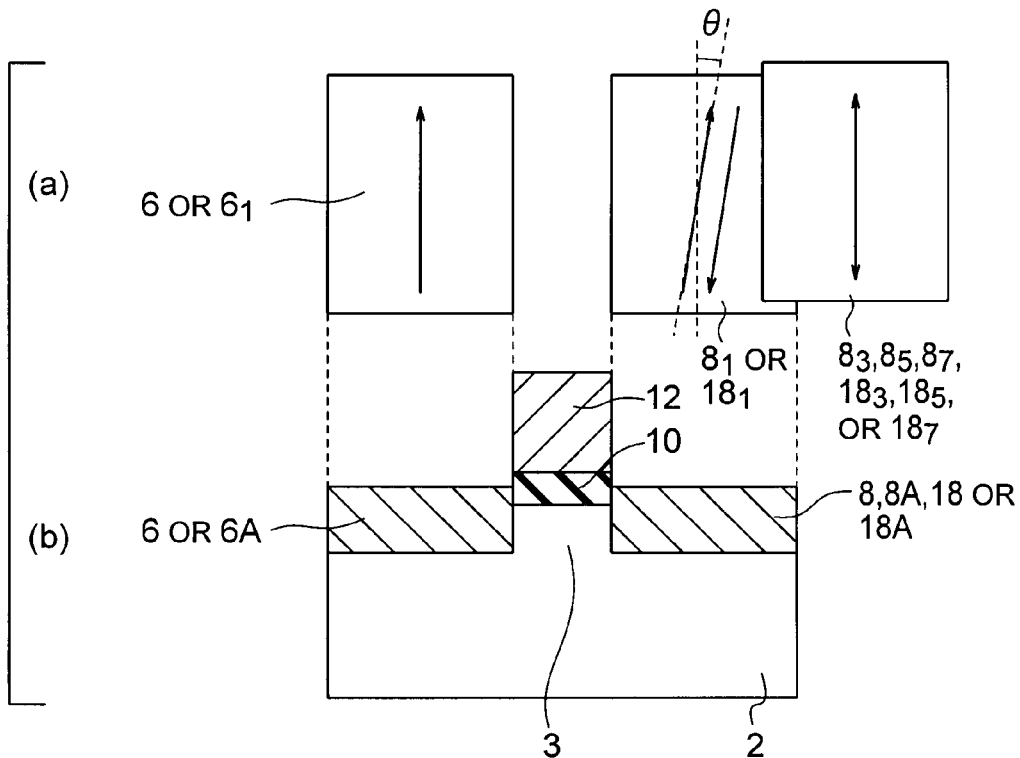
FIGS. 36(*a*) and 36(*b*) show a spin MOSFET in accordance with a first modification of the seventeenth embodiment.

As a first modification of this embodiment, the tunnel insulating film 4 may be removed from the Schottky spin MOSFET of this embodiment, as shown in FIGS. 36(*a*) and 36(*b*).

Figure 37:
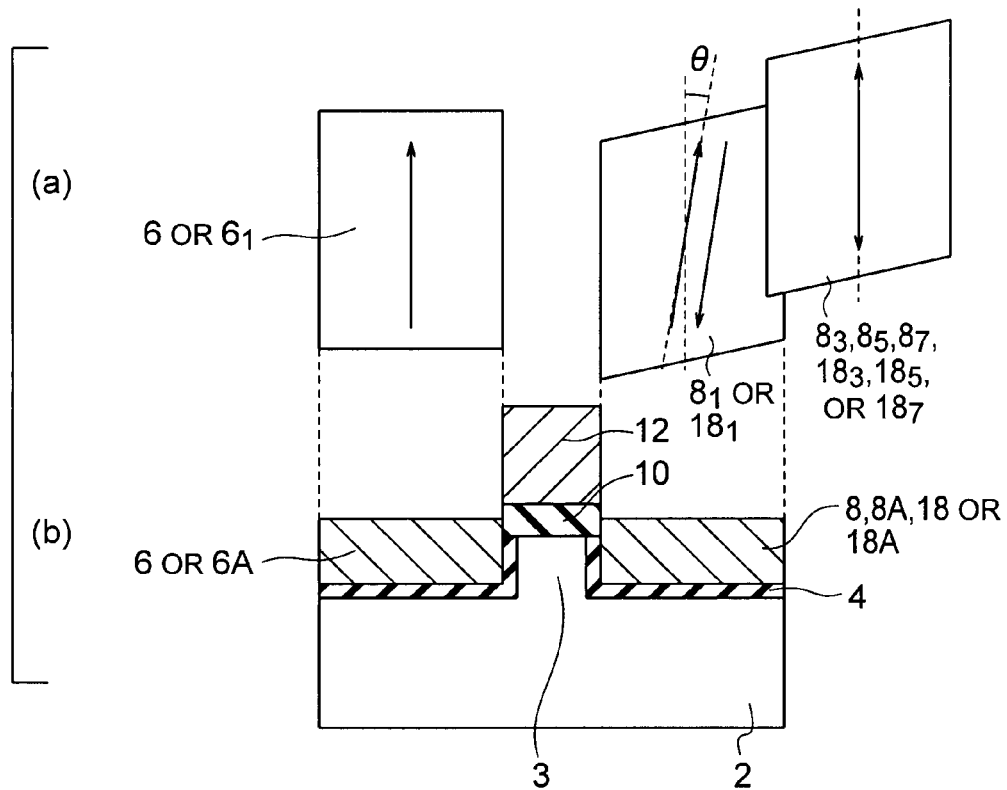
FIGS. 37(*a*) and 37(*b*) show a spin MOSFET in accordance with a second modification of the seventeenth embodiment.

FIGS. 37(*a*) and 37(*b*) show a spin MOSFET in accordance with a second modification of this embodiment. The spin MOSFET of this modification has the same structure as the spin MOSFET of the seventeenth embodiment, except that the film-plane shape of the second magnetic film 8, 8A, 18, or 18A is of a parallelogram. In practice, the second magnetic film 8, 8A, 18, or 18A may have the shape of a parallelogram having its corners rounded.

Figure 38:
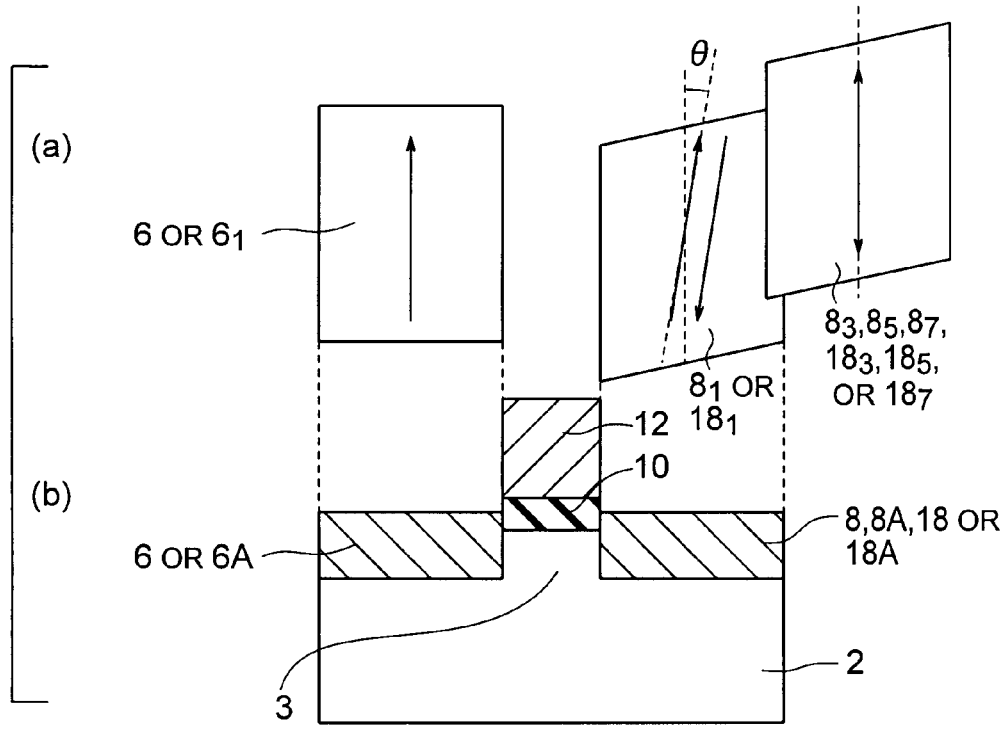
FIGS. 38(*a*) and 38(*b*) show a spin MOSFET in accordance with a third modification of the seventeenth embodiment.

FIGS. 38(*a*) and 38(*b*) show a spin MOSFET in accordance with a third embodiment of this embodiment. The spin MOSFET of this modification is the same as the Schottky spin MOSFET of the second modification, except that the tunnel insulating film 4 is removed from the structure.

Figure 39:
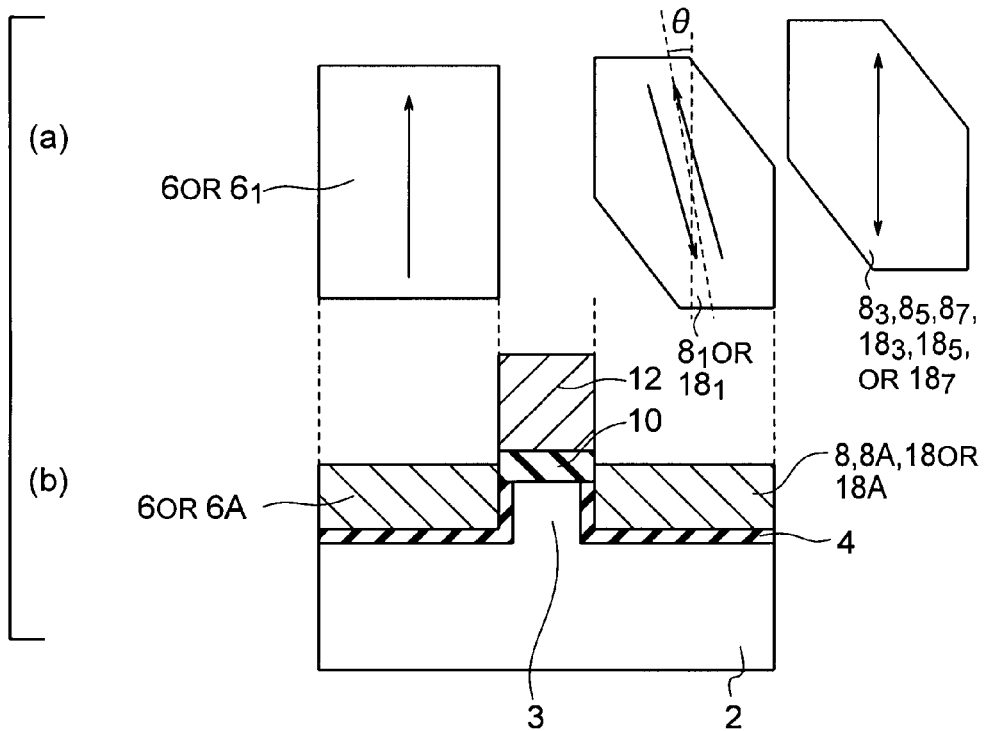
FIGS. 39(*a*) and 39(*b*) show a spin MOSFET in accordance with a fourth modification of the seventeenth embodiment.

FIGS. 39(*a*) and 39(*b*) show a spin MOSFET in accordance with a fourth embodiment of this embodiment. The spin MOSFET of this modification has the same structure as the spin MOSFET of the seventeenth embodiment, except that the second magnetic film 8, 8A, 18, or 18A has a hexagonal shape in the film plane. In practice, the second magnetic film 8, 8A, 18, or 18A may have a hexagonal shape having its corners rounded.

Figure 40:
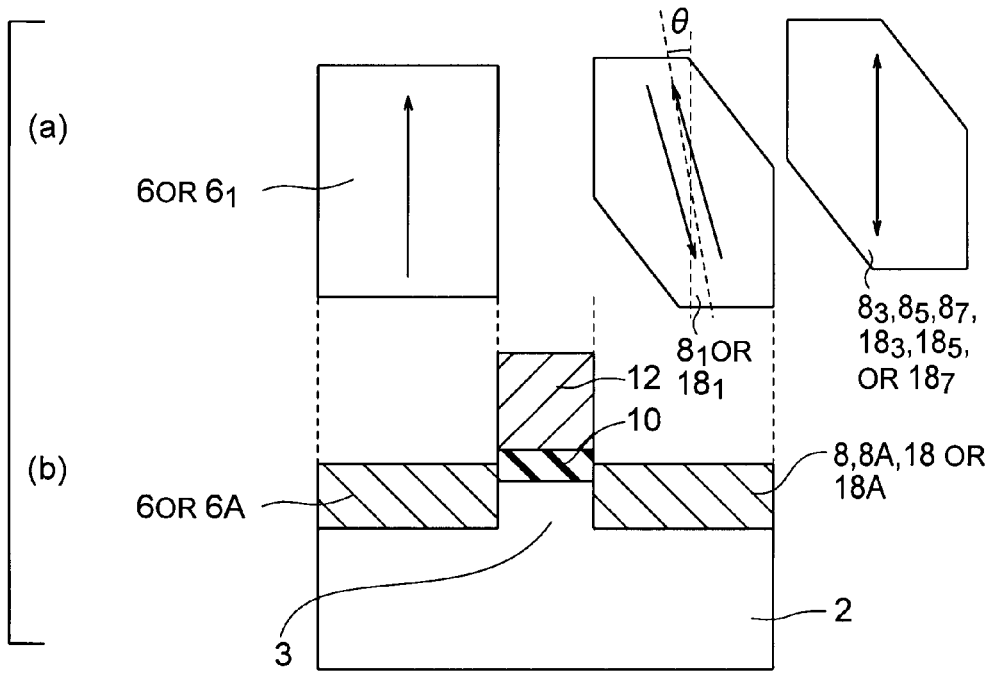
FIGS. 40(*a*) and 40(*b*) show a spin MOSFET in accordance with a fifth modification of the seventeenth embodiment.

FIGS. 40(*a*) and 40(*b*) show a spin MOSFET in accordance with a fifth embodiment of this embodiment. The spin MOSFET of this modification is the same as the Schottky spin MOSFET of the fourth modification, except that the tunnel insulating film 4 is removed from the structure.

Like the seventeenth embodiment, each of the first through fifth modifications can further reduce the current density of the magnetization reversal due to spin injection, and provides a spin MOSFET that achieves large output characteristics through the spin reversal.

Figure 41:
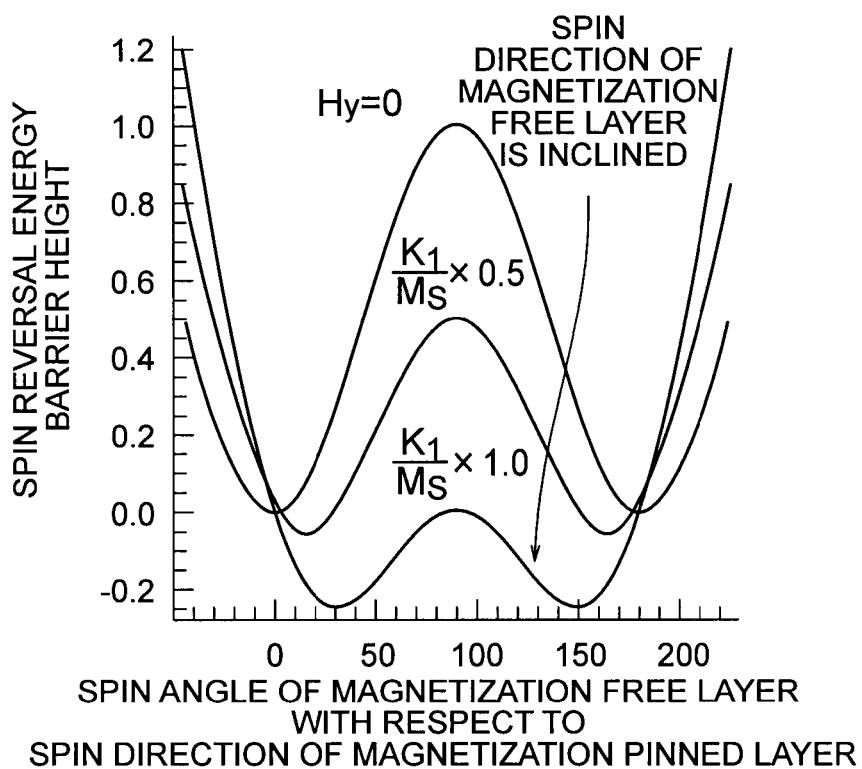
FIG. 41 shows the inclination angle dependence of the spin reversal energy barrier of the magnetization free layer.
Figure 42:
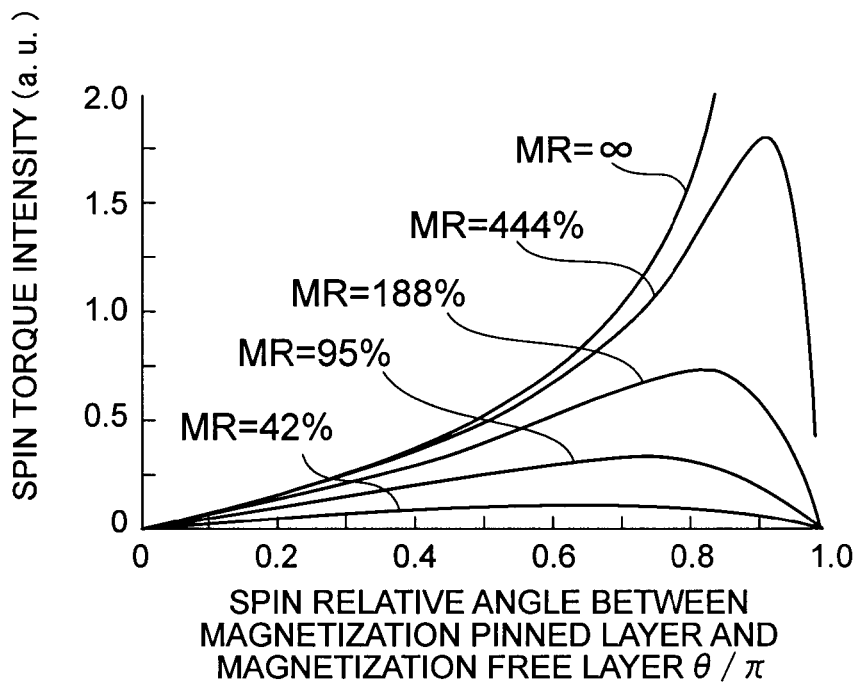
FIG. 42 shows the inclination angle dependence of the spin torque.

In each of this embodiment and the first through fifth modifications, the magnetization direction of the magnetization free layer $8_1$ or $18_1$ of the second magnetic film 8, 8A, 18, or 18A is inclined at a θ degree angle in the range of a 0 degree angle to a 45 degree angle with respect to the magnetization direction of the ferromagnetic layer 6 or $6_1$ of the first magnetic film 6 or 6A on the side of the semiconductor substrate 2. With this arrangement, the energy barrier required for a reversal can be lowered, as shown in FIG. 41. Also, the spin torque efficiency can be increased, as shown in FIG. 42. In FIG. 41, Hy represents the magnetic field intensity in the axial direction in which magnetization of the free magnetization is difficult, $K_1$ represents the intensity of the uniaxial anisotropy of the magnetization free layer, and $M_s$ represents the intensity of magnetization. In FIG. 41, $((K_1/M_s)\times 0.5)$ and $((K_1/M_s)\times 1.0)$ are values of Hy. Accordingly, the characteristics graph shown in FIG. 41 has the value of Hy as a parameter. As can be seen from the characteristics graph shown in FIG. 41, in the case where the spin of the magnetization pinned layer of the first magnetic film is at an angle of 90 degrees with respect to the spin of the magnetization free layer of the second magnetic film, the spin reversal energy barrier is high. Therefore, the value of Hy is increased, or the spin direction of the magnetization free layer of the second magnetic film is inclined with respect to the magnetization pinned layer of the first magnetic film, so as to lower the energy barrier required for a reversal and to easily perform a reversal. Particularly, where the inclination angle θ is in the range of 0 to 45 degrees (inclined from a parallel state) or where the inclination angle θ is in the range of 135 to 180 degrees (inclined from an antiparallel state), the spin reversal energy barrier is low.

As can be seen from FIG. 42, where MR is 95% or higher and the inclination angle θ is in the range of 135 to 180 degrees (inclined from an antiparallel state), the spin torque intensity increases. Where the inclination angle θ is in the range of 0 to 45 degrees (inclined from a parallel state), the spin torque intensity increases as the inclination angle θ increases, regardless of the value of MR. The overall spin torque intensity is represented by the mean value of the values obtained in the cases where the magnetization direction of the magnetization free layer is inclined from the antiparallel state and in the cases where the magnetization direction of the magnetization free layer is inclined from the parallel state. The MR ratio is proportional to $\cos^2\theta$. Accordingly, as the inclination angle θ is larger than 45 degrees, the MR ratio becomes small. Therefore, the inclination angle θ should preferably be in the range of 0 to 45 degrees.

Each of the spin MOSFETS of the first through seventeenth embodiments can be formed on a predetermined substrate by any of conventional thin-film forming devices and any of fine processing techniques, such as a sputtering technique, a vapor deposition technique, and a molecular beam epitaxial technique. The predetermined substrate may be a substrate that is made of Si (silicon), Ge (germanium), GaAs (gallium arsenic), ZnSe, $SiO_2$ (silicon oxide), $Al_2O_3$ (aluminum oxide), spinel, AlN (aluminum nitride), or the like.

Eighteenth Embodiment

Next, a simple circuit structure that is used as a reconfigurable logic circuit in practice is described.

Where a reconfigurable logic circuit is formed with spin MOSFETs in practice, two MOSFETs (MOSFET 1 and MOSFET 2) preferably have a common floating gate.

Figure 43:
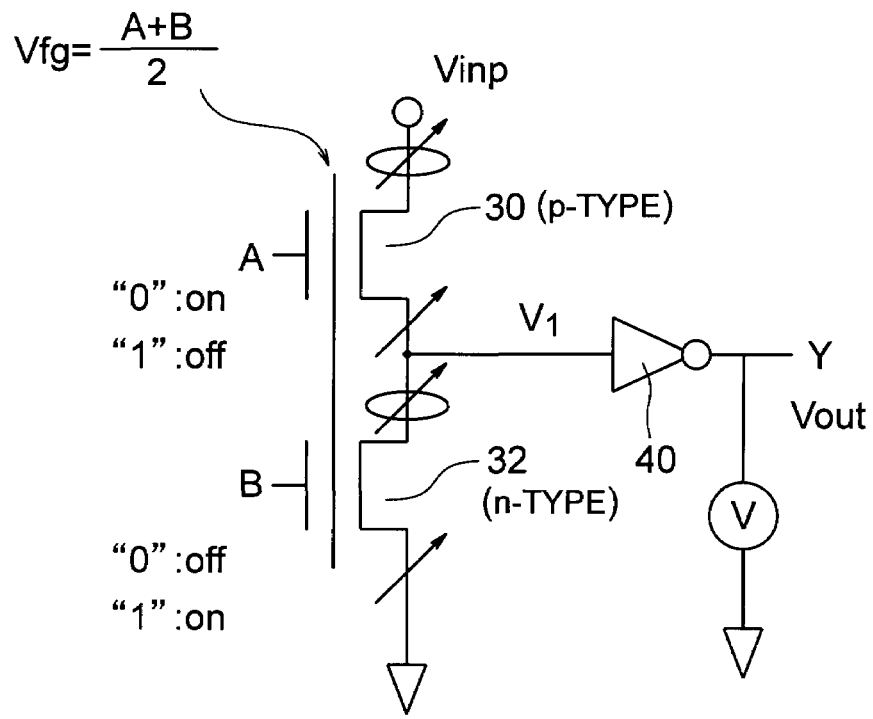
FIG. 43 is a circuit diagram showing a logic circuit in accordance with an eighteenth embodiment.

Since an AND circuit and an OR circuit can be produced, all the other circuits such as a NOR circuit and an exclusive OR circuit can be produced. Accordingly, FIG. 43 shows only examples of an AND circuit and an OR circuit. As shown in FIG. 43, a reconfigurable logic circuit of this embodiment includes two spin MOSFETs 30 and 32 each having the same structure as any of the first through seventeenth embodiments, except that a floating gate (not shown) and an interelectrode insulating film are provided between the gate insulating film 10 and the gate electrode 12. The spin MOSFET 30 is a p-type MOSFET, or a MOSFET that has an n-type substrate as the semiconductor substrate 2. The spin MOSFET 32 is an n-type MOSFET, or a MOSFET that has a p-type substrate as the semiconductor substrate 2. The floating gates of the MOSFETs 30 and 32 are connected to each other, the source of the MOSFET 30 is connected to a power supply Vinp, and the source of the MOSFET 32 is grounded. The drain of the MOSFET 30 is connected to the drain of the MOSFET 32. The output V1 from the node connected to the MOSFETs 30 and 32 is input to an inverter 40, and the output of the inverter 40 is the output Vout of the logic circuit of this embodiment.

Figure 44:
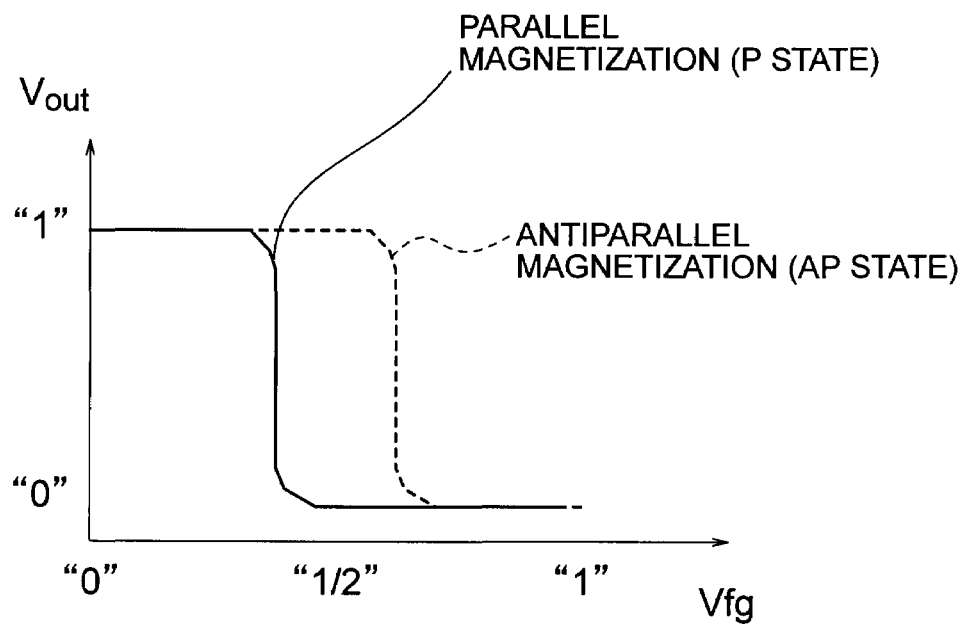
FIG. 44 shows the floating gate voltage dependence of the output of the logic circuit of the eighteenth embodiment.

In this manner, an AND circuit and an OR circuit are formed. In a case where the floating gate voltage Vfg is ½ of the sum of the gate input A of the MOSFET 30 and the gate input B of the MOSFET 32, as shown in FIG. 44, the output voltage Y switches between "1" and "0" as the spin moment of the ferromagnetic layer close to the semiconductor substrate 2 of the source and drain switches between a parallel state (P) and an antiparallel state (AP).

FIG. 45 shows the values of the potential Vfg of the floating gate, the potential V1 of the node connected to the MOSFETs 30 and 32, and the output Vout of the logic circuit, with respect to inputs A and B to the gate electrodes of the MOSFETs 30 and 32 in a case where the spin moment of the ferromagnetic layer close to the semiconductor substrates 2 of the source and drain of the MOSFET 32 is in an AP (antiparallel) state. FIG. 46 shows the values of the potential Vfg of the floating gate, the potential V1 of the node connected to the MOSFETs 30 and 32, and the output Vout of the logic circuit, with respect to inputs A and B to the gate electrodes of the MOSFETs 30 and 32 in a case where the spin moment of the ferromagnetic layer close to the semiconductor substrates 2 of the source and drain of the MOSFET 32 is in a P (parallel) state. As shown in FIGS. 45 and 46, when the spin moment of the ferromagnetic layer close to the semiconductor substrate 2 of the source and drain of the MOSFET 32 is in an antiparallel state, the logic circuit becomes an AND circuit. When the spin moment is in a parallel state, the logic circuit becomes an OR circuit. Accordingly, the logic circuit can be reconfigured by performing reprogramming to change the spin moment of the ferromagnetic layer of the drain. Thus, a reconfigurable logic circuit can be obtained.

Figure 47:
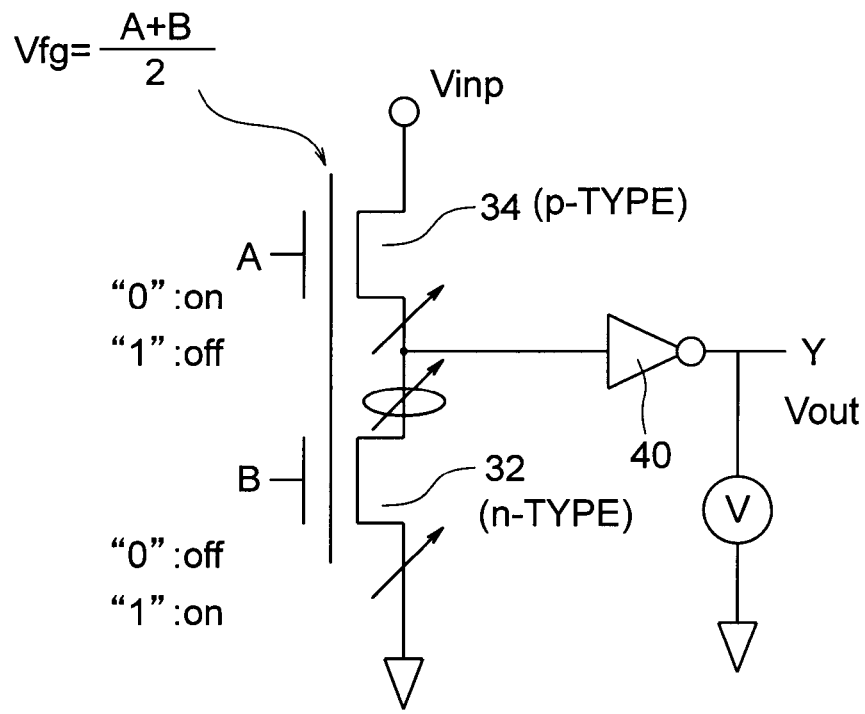
FIG. 47 is a circuit diagram showing a logic circuit in accordance with a first modification of the eighteenth embodiment.

In a case where an AND circuit and an OR circuit are formed, all the transistors may be spin MOSFETs, but it is also possible to employ spin MOSFETs for only some of the transistors. In a case where one of the two transistors (the MOSFET 32, for example) is formed with one of the spin MOSFETs of the first through seventeenth embodiments while the other transistor may be formed with a conventional p-MOSFET 34 that does not include a magnetic material, as shown in FIG. 47, the spin moment of the ferromagnetic layer close to the semiconductor substrate 2 of the source and drain of the spin MOSFET 32 is controlled to be in a parallel state and an antiparallel state. In this manner, the same result as above can be achieved.

Figure 48:
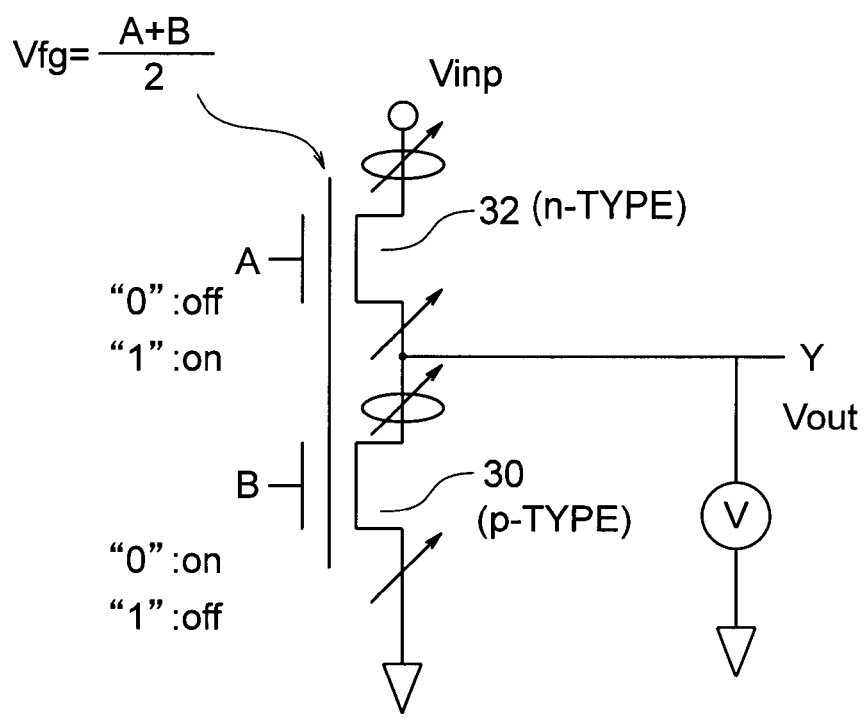
FIG. 48 is a circuit diagram showing a logic circuit in accordance with a second modification of the eighteenth embodiment.

Also, as shown in FIG. 48, the connections of the n-type MOSFET 32 and the p-type MOSFET 30 may be switched, and the inverter 40 may not be employed. In this manner, the spin moment of the ferromagnetic layer close to the semiconductor substrate 2 of the source and drain of the p-type MOSFET 30 can be controlled to be in a parallel state and in an antiparallel state. Thus, the same effects as above can be achieved.

When the above logic circuit is put into practical use, the structure further includes a gate voltage control circuit for reading information from the spin MOSFETs, a sense current control device circuit that controls the sense current, a write current control circuit, a driver, and a sinker.

Nineteenth Embodiment

Figure 54:
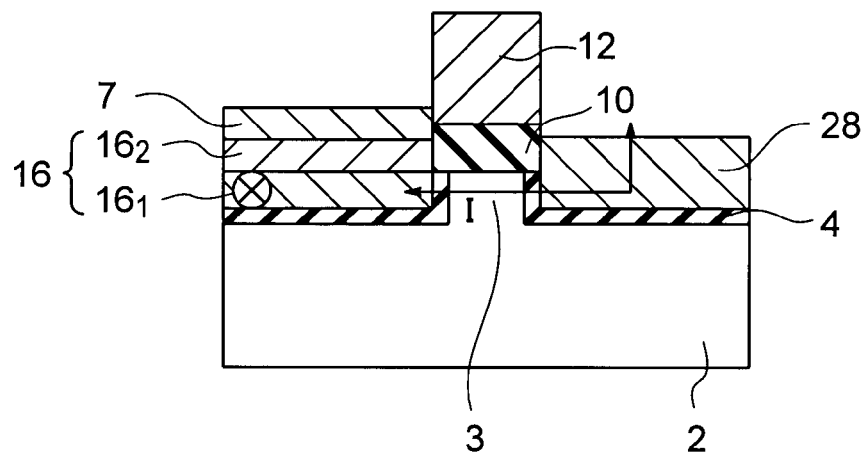
FIG. 54 is a cross-sectional view of a spin MOSFET in accordance with a nineteenth embodiment.
Figure 55:
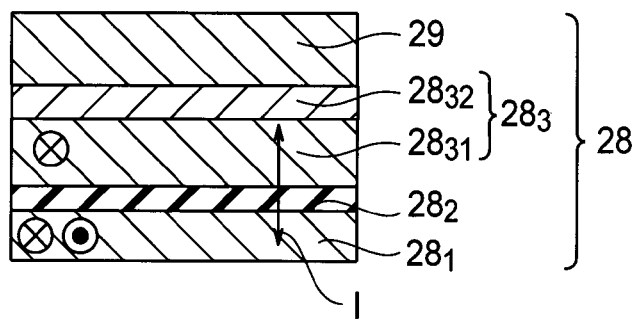
FIG. 55 is a cross-sectional view showing example structure of the second magnetic film of the spin MOSFET in accordance with the nineteenth embodiment.
Figure 56:
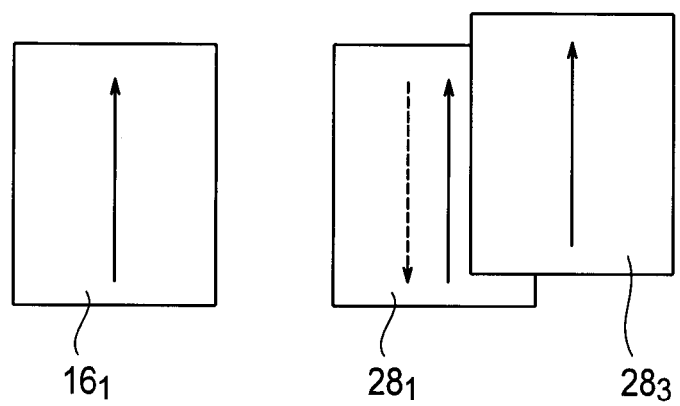
FIG. 56 shows the magnetization directions of the ferromagnetic layers of the first and second magnetic films of the spin MOSFET in accordance with the nineteenth embodiment.

Referring now to FIGS. 54 through 56, a spin MOSFET in accordance with a nineteenth embodiment of the present invention is described. The spin MOSFET of this embodiment has the same structure as the spin MOSFET of the first embodiment shown in FIG. 3, except that the first magnetic film 6 is replaced with a first magnetic film 16, and the second magnetic film 8 is replaced with a second magnetic film 28 (see FIG. 54). The first magnetic film 16 is formed with a half-metal ferromagnetic layer $16_1$ having a fixed magnetization direction and a ferromagnetic layer $16_2$. The second magnetic film 28 is formed with a half-metal ferromagnetic layer $28_1$ to serve as a magnetization free layer, a tunnel insulating film $28_2$, a magnetization pinned layer $28_3$, and an antiferromagnetic layer 29. The magnetization pinned layer $28_3$ is formed with a half-metal ferromagnetic layer $28_{31}$ and a ferromagnetic layer $28_{32}$ (FIG. 55). The magnetization directions of the half-metal ferromagnetic layer $16_1$ and the magnetization pinned layer $28_3$ extend parallel to each other (extend in the same direction), as shown in FIG. 56.

Since the first magnetic film 16 includes the half-metal ferromagnetic layer $16_1$, the ferromagnetic layer $16_2$ made of an alloy is provided between the half-metal ferromagnetic layer $16_1$ and the antiferromagnetic layer 7 in this embodiment. Also, since the magnetization pinned layer $28_3$ of the second magnetic film 28 includes the half-metal ferromagnetic layer $28_{31}$, the ferromagnetic layer $28_{32}$ made of an alloy is provided between the half-metal ferromagnetic layer $28_{31}$ and the antiferromagnetic layer 29. The material for the ferromagnetic layers $16_2$ and $28_{32}$ is CoFe or an alloy that contains at least two elements among Co, Fe, and Ni.

In this embodiment, the second magnetic film 28 has a stacked structure consisting of the half-metal ferromagnetic layer $28_1$, the tunnel insulating film $28_2$, and the half-metal ferromagnetic layer $28_{31}$. Accordingly, in a case where the spin of the magnetization free layer $28_1$ changes from "parallel" to "antiparallel" with respect to the spin of the half-metal ferromagnetic layer $16_1$, the spin dependence conduction of the above stacked structure is added to the spin dependence conduction through the channel length, and as a result, a large difference in drain current is obtained. The half-metal ferromagnetic layer $28_1$ may have a stacked structure consisting of a half-metal ferromagnetic layer, a body-centered cubic lattice metal, and a half-metal ferromagnetic layer. Example materials for the body-centered cubic lattice metal include Cr, Fe, V, and alloys of those materials (such as a Cr—Fe alloy, a Fe—V alloy, and a Cr—V alloy).

The half-metal ferromagnetic layers are preferably made of a full Heusler alloy. More specifically, the composition that achieves the largest difference in drain current is $Co_2FeSi_{1-x}Al_x$. The relative proportion x is preferably in the range of 0.1 to 0.9. In this range, the magnetic resistance at room temperature exhibits the maximum value, and the MR ratio shows low dependence on the voltage, which is preferable. A full Heusler alloy is an alloy having a composition of $A_2BC$, where the composition elements are A, B, and C. A full Heusler alloy has a DO3 structure. For example, where the element A is Co (cobalt), the element B is Fe (iron), and the element C is at least one of Si and Al, the full Heusler alloy can be expressed as $Co_2FeSi_{1-x}Al_x$. A half Heusler alloy is an alloy having a composition of ABC, where the composition elements are A, B, and C. A half Heusler alloy has a DO3 structure.

As in each of the foregoing embodiments, the tunnel insulating film 4 may be an oxide film containing $Al_2O_3$ (aluminum oxide) or MgO (magnesium oxide). Particularly, in a case where MgO is used for the tunnel insulating film 4, the magnetic layers $16_1$ and $28_1$ that are formed on the tunnel insulating film 4 and are formed with a full Heusler alloy can be formed through epitaxial growth so as to have excellent magnetic characteristics.

The semiconductor substrate 2 may be formed with a semiconductor such as Si or Ge, or may be formed with a compound semiconductor such as GaAs or ZnSe. Also, the semiconductor substrate 2 may have a surface formed with a IV semiconductor such as Si or Ge, or a surface formed with a III-V or II-VI compound semiconductor such as GaAs or ZnSe.

Like the first embodiment, this embodiment can also provide a spin MOSFET that performs a spin reversal at a low current density and exhibits large output characteristics through the spin reversal.

Figure 57:
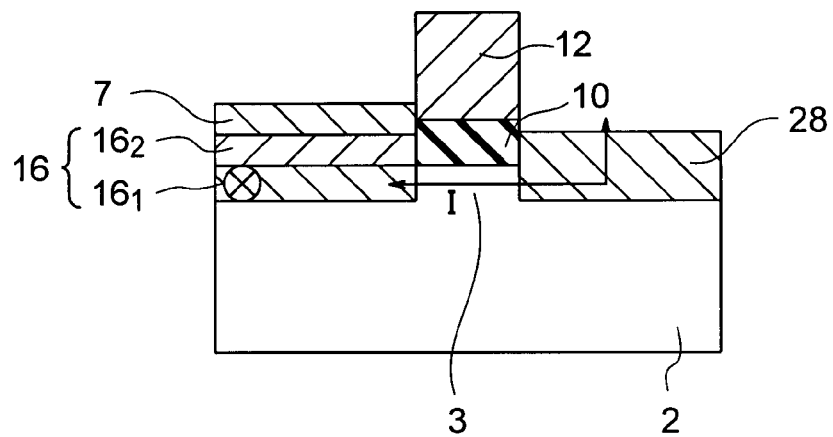
FIG. 57 is a cross-sectional view of a spin MOSFET in accordance with a modification of the nineteenth embodiment.

FIG. 57 shows a Schottky spin MOSFET in accordance with a modification of this embodiment. In this Schottky spin MOSFET, the tunnel insulating film 4 between the semiconductor substrate 2 and the first and second magnetic films 16 and 28 is removed. This modification can also achieve the same effects as this embodiment.

Twentieth Embodiment

Figure 58:
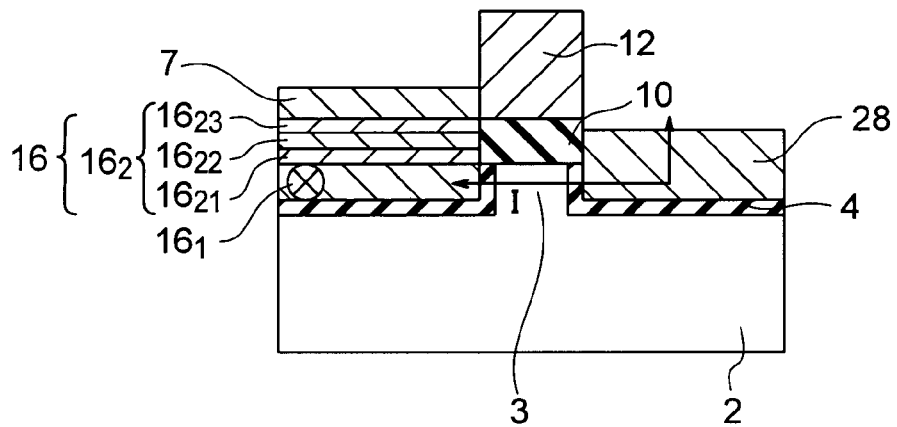
FIG. 58 is a cross-sectional view of a spin MOSFET in accordance with a twentieth embodiment.
Figure 59:
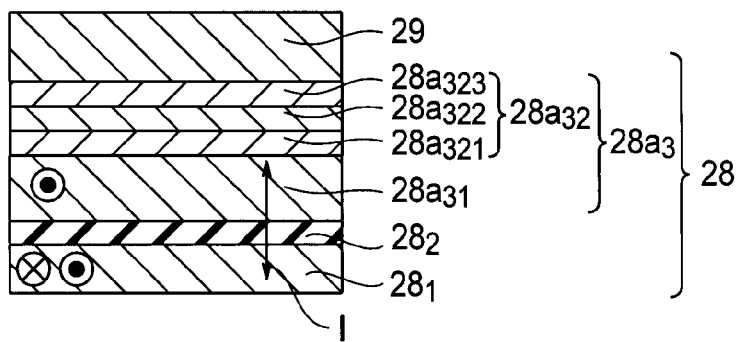
FIG. 59 is a cross-sectional view showing example structure of the second magnetic film of the spin MOSFET in accordance with the twentieth embodiment.
Figure 60:
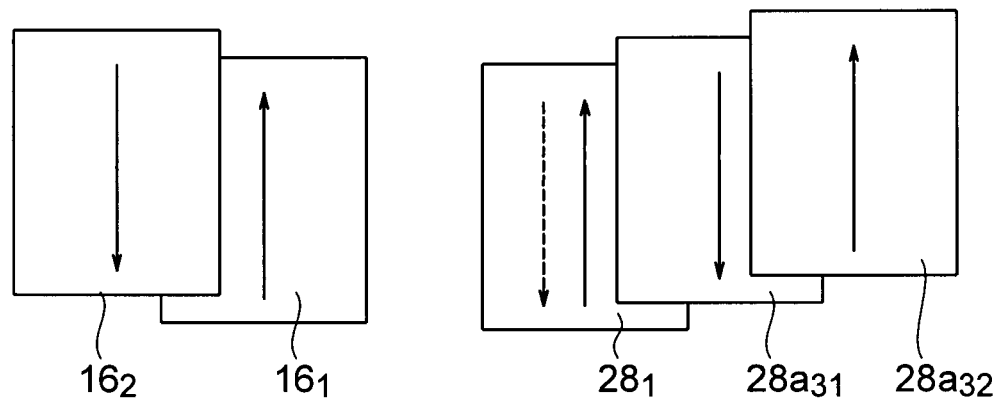
FIG. 60 shows the magnetization directions of the ferromagnetic layers of the first and second magnetic films of the spin MOSFET in accordance with the twentieth embodiment.

Referring now to FIGS. 58 through 60, a spin MOSFET in accordance with a twentieth embodiment of the present invention is described. The spin MOSFET of this embodiment has the same structure as the spin MOSFET of the nineteenth embodiment shown in FIG. 54, except that the ferromagnetic layer $16_2$ of the first magnetic film 16 is replaced with a stacked structure consisting of a ferromagnetic layer $16_{21}$, a nonmagnetic layer $16_{22}$, and a ferromagnetic layer $16_{23}$, and the magnetization pinned layer $28_3$ of the second magnetic film 28 is replaced with a magnetization pinned layer $28a_3$ (see FIGS. 58 and 59). The magnetization pinned layer $28a_3$ includes a half-metal ferromagnetic layer $28a_{31}$ having a fixed magnetization direction, and a magnetic film $28a_{32}$ formed with a stacked structure consisting of a ferromagnetic layer $28a_{321}$, a nonmagnetic layer $28a_{322}$, and a ferromagnetic layer $28a_{323}$. The magnetization directions of the half-metal ferromagnetic layer $16_1$ and the half-metal ferromagnetic layer $28a_{31}$ extend antiparallel (opposite) to each other, as shown in FIG. 60.

The material for the ferromagnetic layer $16_{21}$, the ferromagnetic layer $16_{23}$, the ferromagnetic layer $28a_{321}$, and the ferromagnetic layer $28a_{323}$ is CoFe or an alloy containing at least two elements among Co, Fe, and Ni, as in the nineteenth embodiment. The material for the nonmagnetic layers $16_{22}$ and $28a_{322}$ may be Ru, for example.

In this embodiment, the second magnetic film 28 also has a stacked structure consisting of the half-metal ferromagnetic layer $28_1$, the tunnel insulating film $28_2$, and the half-metal ferromagnetic layer $28a_{31}$. Accordingly, in a case where the spin of the half-metal ferromagnetic layer $28_1$ as the magnetization free layer changes from "parallel" to "antiparallel" with respect to the spin of the half-metal ferromagnetic layer $16_1$, the spin dependence conduction of the above stacked structure is added to the spin dependence conduction through the channel length, and as a result, a large difference in drain current is obtained. The half-metal ferromagnetic layer $28_1$ may have a stacked structure consisting of a half-metal ferromagnetic layer, a body-centered cubic lattice metal, and a half-metal ferromagnetic layer.

The half-metal ferromagnetic layer is preferably a full Heusler alloy, as in the nineteenth embodiment. More specifically, the composition that achieves the largest difference in drain current is $Co_2FeSi_{1-x}Al_x$. The relative proportion x is preferably in the range of 0.1 to 0.9. In this range, the magnetic resistance at room temperature exhibits the maximum value, and the MR variation rate shows low dependence on the voltage, which is preferable.

Like the nineteenth embodiment, this embodiment can also provide a spin MOSFET that performs a spin reversal at a low current density and exhibits large output characteristics through the spin reversal.

Figure 61:
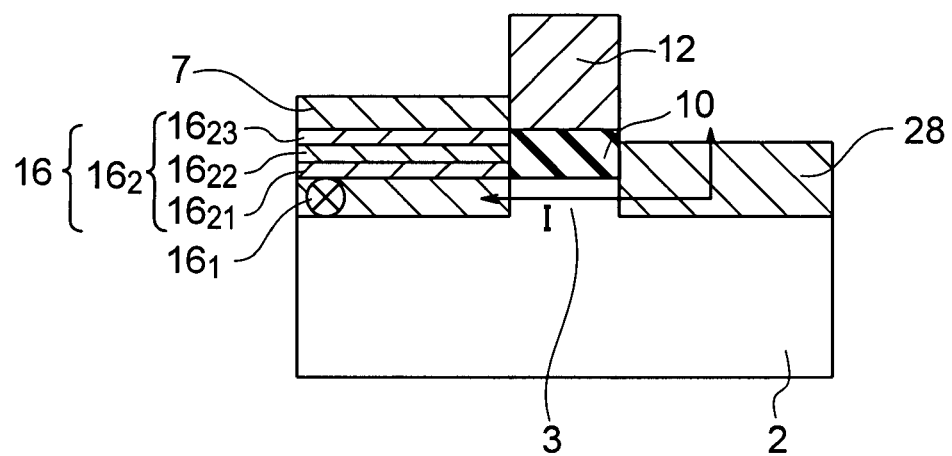
FIG. 61 is a cross-sectional view of a spin MOSFET in accordance with a modification of the nineteenth embodiment.

FIG. 61 shows a Schottky spin MOSFET in accordance with a modification of this embodiment. In this Schottky spin MOSFET, the tunnel insulating film 4 between the semiconductor substrate 2 and the first and second magnetic films 16 and 28 is removed. This modification can also achieve the same effects as this embodiment.

EXAMPLES

The above described embodiments of the present invention are now described in greater detail by way of examples.

First Example

First, a spin MOSFET in accordance with a second or fourth embodiment is produced as a first example of a spin MOSFET of the present invention.

The procedures for manufacturing this spin MOSFET are substantially the same as the procedures for manufacturing a conventional MOSFET, except for the procedures for forming the source and drain. In the following, the structure of this spin MOSFET is described in order of the manufacturing procedures.

Figure 49A:
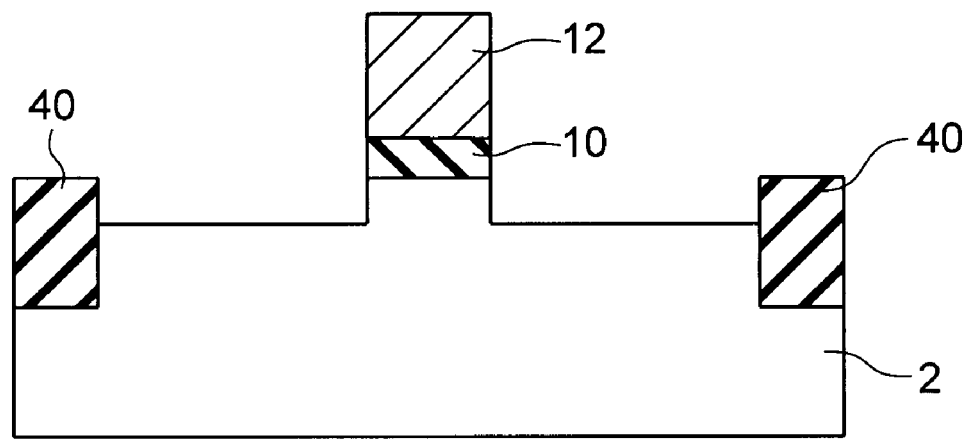
FIGS. 49A and 49B are cross-sectional views showing the procedures for manufacturing the spin MOSFET of each embodiment.

First, silane and ammonia are grown by a vapor-phase growth technique, so as to form a $Si_3N_4$ film (not shown) on a Si substrate 2 or a SiO substrate 2. A PEP (Photo-Engraving Process) is then carried out in the formation regions of the source, the gate oxide film, and the drain. More specifically, with a photoresist (not shown) serving as a mask, etching is performed on the $Si_3N_4$ film. With the $Si_3N_4$ film serving as a mask, etching is performed on a natural oxide film (SiOx) outside the formation regions of the source, the gate oxide film, and the drain. After the natural oxide film (SiOx) outside the formation regions of the source, the gate oxide film, and the drain is removed by an etching process, a thick field oxide film 40 for separating devices is formed on the exposed Si. The $Si_3N_4$ film remaining in the formation regions of the source, the gate oxide film, and the drain is removed with phosphoric acid, and the natural oxide film (SiOx) is also removed with hydrofluoric acid. A gate insulating film 10 made of SiOx, for example, is then grown by a thermal oxidization technique, and a polysilicon film containing conductive impurities is deposited on the gate insulating film 10 by a vapor-phase growth technique. The polysilicon film is then subjected to a photolithographic process, so as to form a gate electrode 12. With the gate electrode 12 serving as a mask, the portions of the gate insulating film 10 located in the source and drain regions are removed through a fluorine RIE process, and the structure shown in FIG. 49A is produced.

A first magnetic film 6A and a second magnetic film 8 to be the source and drain are then formed independently of each other. In a case where the spin MOSFET of the second embodiment is to be produced, for example, after a tunnel insulating film made of MgO is formed, a ferromagnetic layer $6_1$ made of CoFeB, a nonmagnetic layer $6_2$ made of Ru, a ferromagnetic layer $6_3$ made of CoFe, and an antiferromagnetic layer $6a$ made of IrMn are stacked to form the first magnetic film 6A by a sputtering technique exhibiting high directivity. After a tunnel insulating film 4 made of MgO is formed, a ferromagnetic layer $8_1$ made of CoFeB, a nonmagnetic layer $8_2$ made of MgO, a ferromagnetic layer $8_3$ made of CoFeB, a nonmagnetic layer $8_4$ made of Ru, a ferromagnetic layer $8_5$ made of CoFe, a nonmagnetic layer $8_6$ made of Ru, a ferromagnetic layer $8_7$ made of CoFe, and an antiferromagnetic layer 9 made of IrMn are stacked to form the second magnetic film 8 by a sputtering technique exhibiting high directivity.

In a case where the spin MOSFET of the fourth embodiment is to be produced, after Fe films are formed in the regions to be the source and drain regions, $Fe_3Si$ films are formed through solid phase diffusion caused by annealing.

The Fe$_3$Si films serve as the ferromagnetic layer $6_1$ of the first magnetic film 6A and the ferromagnetic layer $8_1$ of the second magnetic film 8. After that, a nonmagnetic layer $6_2$ made of Ru, a ferromagnetic layer $6_3$ made of CoFe, and an antiferromagnetic layer 6a made of IrMn are stacked on the ferromagnetic layer $6_1$ made of Fe$_3$Si to form the first magnetic film 6A by a sputtering technique exhibiting high directivity. A nonmagnetic layer $8_2$ made of MgO, a ferromagnetic layer $8_3$ made of CoFeB, a nonmagnetic layer $8_4$ made of Ru, a ferromagnetic layer $8_5$ made of CoFe, a nonmagnetic layer $8_6$ made of Ru, a ferromagnetic layer $8_7$ made of CoFe, and an antiferromagnetic layer 9 made of IrMn are stacked on the ferromagnetic layer $8_1$ made of Fe$_3$Si to form the second magnetic film 8 by a sputtering technique exhibiting high directivity.

Figure 49B:
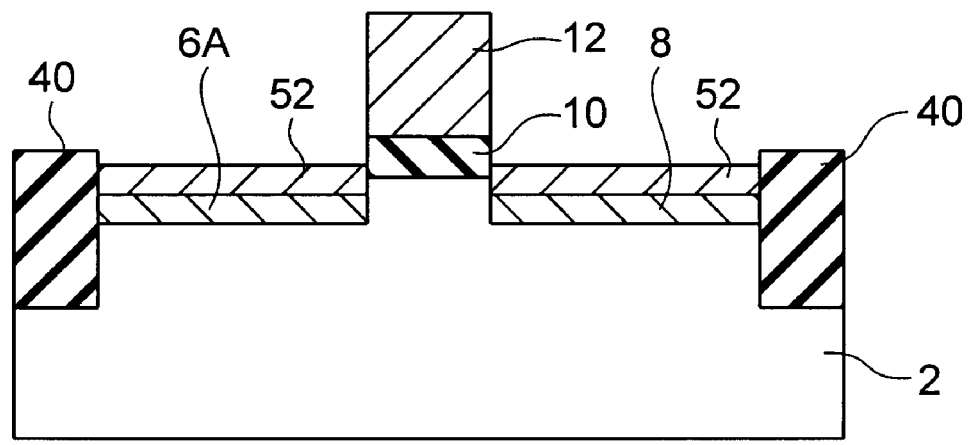

After the first magnetic film 6A and the second magnetic film 8 are formed in this manner, a polysilicon electrode 52 is formed with the use of a sputtering device exhibiting high directivity, so as to produce the structure shown in FIG. 49B. An interlayer insulating film and contact holes are then formed, and aluminum wirings as measurement electrodes are formed. While a magnetic field is induced in the long-axis direction of the ferromagnetic layers (the magnetization easy axis direction), annealing is performed in the magnetic field.

Figure 50:
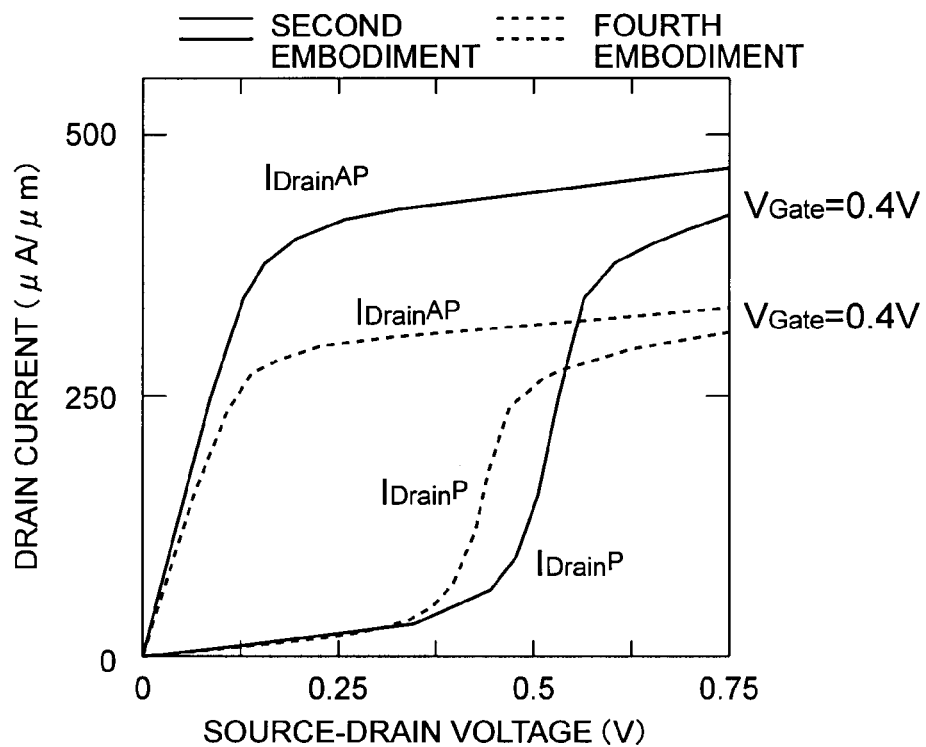
FIG. 50 shows the source-drain voltage dependence of the drain current at the time of reading in the spin MOSFET in a first example.

FIG. 50 shows the source-drain voltage dependence of the drain current in the spin MOSFETS of the second embodiment and the fourth embodiment where the gate voltage $V_{Gate}$ at the time of reading is 0.4 V. In FIG. 50, $I_{Drain}^{AP}$ represents the drain current observed where the spin directions of the ferromagnetic layer $6_1$ of the first magnetic film 6A and the ferromagnetic layer $8_1$ of the second magnetic film 8 are in an antiparallel state, and $I_{Drain}^{P}$ represents the drain current observed where the spin directions of the ferromagnetic layer $6_1$ of the first magnetic film 6A and the ferromagnetic layer $8_1$ of the second magnetic film 8 are in a parallel state.

Although not shown in the drawings, where the gate voltage $V_{Gate}$ is 0.8 V, it has become apparent that spin injection writing can be constantly and repeatedly observed if the source-drain voltage is 1 V or higher in the structure of the second embodiment and is 1.1 V or higher in the structure of the fourth embodiment. Here, the current densities are as low as $2.1 \times 10^6$ A/cm$^2$ and $2.3 \times 10^6$ A/cm$^2$, respectively.

As is apparent from FIG. 50, the reading characteristics show that the drain current observed where the spin directions of the ferromagnetic layer $6_1$ of the first magnetic film 6A and the ferromagnetic layer $8_1$ of the second magnetic film 8 are in a parallel state differs from the drain current observed where the spin directions of the ferromagnetic layer $6_1$ of the first magnetic film 6A and the ferromagnetic layer $8_1$ of the second magnetic film 8 are in an antiparallel state. Also, application of a gate voltage has an amplifying effect. Thus, the operations of spin MOSFETs for a reconfigurable logic circuit can be achieved.

Second Example

A spin MOSFET in accordance with the sixth embodiment or the eighth embodiment is produced as a second example of a spin MOSFET of the present invention.

This spin MOSFET is produced in the same manner as in the first example, until the source and drain are formed. Where the spin MOSFET of the sixth embodiment is to be produced, the first magnetic film 6A and the second magnetic film 18 to be the source and drain are formed independently of each other. After a tunnel insulating film 4 made of MgO is formed, a ferromagnetic layer $6_1$ made of CoFeB, a nonmagnetic layer $6_2$ made of Ru, a ferromagnetic layer $6_3$ made of CoFe, and an antiferromagnetic layer 6a made of IrMn are stacked to form the first magnetic film 6A by a sputtering technique exhibiting high directivity. After a tunnel insulating film 4 made of MgO is formed, a ferromagnetic layer $18_1$ made of CoFeB, a nonmagnetic layer $18_2$ made of MgO, a ferromagnetic layer $18_3$ made of CoFeB, a nonmagnetic layer $18_4$ made of Ru, a ferromagnetic layer $18_5$ made of CoFe, a nonmagnetic layer $18_6$ made of Ru, a ferromagnetic layer $18_7$ made of CoFe, and an antiferromagnetic layer 19 made of IrMn are stacked to form the second magnetic film 18 by a sputtering technique exhibiting high directivity.

In a case where the spin MOSFET of the eighth embodiment is to be produced, after Fe films are formed, Fe$_3$Si films as the ferromagnetic layers $6_1$ and $18_1$ of the first magnetic film 6A and the second magnetic film 18 are formed in the source-drain formation regions through solid phase diffusion caused by annealing. After that, a nonmagnetic layer $6_2$ made of Ru, a ferromagnetic layer $6_3$ made of CoFe, and an antiferromagnetic layer 6a made of IrMn are stacked on the ferromagnetic layer $6_1$ formed with the Fe$_3$Si film by a sputtering technique exhibiting high directivity, so as to form the first magnetic film 6A. A nonmagnetic layer $18_2$ made of MgO, a ferromagnetic layer $18_3$ made of CoFeB, a nonmagnetic layer $18_4$ made of Ru, a ferromagnetic layer $18_5$ made of CoFe, a nonmagnetic layer $18_6$ made of Ru, a ferromagnetic layer $18_7$ made of CoFe, and an antiferromagnetic layer 19 made of IrMn are stacked on the ferromagnetic layer $18_1$ made of Fe$_3$Si to form the second magnetic film 18 by a sputtering technique exhibiting high directivity.

After the first magnetic film 6A and the second magnetic film 18 are formed in this manner, a polysilicon electrode 52 made of polysilicon is formed with the use of a sputtering device exhibiting high directivity, so as to produce the structure shown in FIG. 49B. An interlayer insulating film and contact holes are then formed, and aluminum wirings as measurement electrodes are formed. While a magnetic field is induced in the long-axis direction of the magnetic layers, annealing is performed in the magnetic field.

Figure 51:
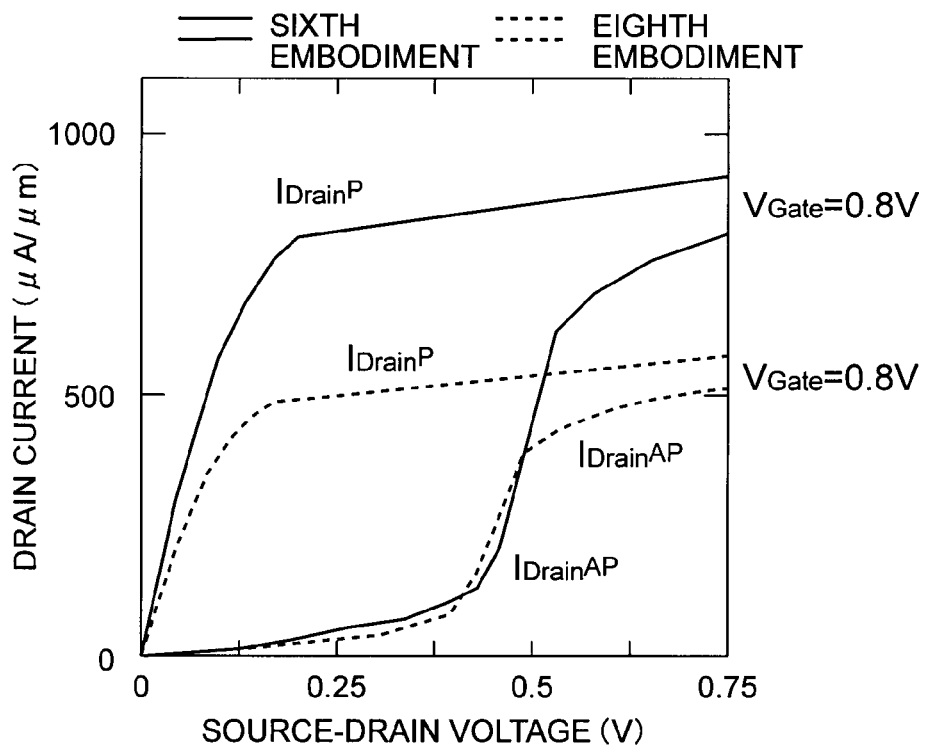
FIG. 51 shows the source-drain voltage dependence of the drain current at the time of reading in the spin MOSFET in a second example.

FIG. 51 shows the source-drain voltage dependence of the drain current in the spin MOSFETS of the sixth embodiment and the eighth embodiment where the gate voltage $V_{Gate}$ at the time of reading is 0.8 V. In FIG. 51, $I_{Drain}^{AP}$ represents the drain current observed where the spin directions of the ferromagnetic layer $6_1$ of the first magnetic film 6A and the ferromagnetic layer $18_1$ of the second magnetic film 18 are in an antiparallel state, and $I_{Drain}^{P}$ represents the drain current observed where the spin directions of the ferromagnetic layer $6_1$ of the first magnetic film 6A and the ferromagnetic layer $18_1$ of the second magnetic film 18 are in a parallel state.

Although not shown in the drawings, where the gate voltage $V_{Gate}$ is 1.2 V, it has become apparent that spin injection writing can be constantly and repeatedly observed if the source-drain voltage is 1.2 V or higher in the structure of the sixth embodiment and is 1.3 V or higher in the structure of the eighth embodiment. Here, the current densities are as low as $2.5 \times 10^6$ A/cm$^2$ and $2.6 \times 10^6$ A/cm$^2$, respectively.

As is apparent from FIG. 51, the reading characteristics show that the drain current observed where the spin directions of the ferromagnetic layer $6_1$ of the first magnetic film 6A and the ferromagnetic layer $18_1$ of the second magnetic film 18 are in a parallel state differs from the drain current observed where the spin directions of the ferromagnetic layer $6_1$ of the first magnetic film 6A and the ferromagnetic layer $18_1$ of the second magnetic film 18 are in an antiparallel state. Also, application of a gate voltage has an amplifying effect. Thus, the operations of spin MOSFETs for a reconfigurable logic circuit can be achieved.

Third Example

A spin MOSFET in accordance with the tenth embodiment or the twelfth embodiment is produced as a third example of a spin MOSFET of the present invention.

This spin MOSFET is produced in the same manner as in the first and second examples. To form the first magnetic film 6A of the tenth embodiment, a ferromagnetic layer $6_1$ made of CoFeB, a nonmagnetic layer $6_2$ made of Ru, a ferromagnetic layer $6_3$ made of CoFe, and an antiferromagnetic layer $6a$ made of IrMn are stacked in this order on the tunnel insulating film 4 made of MgO. To form the second magnetic film 8A, a ferromagnetic layer $8_{11}$ made of CoFeB, a nonmagnetic layer $8_{12}$ made of Ru, a ferromagnetic layer $8_{13}$ made of CoFeB, a nonmagnetic layer $8_2$ made of MgO, a ferromagnetic layer $8_3$ made of CoFeB, a nonmagnetic layer $8_4$ made of Ru, a ferromagnetic layer $8_5$ made of CoFe, a nonmagnetic layer $8_6$ made of Ru, a ferromagnetic layer $8_7$ made of CoFe, and an antiferromagnetic layer 9 made of IrMn are stacked in this order on the tunnel insulating film 4 made of MgO.

In a case where the spin MOSFET of the twelfth embodiment is to be produced, after Fe films are formed, $Fe_3Si$ films as the ferromagnetic layers $6_1$ and $8_{11}$ of the first magnetic film 6A and the second magnetic film 8A are formed through solid phase diffusion caused by annealing. After that, a nonmagnetic layer $6_2$ made of Ru, a ferromagnetic layer $6_3$ made of CoFe, and an antiferromagnetic layer $6a$ made of IrMn are formed in this order on the ferromagnetic layer $6_1$ made of $Fe_3Si$, so as to form the first magnetic film 6A. A nonmagnetic layer $8_{12}$ made of Ru, a ferromagnetic layer $8_{13}$ made of CoFeB, a nonmagnetic layer $8_2$ made of MgO, a ferromagnetic layer $8_3$ made of CoFeB, a nonmagnetic layer $8_4$ made of Ru, a ferromagnetic layer $8_5$ made of CoFe, a nonmagnetic layer $8_6$ made of Ru, a ferromagnetic layer $8_7$ made of CoFe, and an antiferromagnetic layer 9 made of IrMn are stacked in this order on the ferromagnetic layer $8_{11}$ made of $Fe_3Si$, so as to form the second magnetic film 8A.

After the first magnetic film 6A and the second magnetic film 8A are formed in this manner, a polysilicon electrode 52 is formed with the use of a sputtering device exhibiting high directivity, so as to produce the structure shown in FIG. 49B. An interlayer insulating film and contact holes are then formed, and aluminum wirings as measurement electrodes are formed. While a magnetic field is induced in the long-axis direction of the ferromagnetic layers (the magnetization easy axis direction), annealing is performed in the magnetic field.

Figure 52:
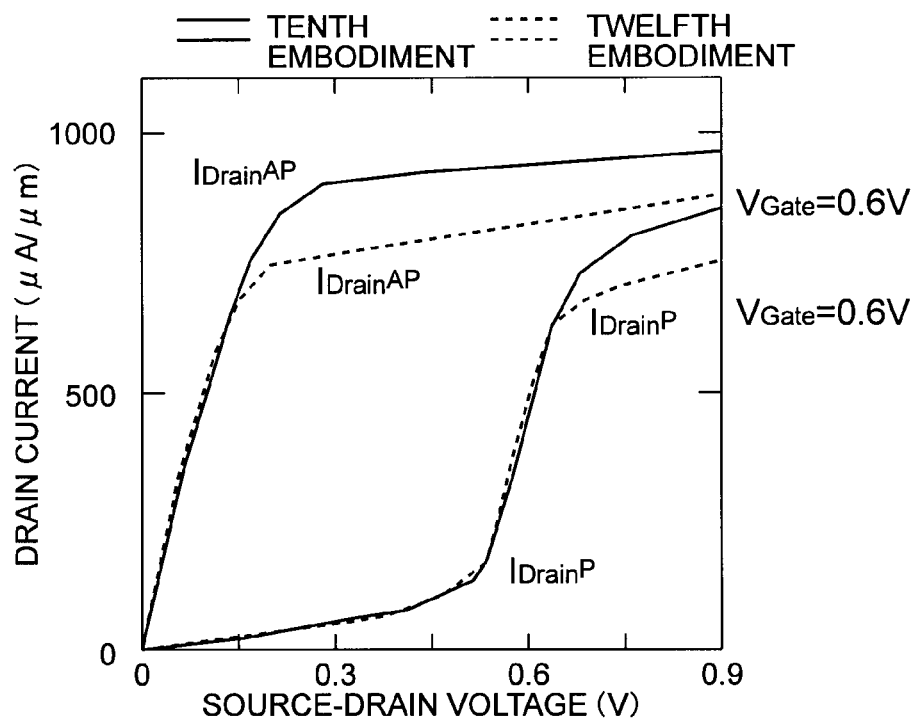
FIG. 52 shows the source-drain voltage dependence of the drain current at the time of reading in the spin MOSFET in a third example.

FIG. 52 shows the source-drain voltage dependence of the drain current in the spin MOSFETS of the tenth embodiment and the twelfth embodiment where the gate voltage $V_{Gate}$ at the time of reading is 0.6 V. In FIG. 52, $I_{Drain}^{AP}$ represents the drain current observed where the spin directions of the ferromagnetic layer $6_1$ of the first magnetic film 6A and the ferromagnetic layer $8_{11}$ of the second magnetic film 8A are in an antiparallel state, and $I_{Drain}^{P}$ represents the drain current observed where the spin directions of the ferromagnetic layer $6_1$ of the first magnetic film 6A and the ferromagnetic layer $8_{11}$ of the second magnetic film 8A are in a parallel state.

Although not shown in the drawings, where the gate voltage $V_{Gate}$ is 1.4 V, it has become apparent that spin injection writing can be constantly and repeatedly observed if the source-drain voltage is 1.3 V or higher in the structure of the tenth embodiment and is 1.5 V or higher in the structure of the twelfth embodiment. Here, the current densities are as low as $2.9 \times 10^6$ A/$cm^2$ and $2.8 \times 10^6$ A/$cm^2$, respectively.

As is apparent from FIG. 52, the reading characteristics show that the drain current observed where the spin directions of the ferromagnetic layer $6_1$ of the first magnetic film 6A and the ferromagnetic layer $8_{11}$ of the second magnetic film 8A are in a parallel state differs from the drain current observed where the spin directions of the ferromagnetic layer $6_1$ of the first magnetic film 6A and the ferromagnetic layer $8_{11}$ of the second magnetic film 8A are in an antiparallel state. Also, application of a gate voltage has an amplifying effect. Thus, the operations of spin MOSFETs for a reconfigurable logic circuit can be achieved.

Fourth Example

A fourth example of a spin MOSFET of the present invention is now described. In the spin MOSFET as the fourth example, the first and second magnetic films have the multi-layer stacked structures of the second embodiment or the tenth embodiment, and the film-plane shape of the magnetization free layer of the second magnetic film 8 or 8A is of a parallelogram as in the second modification of the seventeenth embodiment shown in FIG. 37. Further, the spin moment direction of the magnetization free layer is inclined at an angle of θ degrees with respect to the spin direction of the ferromagnetic layer $6_1$ of the first magnetic film $6a$ serving as a magnetization pinned layer.

The procedures for manufacturing this spin MOSFET and the multi-layer structure of this spin MOSFET are the same as those of the first embodiment or the third embodiment.

In this embodiment, it has become apparent that, where the gate voltage $V_{Gate}$ is 0.8 V, spin injection writing can be constantly and repeatedly observed if the source-drain voltage is set to 0.8 V or higher in the spin MOSFET having the multi-layer stacked structure of the second embodiment. Here, the current density is $1.6 \times 10^6$ A/$cm^2$. It has also become apparent that, where the gate voltage $V_{Gate}$ is 1.4 V, spin injection writing can be constantly and repeatedly observed if the source-drain voltage is set to 0.9 V or higher in the spin MOSFET having the multi-layer stacked structure of the tenth embodiment. Here, the current density is $2.2 \times 10^6$ A/$cm^2$. Accordingly, it has become apparent that the inversion current density is lower than in the first and third embodiments.

Figure 53:
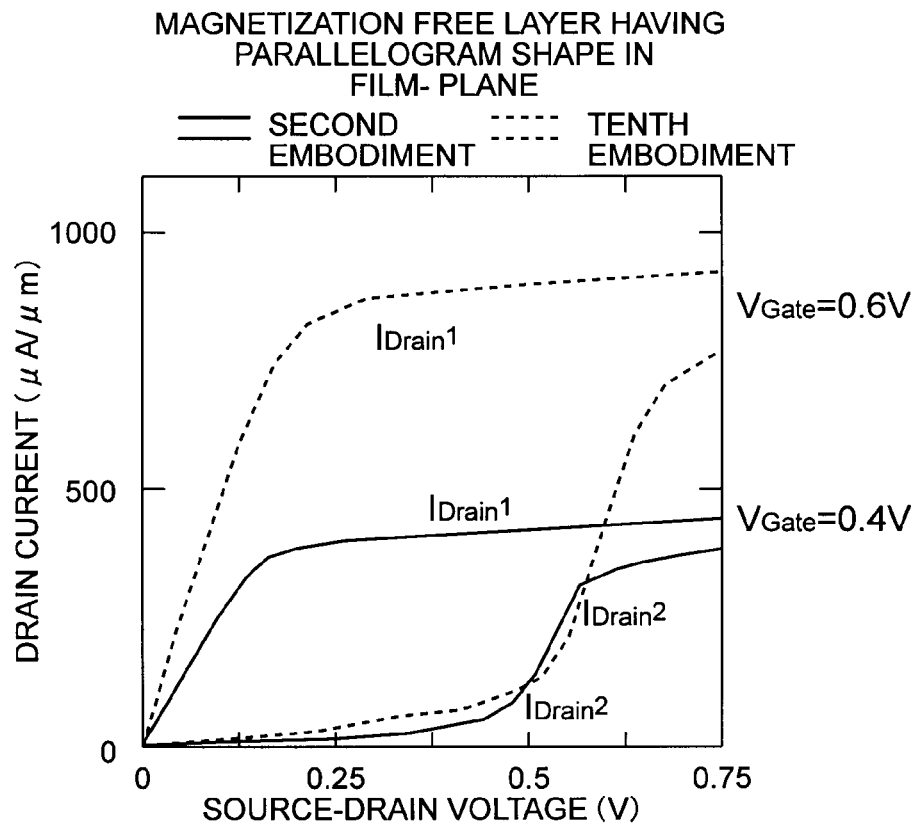
FIG. 53 shows the source-drain voltage dependence of the drain current at the time of reading in the spin MOSFET in a fourth example.

FIG. 53 shows the source-drain voltage dependence of the drain current in the spin MOSFETS of the second embodiment and the tenth embodiment where the gate voltage $V_{Gate}$ at the time of reading is 0.6 V. In FIG. 53, $I_{Drain}^{1}$ represents the drain current observed where the spin directions of the ferromagnetic layer $6_1$ of the first magnetic film 6A and the ferromagnetic layer $8_1$ of the second magnetic film 8 are in an antiparallel state, and $I_{Drain}^{2}$ represents the drain current observed where the spin directions of the ferromagnetic layer $6_1$ of the first magnetic film 6A and the ferromagnetic layer $8_1$ of the second magnetic film 8 are in a parallel state in the spin MOSFET having the multi-layer stacked structure of the second embodiment. In the spin MOSFET having the multi-layer stacked structure of the tenth embodiment, $I_{Drain}^{1}$ represents the drain current observed where the spin directions of the ferromagnetic layer $6_1$ of the first magnetic film 6A and the ferromagnetic layer $8_{11}$ of the second magnetic film 8A are in a parallel state, and $I_{Drain}^{2}$ represents the drain current observed where the spin directions of the ferromagnetic layer $6_1$ of the first magnetic film 6A and the ferromagnetic layer $8_{11}$ of the second magnetic film 8A are in an antiparallel state.

As is apparent from FIG. 53, the reading characteristics show that the drain current observed where the spin directions of the ferromagnetic layer $6_1$ of the first magnetic film 6A and the ferromagnetic layer $8_1$ or $8_{11}$ of the second magnetic film 8 or 8A are in a parallel state differs from the drain current observed where the spin directions of the ferromagnetic layer $6_1$ of the first magnetic film 6A and the ferromagnetic layer $8_1$ or $8_{11}$ of the second magnetic film 8 or 8A are in an antiparallel state. Also, application of a gate voltage has an amplifying effect. Thus, the operations of spin MOSFETs for a reconfigurable logic circuit can be achieved.

In this example, a spin MOSFET having a magnetization free layer with a hexagonal film-plane shape as shown in FIG. 39 is also produced, and experiments are conducted. As a result, the inversion current density after spin injection is reduced, as in this example.

Fifth, Sixth, Seventh Examples

Next, the spin MOSFET of the nineteenth embodiment shown in FIG. 19 is produced as a fifth example of the present invention, and the spin MOSFETs of the twentieth embodiment shown in FIG. 58 are produced as sixth and seventh examples.

In the fifth example, to form the first magnetic film 16, a ferromagnetic layer $16_1$ made of $Co_2FeSi_{0.5}Al_{0.5}$ and a ferromagnetic layer $16_2$ made of CoFe are formed on the tunnel insulating film 4 made of MgO by a sputtering technique exhibiting high directivity. An antiferromagnetic layer 7 made of IrMn is then formed on the film magnetic film 16 by a sputtering technique exhibiting high directivity. To form the second magnetic film 28, a magnetization free layer $28_1$ made of $Co_2FeSi_{0.5}Al_{0.5}$, a tunnel insulating layer $28_2$ made of MgO, a ferromagnetic layer $28_{31}$ made of $Co_2FeSi_{0.5}Al_{0.5}$, a ferromagnetic layer $28_{32}$ made of CoFe, and an antiferromagnetic layer 29 made of IrMn are stacked in this order on the tunnel insulating film 4 made of MgO by a sputtering technique exhibiting high directivity. A polysilicon electrode is then formed with the use of a sputtering device exhibiting high directivity. An interlayer insulating film and contact holes are then formed, and aluminum wirings as measurement electrodes are formed. While a magnetic field is induced in the long-axis direction of the magnetic layers (the magnetization easy axis direction), annealing is performed in the magnetic field. In this manner, the spin MOSFET of the fifth example is produced.

In the sixth example, to form the first magnetic film 16, a ferromagnetic layer $16_1$ made of $Co_2FeSi_{0.4}Al_{0.6}$, a ferromagnetic layer $16_{21}$ made of CoFe, a nonmagnetic layer $16_{22}$ made of Ru, and a ferromagnetic layer $16_{23}$ made of CoFe are formed in this order on the tunnel insulating film 4 made of MgO by a sputtering technique exhibiting high directivity. To form the second magnetic film 28, a magnetization free layer $28_1$ made of $Co_2FeSi_{0.4}Al_{0.6}$, a tunnel insulating layer $28_2$ made of MgO, a ferromagnetic layer $28a_{31}$ made of $Co_2FeSi_{0.4}Al_{0.6}$, a ferromagnetic layer $28a_{321}$ made of CoFe, a nonmagnetic layer $28a_{322}$ made of Ru, a ferromagnetic layer $28a_{323}$ made of CoFe, and an antiferromagnetic layer 29 made of IrMn are stacked in this order on the tunnel insulating film 4 made of MgO by a sputtering technique exhibiting high directivity. A polysilicon electrode is then formed with the use of a sputtering device exhibiting high directivity. An interlayer insulating film and contact holes are then formed, and aluminum wirings as measurement electrodes are formed. While a magnetic field is induced in the long-axis direction of the magnetic layers (the magnetization easy axis direction), annealing is performed in the magnetic field. In this manner, the spin MOSFET of the sixth example is produced.

In the seventh example, to form the first magnetic film 16, a ferromagnetic layer $16_1$ made of $Co_2FeSi_{0.6}Al_{0.4}$, a ferromagnetic layer $16_{21}$ made of CoFe, a nonmagnetic layer $16_{22}$ made of Ru, and a ferromagnetic layer $16_{23}$ made of CoFe are formed in this order on the tunnel insulating film 4 made of MgO by a sputtering technique exhibiting high directivity and the antiferromagnetic layer 7 made of IrMn is formed on them by a sputtering technique exhibiting high directivity. To form the second magnetic film 28, a magnetization free layer $28_1$ made of $Co_2FeSi_{0.6}Al_{0.4}$, a tunnel insulating layer $28_2$ made of MgO, a ferromagnetic layer $28a_{31}$ made of $Co_2FeSi_{0.6}Al_{0.4}$, a ferromagnetic layer $28a_{321}$ made of CoFe, a nonmagnetic layer $28a_{322}$ made of Ru, a ferromagnetic layer $28a_{323}$ made of CoFe, and an antiferromagnetic layer 29 made of IrMn are stacked in this order on the tunnel insulating film 4 made of MgO by a sputtering technique exhibiting high directivity. A polysilicon electrode is then formed with the use of a sputtering device exhibiting high directivity. An interlayer insulating film and contact holes are then formed, and aluminum wirings as measurement electrodes are formed. While a magnetic field is induced in the long-axis direction of the magnetic layers (the magnetization easy axis direction), annealing is performed in the magnetic field. In this manner, the spin MOSFET of the seventh example is produced. Accordingly, the sixth example is the same as the seventh example, except that the relative proportions of silicon and aluminum in the half-metal ferromagnetic layers $16_1$, $28_1$, and $28a_{31}$ are reversed.

Figure 62:
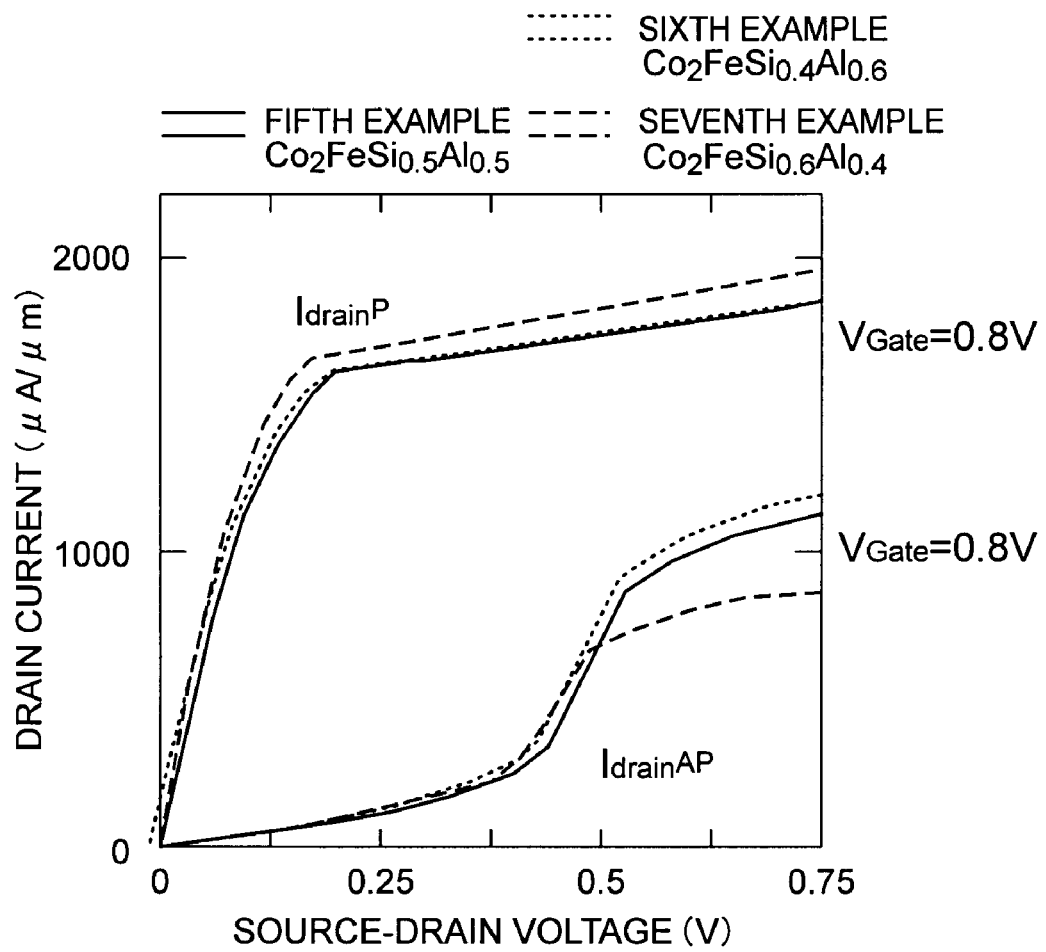
FIG. 62 shows the source-drain voltage dependence of the drain current at the time of reading in the spin MOSFET in fifth through seventh examples.

With each of the spin MOSFETs of the fifth through seventh examples, it has become apparent that, where the gate voltage is 1.2 V, spin injection writing can be constantly and repeatedly observed if the source-drain voltage is set to 1.1 V or higher. Here, the current densities of the spin MOSFETs of the fifth through seventh examples are as low as $1.23 \times 10^6$ A/cm$^2$, $1.25 \times 10^6$ A/cm$^2$, and $1.25 \times 10^6$ A/cm$^2$, respectively. As is apparent from FIG. 62, the reading characteristics show that the drain current observed where the spin directions of the source and drain are in a parallel state differs from the drain current observed where the spin directions of the source and drain are in an antiparallel state. Also, application of a gate voltage has an amplifying effect. Thus, the operations of spin MOSFETs for a reconfigurable logic circuit can be achieved.

In each of the above-described embodiments, when the electrical conductivity of a magnetic material greatly differs from that of a semiconductor, a problem of conductance mismatching arises, resulting in that the spin polarization is saturated and the spin cannot be introduced into the semiconductor. In order to solve this problem, it is preferable that ions be implanted into a semiconductor such as Si, Ge, and GaAs, and a p/n junction be formed in the same manner as in a normal MOSFET.

Figure 63:
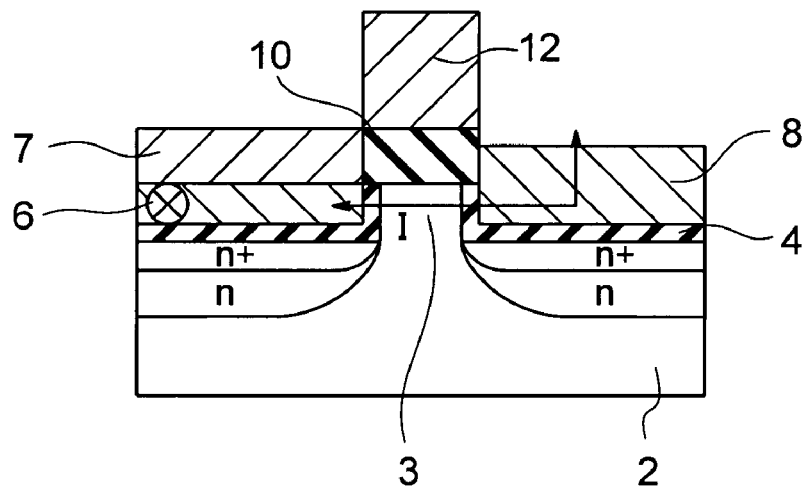
FIG. 63 is a cross-sectional view of a spin MOSFET in accordance with an embodiment.
Figure 64:
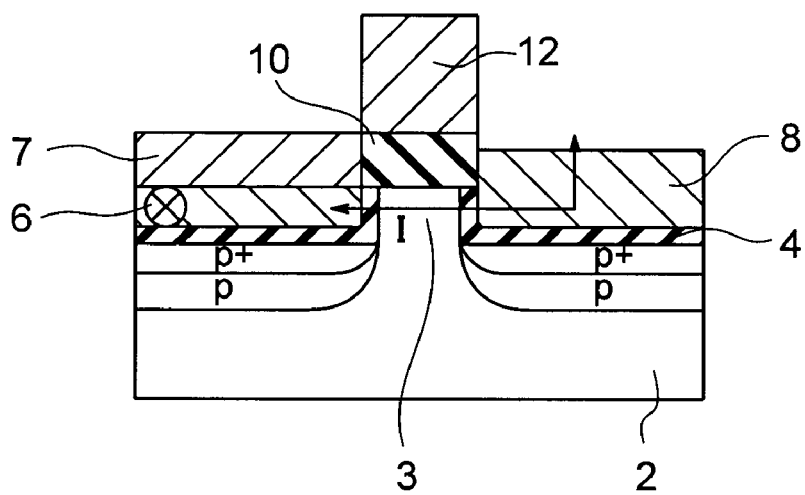
FIG. 64 is a cross-sectional view of a spin MOSFET in accordance with an embodiment.

On such an occasion, it is preferable that ions be implanted at a high concentration around the magnetic material interface or tunnel barrier interface of the semiconductor to segregate (n$^+$ or p$^+$) ions. For example, in the spin MOSFET of the first embodiment, n$^+$-type regions and n-type regions are provided as shown FIG. 63 (n-type spin MOSFET) or p$^+$-type regions and p-type regions are provided as shown FIG. 64 (p-type spin MOSFET).

We have found that it is possible to introduce the spin into the aforementioned structure.

Specifically, it is preferable that B (boron) ions serving as p$^+$ ions or P (phosphorous) or As (arsenic) ions serving as n$^+$ ions be implanted into an n-type or p-type MOSFET using a Si or Ge semiconductor substrate. In the case of GaAs, generally an n-type MOSFET is preferable since the mobility therein is greater, and in this case, Si is generally doped. It is also preferable that the acceleration of the element to be ion-implanted into an n$^+$ or p$^+$ portion be set to be 20 KeV or less, and ions be implanted at a high concentration. After the ion implantation, RTA is performed in a N₂ atmosphere (in the case of Si, at a temperature of 1,000° C.-1,100° C., and in the case of Ge, at a temperature of 400° C.-500° C.). In the caser of GaAs, RTA is performed in an As atmosphere at a temperature of 300° C.-600° C., or Si is doped when the deposition is performed. In each case, an excellent spin dependent conductivity was observed.

As described above, each of the embodiments of the present invention can provide a spin MOSFET that performs a spin reversal at a low current density, and has large output characteristics through the spin reversal. Such a spin MOSFET is very beneficial in industrial use.

The embodiments of the present invention have been described by way of specific examples. However, the present invention is not limited to those specific examples. For example, those skilled in the art can easily select other specific materials suitable for the semiconductors forming a magnetoresistance effect device, the ferromagnetic layers serving as the source and drain, the insulating films, the antiferromagnetic layers, the nonmagnetic metal layers, and the electrodes. Also, the film thicknesses, the shapes, and the sizes may be arbitrarily adjusted. Any structure that achieves the same effects as those of the above described embodiments should be regarded as being within the scope of the present invention.

Likewise, the structures, materials, shapes, and sizes of the components of the spin MOSFET in accordance with any of the embodiments of the present invention may be arbitrarily adjusted by those skilled in the art to achieve the same effects as those of the above described embodiments of the present invention.

Furthermore, the structure of any of the spin MOSFETs of the above described embodiments of the present invention can be modified to form a reconfigurable logic circuit by those skilled in the art, and such a reconfigurable logic circuit is within the scope of the present invention.

What is claimed is:

1. A spin MOSFET comprising:
a semiconductor substrate;
a first magnetic film formed on the semiconductor substrate and including a first ferromagnetic layer, a magnetization direction of the first ferromagnetic layer being invariable;
a second magnetic film formed on the semiconductor substrate to separate from the first magnetic film and including a magnetization free layer, a first nonmagnetic layer being a tunnel insulator and provided on the magnetization free layer, and a magnetization fixed layer provided on the first nonmagnetic layer, a magnetization direction of the magnetization free layer being variable and a magnetization direction of the magnetization fixed layer being invariable;
a gate insulating film provided at least on the semiconductor substrate between the first magnetic film and the second magnetic film; and
a gate electrode formed on the gate insulating film,
the semiconductor substrate between the first and second magnetic films being a current path for each of a reading current and a writing current.

2. The spin MOSFET according to claim 1, wherein the magnetization free layer includes a stacked structure containing a second ferromagnetic layer, a second nonmagnetic layer, and a third ferromagnetic layer, and the second and third ferromagnetic layers are antiferromagnetically coupled to each other.

3. The spin MOSFET according to claim 1, wherein a first antiferromagnetic layer is provided on the first magnetic film, and a second antiferromagnetic layer is provided on the magnetization fixed layer.

4. The spin MOSFET according to claim 3, wherein the first and second antiferromagnetic layers are made of different materials from each other.

5. The spin MOSFET according to claim 1, wherein the first magnetic film includes a stacked structure containing the first ferromagnetic layer, a second nonmagnetic layer, and a second ferromagnetic layer, and the first and second ferromagnetic layers are antiferromagnetically coupled to each other.

6. The spin MOSFET according to claim 1, wherein the magnetization fixed layer includes a stacked structure containing a second ferromagnetic layer, a second nonmagnetic layer, and a third ferromagnetic layer, and the second and third ferromagnetic layers are antiferromagnetically coupled to each other.

7. The spin MOSFET according to claim 1, wherein a tunnel insulating film is provided between the semiconductor substrate and the first and second magnetic films.

8. The spin MOSFET according to claim 1, wherein the magnetization direction of the magnetization free layer is inclined at an angle of more than 0 degree but 45 degree or less with respect to the magnetization direction of the first ferromagnetic layer.

9. The spin MOSFET according to claim 8, wherein the second magnetic film has a shape of a parallelogram in a film plane.

10. The spin MOSFET according to claim 8, wherein the second magnetic film has a shape of a hexagon in a film plane.

11. The spin MOSFET according to claim 1, wherein the semiconductor substrate has a surface formed with a IV group semiconductor, or a III-V or II-VI group compound semiconductor.

12. A spin MOSFET comprising:
a semiconductor substrate;
a first magnetic film formed on the semiconductor substrate and including a first ferromagnetic layer, a magnetization direction of the first ferromagnetic layer being invariable;
a second magnetic film formed on the semiconductor substrate to separate from the first magnetic film and including a magnetization free layer, a first nonmagnetic layer provided on the magnetization free layer, and a magnetization fixed layer provided on the first nonmagnetic layer, a magnetization direction of the magnetization free layer being variable and a magnetization direction of the magnetization fixed layer being invariable and antiparallel to the magnetization direction of the first ferromagnetic layer;
a gate insulating film provided at least on the semiconductor substrate between the first magnetic film and the second magnetic film; and
a gate electrode formed on the gate insulating film,
a gate voltage that causes a negative magnetoresistance effect being applied when writing is performed, a gate voltage that causes a positive magnetoresistance effect being applied when reading is performed.

13. The spin MOSFET according to claim 12, wherein a first antiferromagnetic layer is provided on the first magnetic film, and a second antiferromagnetic layer is provided on the magnetization fixed layer.

14. The spin MOSFET according to claim 13, wherein the first and second antiferromagnetic layers are made of different materials from each other.

15. The spin MOSFET according to claim 12, wherein the first magnetic film includes a stacked structure containing the first ferromagnetic layer, a second nonmagnetic layer, and a second ferromagnetic layer, and the first and second ferromagnetic layers are antiferromagnetically coupled to each other.

16. The spin MOSFET according to claim 12, wherein the magnetization fixed layer includes a stacked structure containing a second ferromagnetic layer, a second nonmagnetic layer, and a third ferromagnetic layer, and the second and third ferromagnetic layers are antiferromagnetically coupled to each other.

17. The spin MOSFET according to claim 12, wherein a tunnel insulating film is provided between the semiconductor substrate and the first and second magnetic films.

18. The spin MOSFET according to claim 12, wherein the magnetization direction of the magnetization free layer is inclined at an angle of more than 0 degree but 45 degree or less with respect to the magnetization direction of the first ferromagnetic layer.

19. The spin MOSFET according to claim 18, wherein the second magnetic film has a shape of a parallelogram in a film plane.

20. The spin MOSFET according to claim 18, wherein the second magnetic film has a shape of a hexagon in a film plane.

21. The spin MOSFET according to claim 12, wherein the semiconductor substrate has a surface formed with a IV group semiconductor, or a III-V or II-VI group compound semiconductor.

22. A spin MOSFET comprising:
a semiconductor substrate;
a first magnetic film formed on the semiconductor substrate and including a first ferromagnetic layer, a magnetization direction of the first ferromagnetic layer being invariable;
a second magnetic film formed on the semiconductor substrate to separate from the first magnetic film and including a magnetization free layer, a first nonmagnetic layer provided on the magnetization free layer, and a magnetization fixed layer provided on the first nonmagnetic layer, a magnetization direction of the magnetization free layer being variable and a magnetization direction of the magnetization fixed layer being invariable and parallel to the magnetization direction of the first ferromagnetic layer;
a gate insulating film provided at least on the semiconductor substrate between the first magnetic film and the second magnetic film; and
a gate electrode formed on the gate insulating film,
a gate voltage that causes a positive magnetoresistance effect being applied when writing is performed, a gate voltage that causes a negative magnetoresistance effect being applied when reading is performed.

23. The spin MOSFET according to claim 22, wherein a first antiferromagnetic layer is provided on the first magnetic film, and a second antiferromagnetic layer is provided on the magnetization fixed layer.

24. The spin MOSFET according to claim 23, wherein the first and second antiferromagnetic layers are made of different materials from each other.

25. The spin MOSFET according to claim 22, wherein the first magnetic film includes a stacked structure containing the first ferromagnetic layer, a second nonmagnetic layer, and a second ferromagnetic layer, and the first and second ferromagnetic layers are antiferromagnetically coupled to each other.

26. The spin MOSFET according to claim 22, wherein the magnetization fixed layer includes a stacked structure containing a second ferromagnetic layer, a second nonmagnetic layer, and a third ferromagnetic layer, and the second and third ferromagnetic layers are antiferromagnetically coupled to each other.

27. The spin MOSFET according to claim 22, wherein a tunnel insulating film is provided between the semiconductor substrate and the first and second magnetic films.

28. The spin MOSFET according to claim 22, wherein the magnetization direction of the magnetization free layer is inclined at an angle of more than 0 degree but 45 degree or less with respect to the magnetization direction of the first ferromagnetic layer.

29. The spin MOSFET according to claim 28, wherein the second magnetic film has a shape of a parallelogram in a film plane.

30. The spin MOSFET according to claim 28, wherein the second magnetic film has a shape of a hexagon in a film plane.

31. The spin MOSFET according to claim 22, wherein the semiconductor substrate has a surface formed with a IV group semiconductor, or a III-V or II-VI group compound semiconductor.

32. A spin MOSFET comprising:
a semiconductor substrate;
a first magnetic film formed on the semiconductor substrate and including a first ferromagnetic layer, a magnetization direction of the first ferromagnetic layer being invariable;
a second magnetic film formed on the semiconductor substrate to separate from the first magnetic film and including a magnetization free layer, a first nonmagnetic layer provided on the magnetization free layer, and a magnetization fixed layer provided on the first nonmagnetic layer, a magnetization direction of the magnetization free layer being variable, the magnetization free layer including a stacked structure containing a second ferromagnetic layer, a second nonmagnetic layer, and a third ferromagnetic layer, the second and third ferromagnetic layers being antiferromagnetically coupled to each other, and a magnetization direction of the magnetization fixed layer being invariable and antiparallel to the magnetization direction of the first ferromagnetic layer;
a gate insulating film provided at least on the semiconductor substrate between the first magnetic film and the second magnetic film; and
a gate electrode formed on the gate insulating film,
a gate voltage that causes a negative magnetoresistance effect being applied when writing is performed, a gate voltage that causes a negative magnetoresistance effect being applied when reading is performed.

33. The spin MOSFET according to claim 32, wherein a first antiferromagnetic layer is provided on the first magnetic film, and a second antiferromagnetic layer is provided on the magnetization fixed layer.

34. The spin MOSFET according to claim 33, wherein the first and second antiferromagnetic layers are made of different materials from each other.

35. The spin MOSFET according to claim 32, wherein the first magnetic film includes a stacked structure containing the first ferromagnetic layer, a third nonmagnetic layer, and a fourth ferromagnetic layer, and the first and fourth ferromagnetic layers are antiferromagnetically coupled to each other.

36. The spin MOSFET according to claim 32, wherein the magnetization fixed layer includes a stacked structure containing a fourth ferromagnetic layer, a third nonmagnetic layer, and a fifth ferromagnetic layer, and the fourth and fifth ferromagnetic layers are antiferromagnetically coupled to each other.

37. The spin MOSFET according to claim 32, wherein a tunnel insulating film is provided between the semiconductor substrate and the first and second magnetic films.

38. The spin MOSFET according to claim 32, wherein the magnetization direction of the magnetization free layer is inclined at an angle of more than 0 degree but 45 degree or less with respect to the magnetization direction of the first ferromagnetic layer.

39. The spin MOSFET according to claim 38, wherein the second magnetic film has a shape of a parallelogram in a film plane.

40. The spin MOSFET according to claim 38, wherein the second magnetic film has a shape of a hexagon in a film plane.

41. The spin MOSFET according to claim 32, wherein the semiconductor substrate has a surface formed with a IV group semiconductor, or a III-V or II-VI group compound semiconductor.

42. A spin MOSFET comprising:
a semiconductor substrate;
a first magnetic film formed on the semiconductor substrate and including a first ferromagnetic layer, a magnetization direction of the first ferromagnetic layer being invariable;
a second magnetic film formed on the semiconductor substrate to separate from the first magnetic film and including a magnetization free layer, a first nonmagnetic layer provided on the magnetization free layer, and a magnetization fixed layer provided on the first nonmagnetic layer, a magnetization direction of the magnetization free layer being variable, the magnetization free layer including a stacked structure containing a second ferromagnetic layer, a second nonmagnetic layer, and a third ferromagnetic layer, the second and third ferromagnetic layers being antiferromagnetically coupled to each other, and a magnetization direction of the magnetization fixed layer being invariable and parallel to the magnetization direction of the first ferromagnetic layer;
a gate insulating film provided at least on the semiconductor substrate between the first magnetic film and the second magnetic film; and
a gate electrode formed on the gate insulating film,
a gate voltage that causes a positive magnetoresistance effect being applied when writing is performed, a gate voltage that causes a positive magnetoresistance effect being applied when reading is performed.

43. The spin MOSFET according to claim 42, wherein a first antiferromagnetic layer is provided on the first magnetic film, and a second antiferromagnetic layer is provided on the magnetization fixed layer.

44. The spin MOSFET according to claim 43, wherein the first and second antiferromagnetic layers are made of different materials from each other.

45. The spin MOSFET according to claim 42, wherein the first magnetic film includes a stacked structure containing the first ferromagnetic layer, a third nonmagnetic layer, and a fourth ferromagnetic layer, and the first and fourth ferromagnetic layers are antiferromagnetically coupled to each other.

46. The spin MOSFET according to claim 42, wherein the magnetization fixed layer includes a stacked structure containing a fourth ferromagnetic layer, a third nonmagnetic layer, and a fifth ferromagnetic layer, and the fourth and fifth ferromagnetic layers are antiferromagnetically coupled to each other.

47. The spin MOSFET according to claim 42, wherein a tunnel insulating film is provided between the semiconductor substrate and the first and second magnetic films.

48. The spin MOSFET according to claim 42, wherein the magnetization direction of the magnetization free layer is inclined at an angle of more than 0 degree but 45 degree or less with respect to the magnetization direction of the first ferromagnetic layer.

49. The spin MOSFET according to claim 48, wherein the second magnetic film has a shape of a parallelogram in a film plane.

50. The spin MOSFET according to claim 48, wherein the second magnetic film has a shape of a hexagon in a film plane.

51. The spin MOSFET according to claim 42, wherein the semiconductor substrate has a surface formed with a IV group semiconductor, or a III-V or II-VI group compound semiconductor.

52. A spin MOSFET comprising:
a semiconductor substrate;
a first magnetic film formed on the semiconductor substrate and including a first ferromagnetic layer containing a first half-metal ferromagnetic layer, and a second ferromagnetic layer that is provided on the first ferromagnetic layer and contains a CoFe layer, a magnetization direction of the first half-metal ferromagnetic layer being invariable;
a first antiferromagnetic layer provided on the second ferromagnetic layer of the first magnetic film;
a second magnetic film formed on the semiconductor substrate to separate from the first magnetic film and including a magnetization free layer containing a second half-metal ferromagnetic layer, a tunnel insulating layer provided on the magnetization free layer, a magnetization fixed layer provided on the tunnel insulating layer, a third ferromagnetic layer provided on the magnetization fixed layer and containing a CoFe layer, and a second antiferromagnetic layer provided on the third ferromagnetic layer, a magnetization direction of the second half-metal ferromagnetic layer being variable, and a magnetization direction of the magnetization fixed layer being invariable;
a gate insulating film provided at least on the semiconductor substrate between the first magnetic film and the second magnetic film; and
a gate electrode formed on the gate insulating film.

53. The spin MOSFET according to claim 52, wherein the second and third ferromagnetic layers each have a three-layer structure containing a CoFe layer, a Ru layer, and a CoFe layer.

54. The spin MOSFET according to claim 52, wherein the first and second half-metal ferromagnetic layers are made of a full Heusler alloy.

55. The spin MOSFET according to claim 54, wherein the full Heusler alloy is $Co_2FeSi_{1-x}Al_x$ ($0.1<x<0.9$).

56. The spin MOSFET according to claim 52, wherein a tunnel insulating film is provided between the semiconductor substrate and the first and second magnetic films.

57. The spin MOSFET according to claim 52, wherein the semiconductor substrate has a surface formed with a IV semiconductor, or a III-V or II-VI compound semiconductor.

58. The spin MOSFET according to claim 52, wherein the semiconductor substrate between the first and second magnetic films is a current path for each of a reading current and a writing current.

* * * * *